United States Patent
Onuki et al.

(10) Patent No.: US 11,158,371 B2
(45) Date of Patent: Oct. 26, 2021

(54) MEMORY DEVICE

(71) Applicant: Semiconductor Energy Laboratory Co., Ltd., Atsugi (JP)

(72) Inventors: Tatsuya Onuki, Atsugi (JP); Takanori Matsuzaki, Atsugi (JP); Kiyoshi Kato, Atsugi (JP); Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/956,630

(22) PCT Filed: Dec. 13, 2018

(86) PCT No.: PCT/IB2018/059984
§ 371 (c)(1),
(2) Date: Jun. 22, 2020

(87) PCT Pub. No.: WO2019/130144
PCT Pub. Date: Jul. 4, 2019

(65) Prior Publication Data
US 2020/0402577 A1    Dec. 24, 2020

(30) Foreign Application Priority Data

Dec. 27, 2017  (JP) .............................. JP2017-251543
Dec. 27, 2017  (JP) .............................. JP2017-251748
(Continued)

(51) Int. Cl.
*G11C 11/24*    (2006.01)
*G11C 14/00*    (2006.01)
(Continued)

(52) U.S. Cl.
CPC ...... *G11C 14/0009* (2013.01); *G11C 11/4074* (2013.01); *G11C 11/4076* (2013.01);
(Continued)

(58) Field of Classification Search
CPC .............. G11C 11/2273; G11C 11/406; G11C 11/4076; G11C 11/4096; G11C 15/043;
(Continued)

(56) References Cited

U.S. PATENT DOCUMENTS 8,737,109 B2   5/2014 Yamazaki et al.
9,024,317 B2   5/2015 Endo et al.
(Continued)

FOREIGN PATENT DOCUMENTS

CN   107046040 A   8/2017
JP   2012-069932 A   4/2012
(Continued)

OTHER PUBLICATIONS

International Search Report (Application No. PCT/IB2018/059984) dated Mar. 19, 2019.
(Continued)

*Primary Examiner* — Thong Q Le
(74) *Attorney, Agent, or Firm* — Robinson IP Law Office, P.C.; Eric J. Robinson

(57) ABSTRACT

A novel memory device is provided.
The memory device including a plurality of memory cells arranged in a matrix, and each of the memory cells includes a transistor and a capacitor. The transistor includes a first gate and a second gate, which include a region where they overlap with each other with a semiconductor layer therebetween. The memory device has a function of operating in a "writing mode", a "reading mode", a "refresh mode", and an "NV mode". In the "refresh mode", data retained in the memory cell is read, and then the read data is written to the
(Continued)

memory cell again for first time. In the "NV mode", data retained in the memory cell is read, the read data is written to the memory cell again for second time, and then a potential at which the transistor is turned off is supplied to the second gate. The "NV mode" operation enables data to be stored for a long time even when power supply to the memory cell is stopped. The memory cell can store multilevel data.

11 Claims, 37 Drawing Sheets

(30) Foreign Application Priority Data

Feb. 28, 2018 (JP) .............................. JP2018-034751
Feb. 28, 2018 (JP) .............................. JP2018-034758

(51) Int. Cl.
| | | |
|---|---|---|
| G11C 11/4074 | (2006.01) | |
| G11C 11/4076 | (2006.01) | |
| G11C 11/4096 | (2006.01) | |
| G11C 11/56 | (2006.01) | |
| H01L 27/12 | (2006.01) | |

(52) U.S. Cl.
CPC ........ G11C 11/4096 (2013.01); G11C 11/565 (2013.01); H01L 27/1207 (2013.01)

(58) Field of Classification Search
CPC ......... G11C 7/065; G11C 7/08; G11C 11/404; G11C 11/405; G11C 11/4074; G11C 11/4087; G11C 11/4091; G11C 11/4093; G11C 11/418; G11C 11/565; G11C 7/222; G11C 16/0483; G11C 11/419; G11C 16/08; G11C 7/22; G11C 11/4085; G11C 11/4094; G11C 11/412; H01L 27/108; H01L 27/1104; H01L 27/1156; H01L 27/1207; H01L 29/786
USPC ......... 365/145, 49.17, 129, 149, 189.2, 203, 365/205
See application file for complete search history.

(56) References Cited

U.S. PATENT DOCUMENTS

| | | | |
|---|---|---|---|
| 9,076,505 B2 | 7/2015 | Atsumi et al. | |
| 9,633,710 B2 | 4/2017 | Tsubuku et al. | |
| 9,972,389 B2 | 5/2018 | Tsubuku et al. | |
| 9,978,441 B2 * | 5/2018 | Tanaka .............. | H01L 27/10873 |
| 10,096,631 B2 | 10/2018 | Ishizu | |
| 10,115,741 B2 | 10/2018 | Matsuda et al. | |
| 10,192,871 B2 | 1/2019 | Onuki et al. | |
| 10,559,612 B2 | 2/2020 | Ishizu | |
| 2016/0078911 A1 * | 3/2016 | Fujiwara ................ | G11C 7/109 |
| | | | 365/189.2 |
| 2016/0217830 A1 | 7/2016 | Tsubuku et al. | |
| 2017/0154909 A1 | 6/2017 | Ishizu | |
| 2017/0229486 A1 | 8/2017 | Matsuda et al. | |
| 2017/0271516 A1 | 9/2017 | Onuki et al. | |
| 2018/0090498 A1 | 3/2018 | Onuki et al. | |

FOREIGN PATENT DOCUMENTS

| | | |
|---|---|---|
| JP | 2012-146965 A | 8/2012 |
| JP | 2013-168631 A | 8/2013 |
| JP | 2016-139452 A | 8/2016 |
| JP | 2017-108397 A | 6/2017 |
| JP | 2017-143255 A | 8/2017 |
| JP | 2017-174489 A | 9/2017 |
| JP | 2018-056558 A | 4/2018 |
| KR | 2017-0093709 A | 8/2017 |
| KR | 2017-0108832 A | 9/2017 |

OTHER PUBLICATIONS

Written Opinion (Application No. PCT/IB2018/059984) dated Mar. 19, 2019.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and Its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-Zinc Oxide", Jpn. J. Appl. Phys. (Japanese Journal of Applied Physics) , 2012, vol. 51, pp. 021201-1-021201-7.
Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.
Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

* cited by examiner

120 Voltage retention circuit

120 Voltage retention circuit

120 Voltage retention circuit

411A

411B

411C

411D

411E

330A: Bit line driver circuit
331: Column decoder
332: Precharge circuit
334: Input/output circuit
337: DAC
338: ADC
350: Global logic circuit 330B: Bit line driver circuit
331: Column decoder
332: Precharge circuit
334: Input/output circuit
337: DAC
338: ADC
350: Global logic circuit

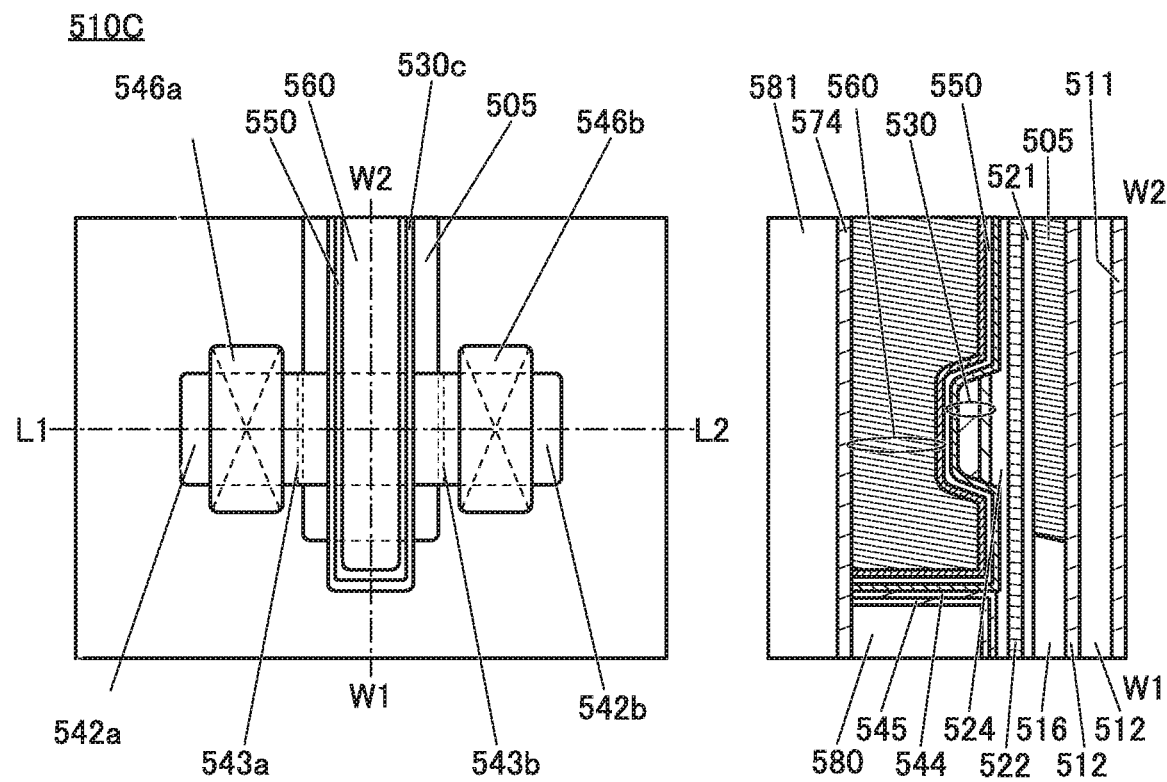
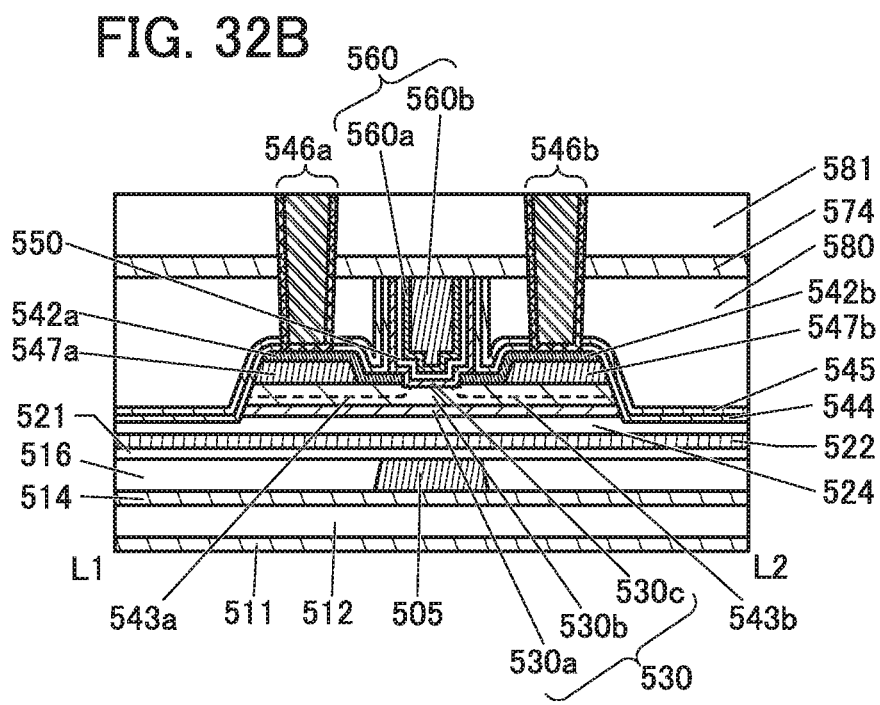

MEMORY DEVICE

TECHNICAL FIELD

One embodiment of the present invention relates to a memory device.

Furthermore, one embodiment of the present invention relates to an object, a method, or a manufacturing method. Alternatively, one embodiment of the present invention relates to a process, a machine, manufacture, or a composition of matter. One embodiment of the present invention relates to a driving method thereof, or a manufacturing method thereof.

In this specification and the like, a semiconductor device generally means a device that can function by utilizing semiconductor characteristics. A memory device, a display device, an electro-optical device, a power storage device, a semiconductor circuit, and an electronic device include a semiconductor device in some cases. In addition, a memory device, a display device, an electro-optical device, a power storage device, a semiconductor circuit, and an electronic device can be also referred to as a semiconductor device.

BACKGROUND ART

A silicon-based semiconductor material is widely known as a semiconductor thin film that can be used in a transistor, and as another material, an oxide semiconductor (OS) has attracted attention. As the oxide semiconductor, not only single-component metal oxides, such as indium oxide and zinc oxide, but also multi-component metal oxides are known. Among the multi-component metal oxides, in particular, an In—Ga—Zn oxide (hereinafter also referred to as IGZO) has been actively researched.

From the researches on IGZO, a CAAC (c-axis aligned crystalline) structure and an nc (nanocrystalline) structure, which are not single crystal nor amorphous, have been found in an oxide semiconductor (see Non-Patent Document 1 to Non-Patent Document 3). Non-Patent Document 1 and Non-Patent Document 2 also disclose a technique for fabricating a transistor using an oxide semiconductor having a CAAC structure. Moreover, Non-Patent Document 4 and Non-Patent Document 5 show that a fine crystal is included even in an oxide semiconductor which has lower crystallinity than the CAAC structure or the nc structure.

A transistor using IGZO for an active layer has an extremely low off-state current (see Non-Patent Document 6), and LSI and a display that utilize the feature have been reported (see Non-Patent Document 7 and Non-Patent Document 8).

A variety of semiconductor devices utilizing a transistor including an oxide semiconductor in its channel formation region (hereinafter also referred to as an "OS transistor") have been proposed.

Patent Document 1 discloses an example in which an OS transistor is used in a DRAM (Dynamic Random Access Memory). The OS transistor has an extremely low leakage current in an off state (off-state current), and thus enables fabrication of a low-power-consumption DRAM having long refresh intervals.

Patent Document 2 discloses a nonvolatile memory using an OS transistor. Unlike a flash memory, these nonvolatile memories have unlimited rewrite cycles, can easily operate at high speed, and have low power consumption.

In such memories using OS transistors, an increase in the threshold voltage of the OS transistors can reduce the off-state current and thus can improve data retention characteristics of the memories. Patent Document 2 discloses an example in which an OS transistor has a second gate to control the threshold voltage of the OS transistor so that the off-state current is lowered.

For long-term data retention of the memory, a constant negative potential needs to be continuously applied to the second gate of the OS transistor. Patent Document 2 and Patent Document 3 each disclose a configuration example of a circuit for driving a second gate of an OS transistor.

REFERENCE

Patent Document

[Patent Document 1] Japanese Published Patent Application No. 2013-168631
[Patent Document 2] Japanese Published Patent Application No. 2012-069932
[Patent Document 3] Japanese Published Patent Application No. 2012-146965

Non-Patent Document

[Non-Patent Document 1] S. Yamazaki et al., "SID Symposium Digest of Technical Papers", 2012, volume 43, issue 1, pp. 183-186.
[Non-Patent Document 2] S. Yamazaki et al., "Japanese Journal of Applied Physics", 2014, volume 53, Number 4S, pp. 04ED18-1-04ED18-10.
[Non-Patent Document 3] S. Ito et al., "The Proceedings of AM-FPD'13 Digest of Technical Papers", 2013, pp. 151-154.
[Non-Patent Document 4] S. Yamazaki et al., "ECS Journal of Solid State Science and Technology", 2014, volume 3, issue 9, pp. Q3012-Q3022.
[Non-Patent Document 5] S. Yamazaki, "ECS Transactions", 2014, volume 64, issue 10, pp. 155-164.
[Non-Patent Document 6] K. Kato et al., "Japanese Journal of Applied Physics", 2012, volume 51, pp. 021201-1-021201-7.
[Non-Patent Document 7] S. Matsuda et al., "2015 Symposium on VLSI Technology Digest of Technical Papers", 2015, pp. T216-T217.
[Non-Patent Document 8] S. Amano et al., "SID Symposium Digest of Technical Papers", 2010, volume 41, issue 1, pp. 626-629.

SUMMARY OF THE INVENTION

Problems to be Solved by the Invention

An object of one embodiment of the present invention is to provide a semiconductor device having a high on-state current. Another object of one embodiment of the present invention is to provide a semiconductor device which can operate at high speed. Another object of one embodiment of the present invention is to provide a semiconductor device capable of retaining data for a long time. Another object of one embodiment of the present invention is to provide a semiconductor device with reduced power consumption. Another object of one embodiment of the present invention is to provide a novel semiconductor device.

Note that the descriptions of a plurality of objects do not mutually preclude the existence. One embodiment of the present invention does not necessarily achieve all of these objects. Objects other than those listed above become apparent from the description of the specification, the drawings, the claims, and the like, and such objects could be objects of one embodiment of the present invention.

Means for Solving the Problems

One embodiment of the present invention is a memory device including a plurality of memory cells arranged in a matrix each including a transistor including a first gate and a second gate, which include a region where they overlap with each other with a semiconductor layer including a metal oxide therebetween, and a capacitor. The memory device has a function of writing data to at least one of the plurality of memory cells; a function of reading data from at least one of the plurality of memory cells; a function of, after reading first data retained in the memory cell, writing the first data to at least one of the plurality of memory cells for first time; a function of, after reading first data retained in the memory cell, writing the first data to at least one of the plurality of memory cells for second time; and a function of supplying a first potential to the second gate of the memory cell, and then stopping power supply to the plurality of memory cells. The first data is multilevel data, and the second time is longer than the first time.

The semiconductor layer of the transistor preferably contains at least one or both of In and Zn. The second time is preferably 1.5 times or more the first time. The first potential is a potential at which the transistor is turned off. When a threshold voltage of the transistor is Vth, the first potential is preferably lower than or equal to −VthM.

Effect of the Invention

According to one embodiment of the present invention, a semiconductor device having a high on-state current can be provided. According to one embodiment of the present invention, a semiconductor device which can operate at high speed can be provided. According to one embodiment of the present invention, a semiconductor device capable of retaining data for a long time can be provided. According to one embodiment of the present invention, a semiconductor device with reduced power consumption can be provided. According to one embodiment of the present invention, a novel semiconductor device can be provided.

Note that the descriptions of the effects do not disturb the existence of other effects. One embodiment of the present invention does not necessarily have all of these effects. Effects other than these will be apparent from the description of the specification, the drawings, the claims, and the like and effects other than these can be derived from the description of the specification, the drawings, the claims, and the like.

BRIEF DESCRIPTION OF THE DRAWINGS

FIGS. 32A-32C Diagrams illustrating a structure example of a transistor.

MODE FOR CARRYING OUT THE INVENTION

Figure 1A:
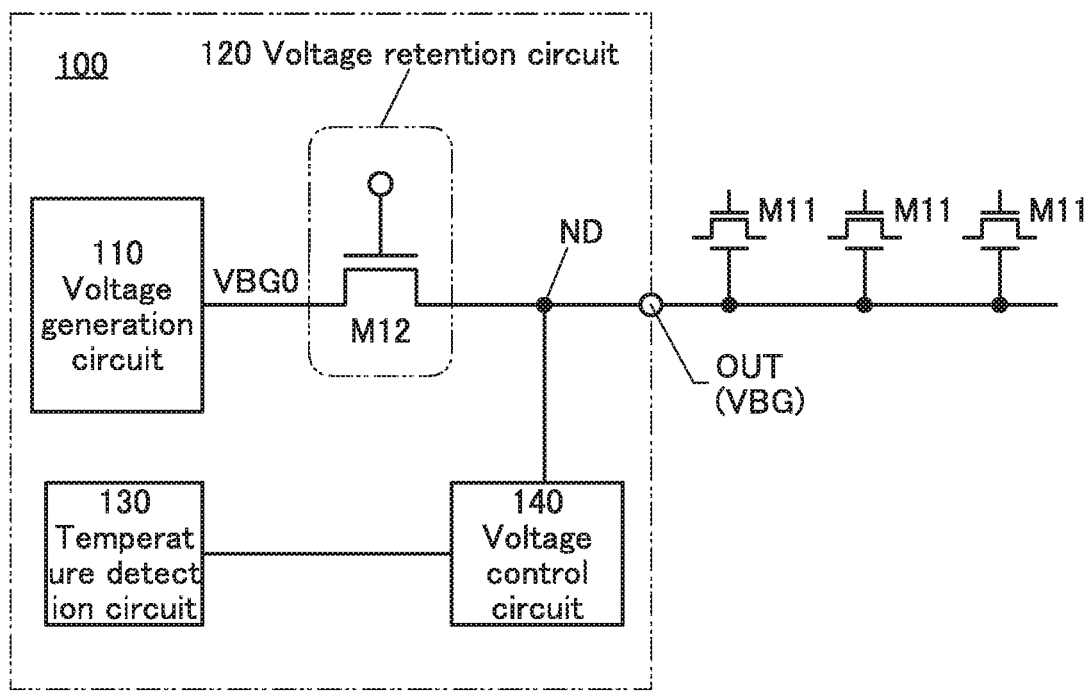
FIGS. 1A-1B Diagrams illustrating a structure example of a semiconductor device.

Embodiments of the present invention will be described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be limited to description of the following embodiments and examples.

Note that in structures of the invention described below, the same portions or portions having similar functions are denoted by the same reference numerals in different drawings, and the description thereof is not repeated. Furthermore, the same hatch pattern is used for portions having similar functions, and the portions are not especially denoted by reference numerals in some cases.

Note that in each drawing described in this specification, the size, the layer thickness, or the region of each component is exaggerated for clarity in some cases. Therefore, they are not limited to the illustrated scale.

Note that in this specification, a high power supply voltage and a low power supply voltage are sometimes referred to as an H level (also referred to as "VDD" or an "H potential") and an L level (also referred to as "GND" or an "L potential"), respectively.

Note that voltage refers to a potential difference between two points, and potential refers to electrostatic energy (electric potential energy) of a unit charge at a given point in an electrostatic field. Note that in general, a potential difference between a potential at a given point and a reference potential (e.g., a ground potential) is simply called potential or voltage, and potential and voltage are used as synonymous words in many cases. Therefore, in this specification and the like, potential is interchangeable with voltage and voltage is interchangeable with potential unless explicitly stated.

In this specification, the embodiments and the examples described below can be combined as appropriate. In the case where a plurality of structure examples are described in one embodiment, the structure examples can be combined with each other as appropriate.

In this specification and the like, a metal oxide is an oxide of metal in a broad sense. Metal oxides are classified into an oxide insulator, an oxide conductor (including a transparent oxide conductor), an oxide semiconductor, and the like. For example, in the case where a metal oxide is used in a semiconductor layer of a transistor, the metal oxide is referred to as an oxide semiconductor in some cases. In the case where an OS transistor is mentioned, the OS transistor can also be referred to as a transistor including a metal oxide or an oxide semiconductor. In this specification and the like, a metal oxide containing nitrogen is also referred to as a metal oxide in some cases.

Unless otherwise specified, transistors described in this specification and the like are enhancement (normally-off) n-channel field-effect transistors. Thus, unless otherwise specified, the threshold voltage (also referred to as "Vth") is higher than 0 V.

Embodiment 1

<Semiconductor Device 100>

FIG. 1 is a circuit diagram showing a configuration example of a semiconductor device 100 of one embodiment of the present invention. The semiconductor device 100 includes a voltage generation circuit 110, a voltage retention circuit 120, a temperature detection circuit 130, and a voltage control circuit 140. A node of the voltage retention circuit 120 and the voltage control circuit 140 is referred to as a node ND. The voltage retention circuit 120 and the voltage control circuit 140 are electrically connected to an output terminal OUT of the semiconductor device 100 through the node ND.

In addition, the semiconductor device 100 is electrically connected to second gates of a plurality of transistors M11 through the output terminal OUT. The transistor M11 is a transistor including a first gate (also referred to as a "front gate" or simply a "gate") and a second gate (also referred to as a "back gate"). The first gate and the second gate have regions overlapping with each other with a semiconductor layer therebetween. The second gate has a function of controlling the threshold voltage of the transistor M11, for example.

The transistor M11 represents a transistor used in a variety of circuits included in a memory device, a display device, an arithmetic device, and the like. For example, the transistor M11 represents a transistor included in a memory device of NOR type, NAND type, or the like. As another example, the transistor M11 represents a transistor included in a display device such as a liquid crystal display device or an EL display device. As another example, the transistor M11 represents a transistor included in a CPU (Central Processing Unit), a GPU (Graphics Processing Unit), an FPGA (Field Programmable Gate Array), or the like.

Although three transistors M11 are illustrated in FIG. 1, one embodiment of the present invention is not limited thereto, and the semiconductor device 100 may be connected to more transistors M11.

Figure 2A:
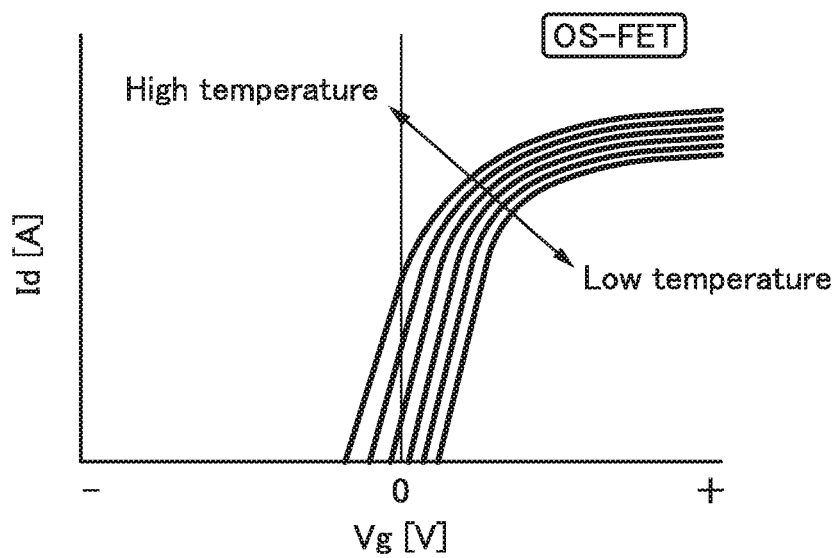
FIGS. 2A-2B Diagrams illustrating electrical characteristics of transistors.
Figure 2B:
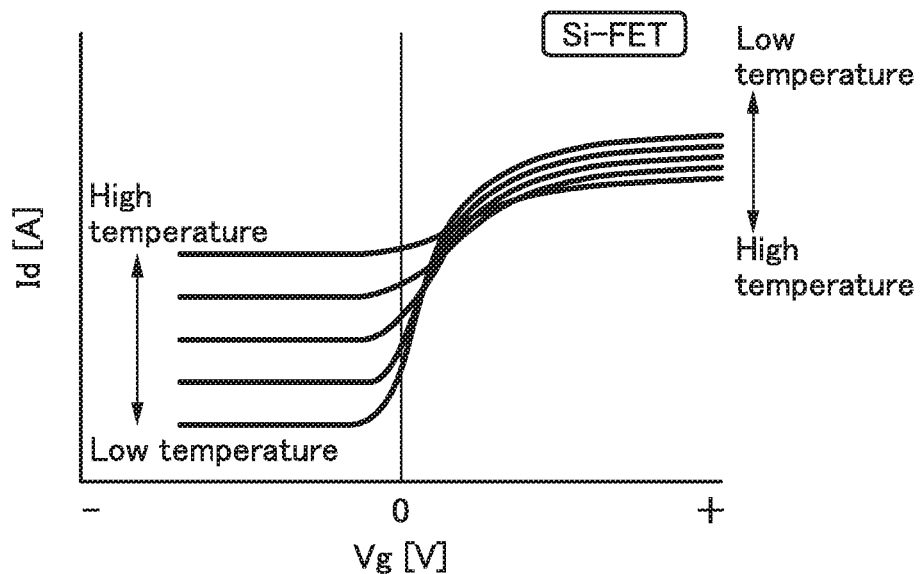

Here, temperature dependence of Id–Vg characteristics, which is one of the electrical characteristics of a transistor, is described. FIG. 2(A) and FIG. 2(B) show an example of Id–Vg characteristics, which are electrical characteristics of a transistor. The Id–Vg characteristics show a change in drain current (Id) with respect to a change in gate voltage (Vg). The horizontal axis in FIG. 2(A) and FIG. 2(B) represents Vg on a linear scale. The vertical axis in FIG. 2(A) and FIG. 2(B) represents Id on a log scale.

FIG. 2(A) shows the Id–Vg characteristics of an OS transistor. FIG. 2(B) shows the Id–Vg characteristics of a transistor using silicon for a semiconductor layer in which a channel is formed (also referred to as a "Si transistor"). Note that both FIG. 2(A) and FIG. 2(B) show the Id–Vg characteristics of an n-channel transistor.

As shown in FIG. 2(A), the off-state current is less likely to increase in the OS transistor even in the operation at high temperatures. In addition, in the OS transistor, Vth shifts in the negative direction with the increase in operating temperature, and the on-state current increases. On the other hand, in the Si transistor, the off-state current increases with the increase in temperature as shown in FIG. 2(B). Moreover, in the Si transistor, Vth shifts in the positive direction with the increase in temperature, and the on-state current decreases.

Thus, when an OS transistor is used as the transistor M11, the power consumption of the whole semiconductor device including the transistor M11 can be reduced even in the operation at high temperatures.

The semiconductor device 100 has a function of writing a voltage VBG to the second gate of the transistor M11 through the output terminal OUT and retaining the voltage VBG. For example, in the case where a negative potential is supplied as the voltage VBG, Vth of the transistor M11 can be shifted to the positive direction while the negative potential of the second gate is retained. Even in the operation at high temperatures, Vth can be kept high. For example, in the case where the transistor M11 is used as a selection transistor of a memory cell, charge in a capacitor functioning as a storage can be retained for a long time.

[Voltage Generation Circuit 110]

Figure 3A:
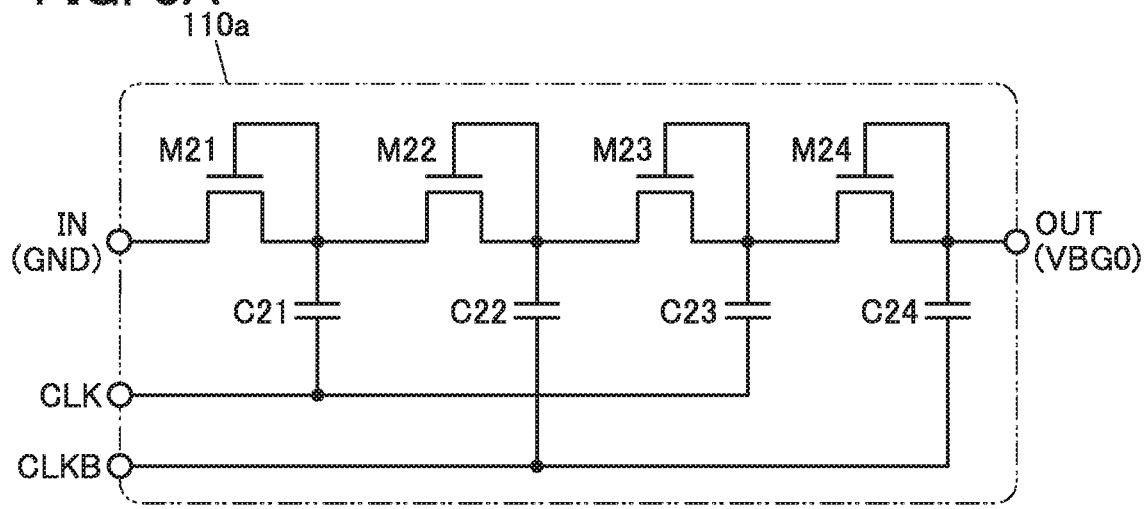
FIGS. 3A-3B Diagrams illustrating configuration examples of a voltage generation circuit.
Figure 3B:
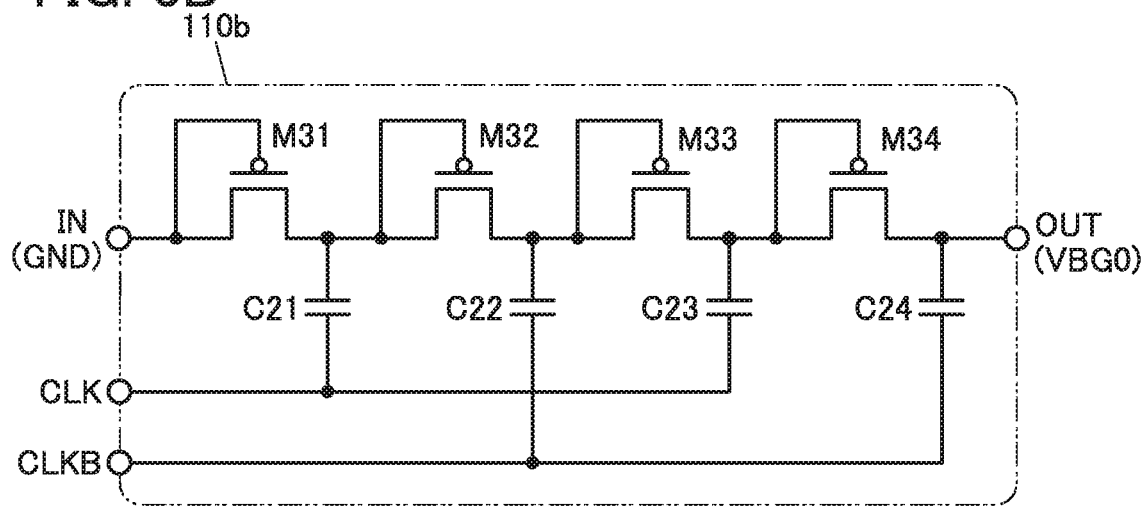

FIGS. 3(A) and 3(B) illustrate circuit configuration examples of the voltage generation circuit 110. These circuit diagrams are step-down charge pumps; GND is input to an input terminal IN, and a voltage VBG0 is output from an output terminal OUT of the voltage generation circuit 110. Here, as an example, the number of stages of fundamental circuits in the charge pump circuit is four; however, it is not limited thereto, and the charge pump circuit may be configured with a given number of stages.

A voltage generation circuit 110a illustrated in FIG. 3(A) includes a transistor M21 to a transistor M24 and a capacitor C21 to a capacitor C24.

The transistor M21 to the transistor M24 are connected in series between the input terminal IN and the output terminal OUT, and a gate and a first electrode of each transistor are connected so that the transistor functions as a diode. The capacitor C21 to the capacitor C24 are respectively connected to the gates of the transistor M21 to the transistor M24.

CLK is input to first electrodes of the capacitor C21 and the capacitor C23 in the odd-numbered stages, and CLKB is input to first electrodes of the capacitors C22 and C24 in the even-numbered stages. CLKB is an inverted clock signal obtained by phase inversion of CLK.

The voltage generation circuit 110a has a function of stepping down GND input to the input terminal IN and generating the voltage VBG0. The voltage generation circuit 110a can generate a negative potential only by the supply of CLK and CLKB.

The above-described transistor M21 to transistor M24 may be OS transistors. The use of OS transistors is preferable because the reverse current of the diode-connected transistor M21 to transistor M24 can be reduced.

A voltage generation circuit 110b illustrated in FIG. 3(B) is configured with a transistor M31 to a transistor M34 that are p-channel transistors. The description of the voltage generation circuit 110a is referred to for the other components.

The voltage generation circuit 110 may include not only a step-down charge pump but also a step-up charge pump. Moreover, the voltage generation circuit 110 may include both a step-down charge pump and a step-up charge pump.

[Voltage Retention Circuit 120]

The voltage retention circuit 120 includes a transistor M12 (see FIG. 1(A)). A first terminal (one of a source and a drain) of the transistor M12 is electrically connected to the voltage generation circuit 110, and a second terminal (the other of the source and the drain) of the transistor M12 is electrically connected to the node ND.

The voltage retention circuit 120 has a function of turning on the transistor M12 and supplying the voltage VBG0 generated by the voltage generation circuit 110 to the node ND. When the threshold voltage of the transistor M12 is set to Vth1, it is preferable to apply a voltage higher than or equal to VBG0+Vth1 to a gate of the transistor M12 to turn on the transistor M12. The voltage retention circuit 120 has a function of turning off the transistor M12 to retain the voltage of the node ND.

Figure 4A:
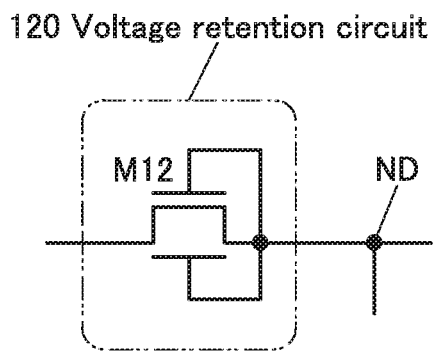
FIGS. 4A-4C Diagrams illustrating configuration examples of a voltage retention circuit.

In the case where a negative potential is supplied as the voltage VBG0, a transistor including a first gate and a second gate may be used as the transistor M12 and the first gate and the second gate may be electrically connected to the second terminal (see FIG. 4(A)). In that case, the transistor M12 can function as a diode. In addition, when a voltage output from the transistor M12 is referred to as a voltage VBG1, the relation of VBG1=VBG0+Vth1 is satisfied. By setting the potential of the first terminal of the transistor M12 to GND, a negative potential written to the node ND can be retained.

In the transistor M12 illustrated in FIG. 4(A), a negative potential is supplied to the node ND and then the potential of the first terminal is set to GND, whereby Vg becomes 0 V. Thus, Id when Vg is 0 V (also referred to as a "cutoff current") is preferably low. By making the cutoff current sufficiently low, the negative potential written to the node ND can be retained for a long time.

The channel length of the transistor M12 is preferably longer than the channel length of the transistor M11. For example, in the case where the channel length of the transistor M11 is shorter than 1 μm, the channel length of the transistor M12 is longer than or equal to 1 μm, further preferably longer than or equal to 3 μm, further preferably longer than or equal to 5 μm, further preferably longer than or equal to 10 μm. When the channel length of the transistor M12 is long, the transistor M12 is not affected by a short-channel effect and can keep the cutoff current low. Furthermore, the withstand voltage between the source and the drain of the transistor M12 can be increased. The high withstand voltage between the source and the drain of the transistor M12 is preferable because it can facilitate connection between the transistor M11 and the voltage generation circuit 110 generating a high voltage.

As the transistor M12, an OS transistor or a transistor using a wide-bandgap semiconductor in a channel formation region is preferably used. The cutoff current is low and the withstand voltage between a source and a drain is high in the OS transistor and the transistor using a wide-bandgap semiconductor. Note that in this specification, a wide-bandgap semiconductor is a semiconductor whose bandgap is 2.2 eV or greater. Examples include silicon carbide, gallium nitride, and diamond.

The transistor M12 is required to have a lower cutoff current than the transistor M11. Meanwhile, the transistor M11 is required to have a higher on-state current than the transistor M12. In the case where transistors having different required properties as above are formed over the same substrate, the transistors are formed using different semiconductors. In the transistor M12, a semiconductor whose bandgap is wider than that of the transistor M11 is preferably used in a channel formation region. In the transistor M11, a semiconductor whose electron mobility is higher than that of the transistor M12 is preferably used in a channel formation region.

Figure 4B:
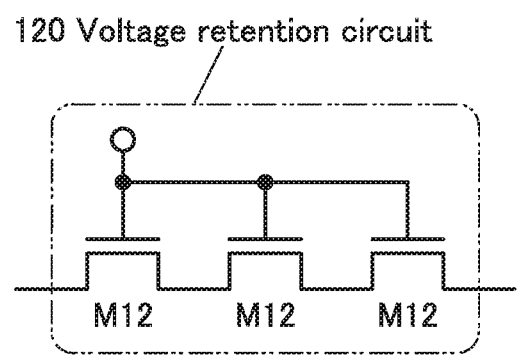
Figure 4C:
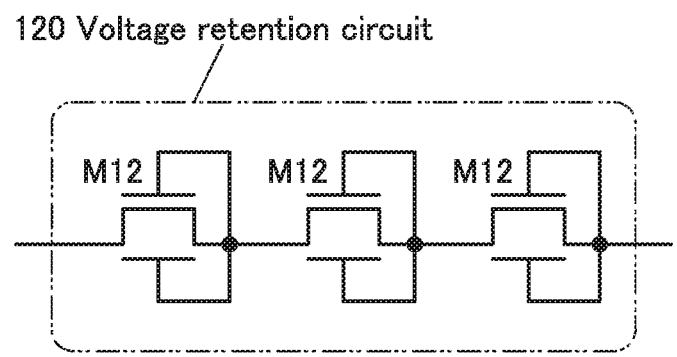

The voltage generation circuit 120 may be configured with a plurality of transistors M12 connected in series (see FIGS. 4(B) and 4(C)).

[Temperature Detection Circuit 130]

Figure 5:
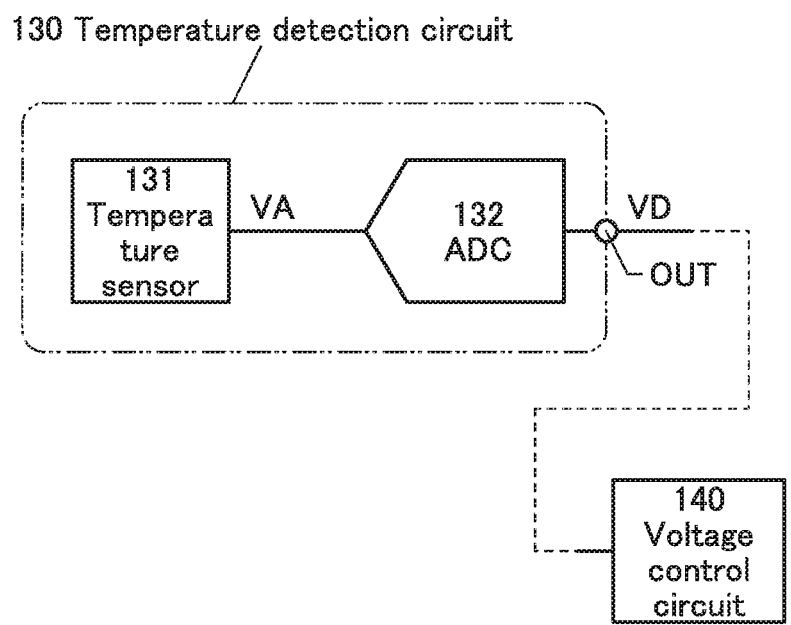
FIG. 5 A diagram illustrating a configuration example of a temperature detection circuit.

The temperature detection circuit 130 includes a temperature sensor 131 and an analog-digital converter circuit (also referred to as "ADC") 132 (see FIG. 5).

The temperature sensor 131 has a function of sensing the temperature of the semiconductor device 100 and outputting an analog signal VA corresponding to the temperature. As the temperature sensor 131, for example, a resistance thermometer such as platinum, nickel, or copper, a thermistor, a thermocouple, an IC temperature sensor, or the like can be used.

The analog-digital converter circuit 132 has a function of converting an analog signal VA into an n-bit (n is an integer of 1 or more) digital signal VD. The digital signal VD is output from the temperature detection circuit 130 and supplied to the voltage control circuit 140.

Temperature information detected as an analog signal by the sensing circuit 130 is converted into a digital signal and then output, so that signal attenuation or influence of noise due to wiring resistance and parasitic capacitance can be reduced. Thus, even in the case where the temperature detection circuit 130 is provided apart from the voltage control circuit 140, the temperature information can be transmitted to the voltage control circuit 140 accurately.

[Voltage Control Circuit 140]

As described with reference to FIG. 2(A), in an OS transistor, Vth shifts to the positive side with a decrease in temperature, and the on-state current decreases. As a result, the operation speed of a circuit is lowered. Furthermore, Vth shifts to the negative side with an increase in temperature, and the cutoff current increases. This leads to a narrow temperature range in which a circuit can operate. By applying a correction voltage corresponding to operating temperature to the node ND using the voltage control circuit 140, the voltage output from the output terminal OUT of the semiconductor device 100 can be corrected and the temperature range in which a circuit electrically connected to the output terminal OUT can operate can be widened.

Figure 1B:
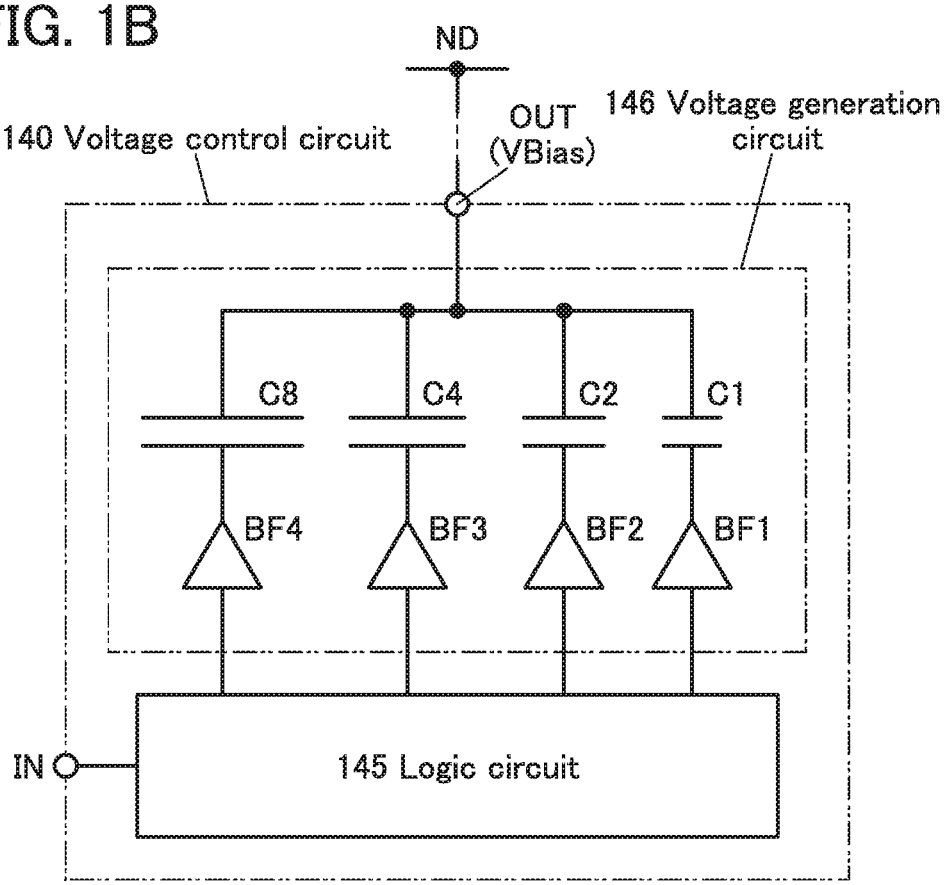

The voltage control circuit 140 includes a logic circuit 145 and a voltage generation circuit 146 (see FIG. 1(B)). The logic circuit 145 has a function of supplying a digital signal (temperature information) supplied from the temperature detection circuit 130 to the voltage generation circuit 146. For example, a serial signal supplied from the temperature detection circuit 130 is converted into a parallel signal, and then supplied to the voltage generation circuit 146. Furthermore, the logic circuit 145 has a function of converting an n-bit digital signal supplied from the temperature detection circuit 130 into an m-bit (m is an integer of 1 or more) digital signal and supplying the converted signal to the voltage generation circuit 146.

The voltage generation circuit 146 has a function of converting an m-bit digital signal supplied from the logic circuit 145 into a voltage with $2^m$ levels and outputting the converted voltage. FIG. 1(B) shows a case where m is 4 as an example. In FIG. 1(B), the voltage generation circuit 146 includes a buffer BF1, a buffer BF2, a buffer BF3, a buffer BF4, a capacitor C1, a capacitor C2, a capacitor C4, and a capacitor C8.

A 4-bit digital signal output from the logic circuit 145 is supplied to input terminals of the buffer BF1 to the buffer BF4. Specifically, information in the first digit of the 4-bit digital signal is input to the buffer BF1, information in the second digit is input to the buffer BF2, information in the third digit is input to the buffer BF3, and information in the fourth digit is input to the buffer BF4.

One electrode of the capacitor C1 is electrically connected to an output terminal of the buffer BF1, and the other electrode is electrically connected to the output terminal OUT. One electrode of the capacitor C2 is electrically connected to an output terminal of the buffer BF2, and the other electrode is electrically connected to the output terminal OUT. One electrode of the capacitor C4 is electrically connected to an output terminal of the buffer BF3, and the other electrode is electrically connected to the output terminal OUT. One electrode of the capacitor C8 is electrically connected to an output of the buffer BF4, and the other electrode is electrically connected to the output terminal OUT.

A voltage output from the output terminal OUT of the voltage control circuit 140 is referred to as a "voltage VBias". The output terminal OUT of the voltage control circuit 140 is electrically connected to the node ND of the semiconductor device 100.

A voltage applied from the voltage control circuit 140 to the node ND is determined by the ratio of the combined capacitance of the capacitor C1, the capacitor C2, the capacitor C4, and the capacitor C8 to the parasitic capacitance generated in the node ND. The capacitance value of the capacitor C1 is preferably sufficiently larger than the capacitance value of the parasitic capacitance. Specifically, the capacitance value of the capacitor C1 is preferably 5 times or more, further preferably 10 times or more the capacitance value of the parasitic capacitance.

The capacitance values of the capacitor C1, the capacitor C2, the capacitor C4, and the capacitor C8 may be the same; however, it is preferable that at least part or all of those are different capacitance values. In this embodiment, the capacitance value of the capacitor C2 is twice the capacitance value of the capacitor C1, the capacitance value of the capacitor C4 is 4 times the capacitance value of the capacitor C1, and the capacitance value of the capacitor C8 is 8 times the capacitance value of the capacitor C1. Thus, a voltage with 16 levels can be supplied from the voltage control circuit 140 to the node ND.

Figure 6A:
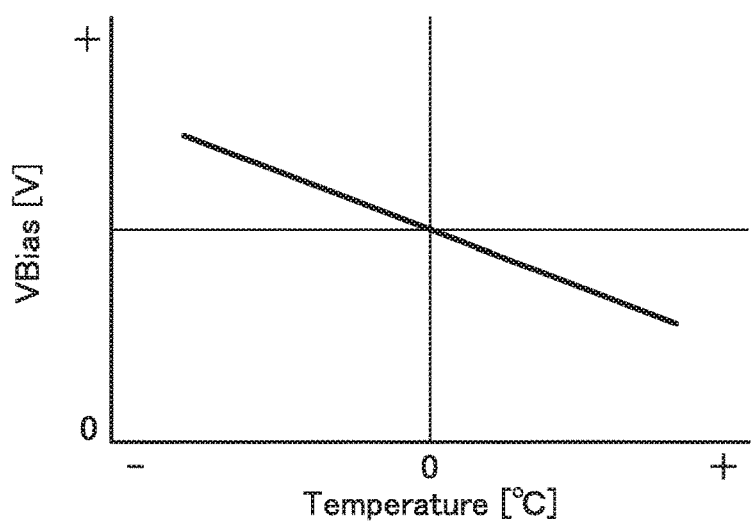
FIGS. 6A-6C Diagrams showing examples of a change in a voltage VBias with respect to a temperature change.
Figure 6B:
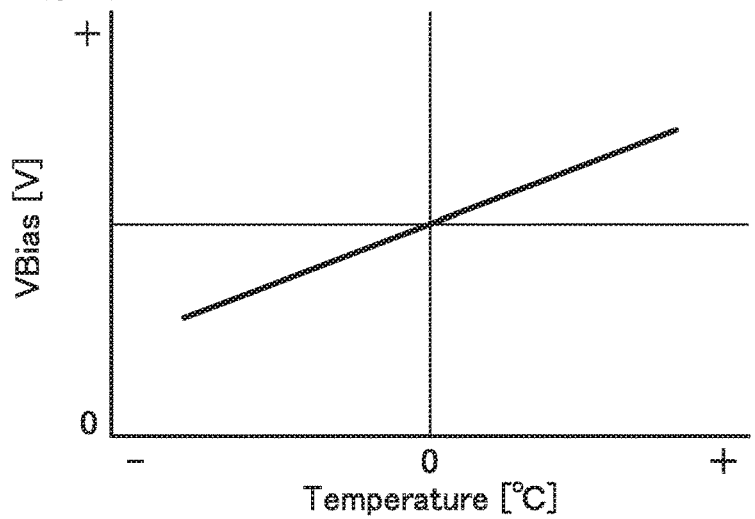
Figure 6C:
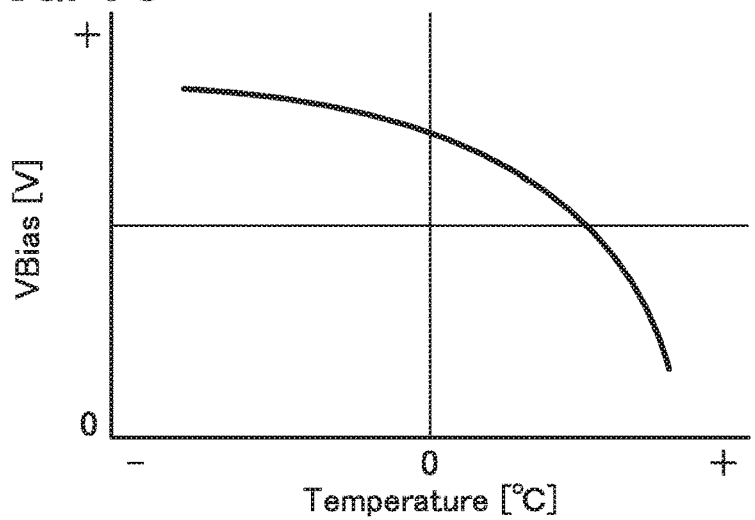

FIGS. 6(A) to 6(C) show examples of a change in the voltage VBias with respect to a temperature change. The horizontal axis in FIGS. 6(A) to 6(C) represents temperature on a linear scale. The vertical axis in FIGS. 6(A) to 6(C) represents the voltage VBias on a linear scale. In the case where the transistor M11 is an OS transistor, as the operating temperature of the transistor M11 becomes high, the level of the voltage VBias preferably becomes low (see FIG. 6(A)). Depending on the purpose or the intended use, as the operating temperature becomes high, the level may become high (see FIG. 6(B)). The level of the voltage VBias may change nonlinearly with respect to the temperature change (see FIG. 6(C)). A change in the voltage VBias with respect to the temperature change can be set by the logic circuit 145.

<Operation Example of Semiconductor Device 100>

Figure 7:
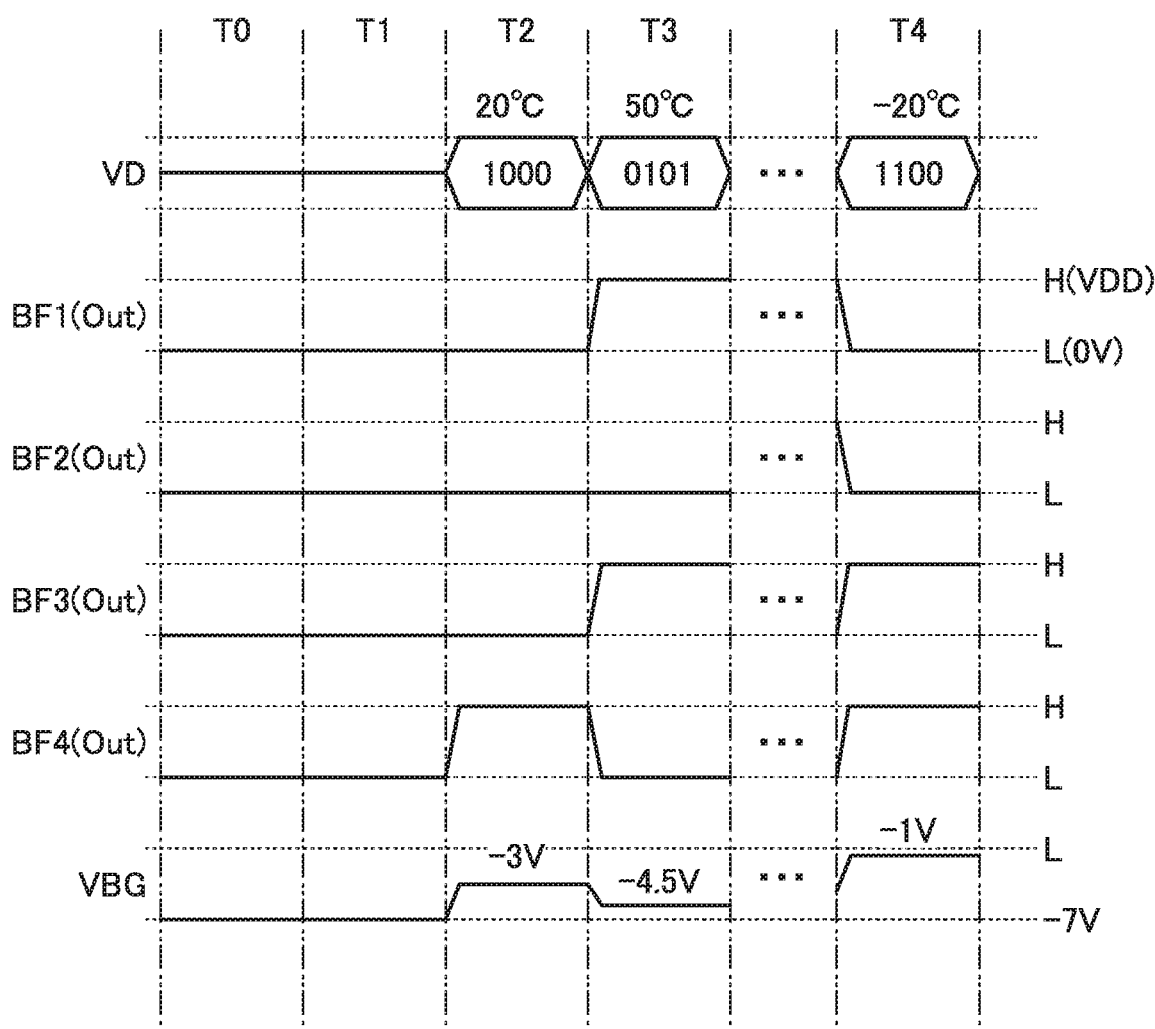
FIG. 7 A timing chart showing an operation example of a semiconductor device.

FIG. 7 is a timing chart showing an operation example of the semiconductor device 100. In this embodiment, an operation example is described in which in the case where the transistor M11 is an OS transistor and the operating temperature changes in a range of 100° C. to −50° C., the voltage VBias linearly changes in a range of 0 V to 7.5 V. In addition, the voltage VBG is −3 V when the operating temperature is 20° C.

Moreover, a 4-bit digital signal VD is output from the temperature detection circuit 130. In this embodiment, as the digital signal VD, "0000" is output when the operating temperature is 100° C., and "1111" is output when the operating temperature is −50° C.

Moreover, when the output of the buffer BF1 connected to one electrode of the capacitor C1 changes from an L potential to an H potential, the potential of the other electrode of the capacitor C1 increases by 0.5 V. When the output of the buffer BF2 connected to one electrode of the capacitor C2 changes from an L potential to an H potential, the potential of the other electrode of the capacitor C2 is increases by 1.0 V. When the output of the buffer BF3 connected to one electrode of the capacitor C4 changes from an L potential to an H potential, the potential of the other electrode of the capacitor C4 is increases by 2.0 V. When the output of the buffer BF4 connected to one electrode of the capacitor C8 changes from an L potential to an H potential, the potential of the other electrode of the capacitor C8 is increases by 4.0 V.

[Period T0]

Period T0 is a reset period. In Period T0, an L potential (0 V) is output from the output terminal of each of the buffer BF1 to the buffer BF4. Furthermore, the voltage VBG0 is set to −7 V to turn on the transistor M12. Thus, the voltage VBG becomes −7 V. In Period T0, the temperature detection circuit 130 may stop the output of the digital signal VD. In addition, the operation of the temperature detection circuit 130 may be stopped.

[Period T1]

In Period T1, the transistor M12 is turned off. The voltage of the node ND is retained at −7 V. Thus, the voltage VBG also remains −7 V.

[Period T2]

In Period T2, the digital signal VD (temperature information) is supplied from the temperature detection circuit 130 to the voltage control circuit 140. For example, "1000" is supplied to the voltage control circuit 140 as the digital signal VD indicating 20° C.

The logic circuit 145 inputs a potential corresponding to the digital signal VD to each of the buffer BF1 to the buffer BF4. Specifically, in the case where the digital signal VD is "1000", the buffer BF1 to the buffer BF4 are controlled so that the output of each of the buffer BF1 to the buffer BF3 becomes an L potential and the output of the buffer BF4 becomes an H potential.

Then, the potential of the output terminal OUT of the voltage control circuit 140 increases by 4 V. Accordingly, the voltage of the node ND changes from −7 V to −3 V and the voltage VBG becomes −3 V.

[Period T3]

In Period T3, the digital signal VD (temperature information) is supplied from the temperature detection circuit 130 to the voltage control circuit 140. For example, "0101" is supplied to the voltage control circuit 140 as the digital signal VD indicating 50° C.

As in Period T2, the logic circuit 145 inputs a potential corresponding to each of the digital signal VD to the buffer BF1 to the buffer BF4. In the case where the digital signal VD is "0101", the output of the buffer BF1, the output of the buffer BF2, the output of the buffer BF3, and the output of the buffer BF4 become an H potential, an L potential, an H potential, and an L potential, respectively. Then, the voltage VBG becomes −4.5 V.

[Period T4]

In Period T4, the digital signal VD (temperature information) is supplied from the temperature detection circuit 130 to the voltage control circuit 140. For example, "1100" is supplied to the voltage control circuit 140 as the digital signal VD indicating −20° C.

As in Period T2 and Period T3, the logic circuit 145 inputs a potential corresponding to each of the digital signal VD to the buffer BF1 to the buffer BF4. In the case where the digital signal VD is "1100", the output of the buffer BF1, the output of the buffer BF2, the output of the buffer BF3, and the output of the buffer BF4 become an L potential, an L potential, an H potential, and an H potential, respectively. Then, the voltage VBG becomes −1.0 V.

In this manner, the voltage VBG can be changed depending on the temperature change. In the case where the change in electrical characteristics of the transistor M11 due to temperature is not considered, a voltage higher than necessary is applied to the second gate of the transistor M11. When a voltage higher than necessary is applied to the second gate of the transistor M11 for a long time, the electrical characteristics of the transistors M11 deteriorate, which might impair the reliability. According to one embodiment of the present invention, a voltage applied to the second gate of the transistor M11 can be changed depending on the temperature. Consequently, a minimum necessary voltage can be applied to the second gate of the transistor M11. According to one embodiment of the present invention, the reliability of the semiconductor device including the transistor M11 can be increased.

A reset period (Period T0) may be provided at regular intervals to refresh the voltage of the node ND.

This embodiment can be implemented in an appropriate combination with the structures described in the other embodiments and the like.

Embodiment 2

In this embodiment, a memory device using the semiconductor device 100 described in Embodiment 1 will be described.

<Memory Device>

Figure 8:
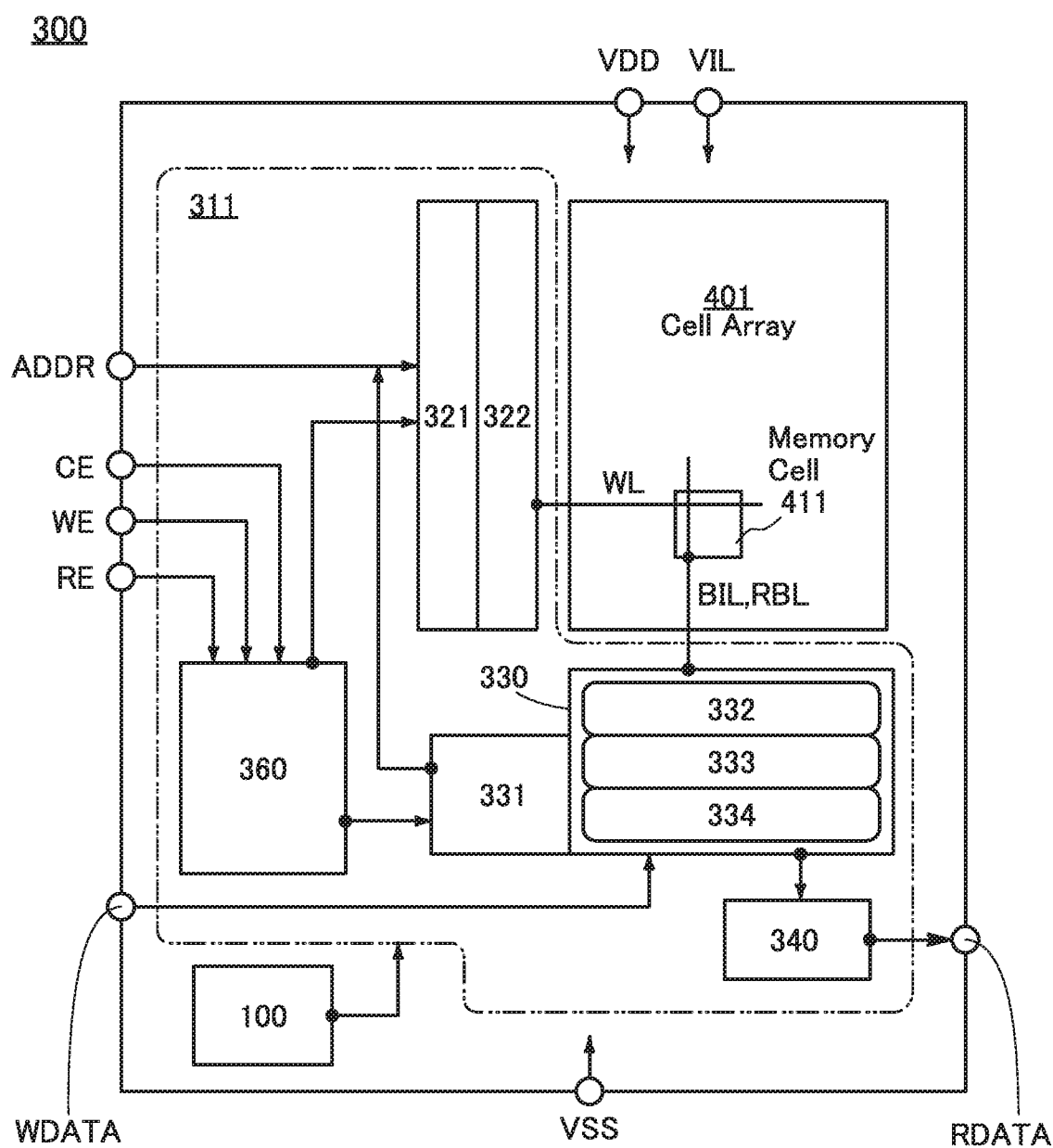
FIG. 8 A diagram illustrating a structure example of a memory device.

FIG. 8 is a block diagram illustrating a structure example of a memory device. A memory device 300 includes a peripheral circuit 311, a cell array 401, and the semiconductor device 100. The peripheral circuit 311 includes a row decoder 321, a word line driver circuit 322, a column decoder 331, a bit line driver circuit 330, an output circuit 340, and a control logic circuit 360.

The word line driver circuit 322 has a function of supplying a potential to a wiring WL. The bit line driver circuit 330 includes a precharge circuit 332, an amplifier circuit 333, and an input/output circuit 334. The precharge circuit 332 has a function of precharging a wiring SL (not illustrated), a wiring BIL, a wiring RBL, and the like. The amplifier circuit 333 has a function of amplifying a data signal read from the wiring BIL or the wiring RBL. Note that the wiring WL, the wiring SL, the wiring BIL, and the wiring RBL are wirings connected to a memory cell 411 included in the cell array 401 and will be described later in detail. The amplified data signal is output to the outside of the memory device 300 as a digital data signal RDATA through the output circuit 340.

As power supply voltages, a low power supply voltage (VSS), a high power supply voltage (VDD) for the peripheral circuit 311, and a high power supply voltage (VIL) for the cell array 401 are supplied to the memory device 300 from the outside.

Control signals (CE, WE, RE), an address signal ADDR, and a data signal WDATA are input to the memory device 300 from the outside. The address signal ADDR is input to the row decoder 321 and the column decoder 331, and the data signal WDATA is input to the input/output circuit 334.

The control logic circuit 360 processes the signals (CE, WE, RE) input from the outside, and generates control signals for the row decoder 321 and the column decoder 331. CE denotes a chip enable signal, WE denotes a write enable signal, and RE denotes a read enable signal. Signals processed by the control logic circuit 360 are not limited to the above, and other control signals may be input as necessary.

Note that whether each circuit or each signal described above is provided or not can be appropriately determined as needed.

OS transistors can be used as transistors included in the cell array 401. Moreover, OS transistors can be used as transistors included in the peripheral circuit 311. When the cell array 401 and the peripheral circuit 311 are formed using OS transistors, the cell array 401 and the peripheral circuit 311 can be formed in the same manufacturing process, and the manufacturing cost can be kept low.

[Structure Example of Cell Array]

Figure 9:
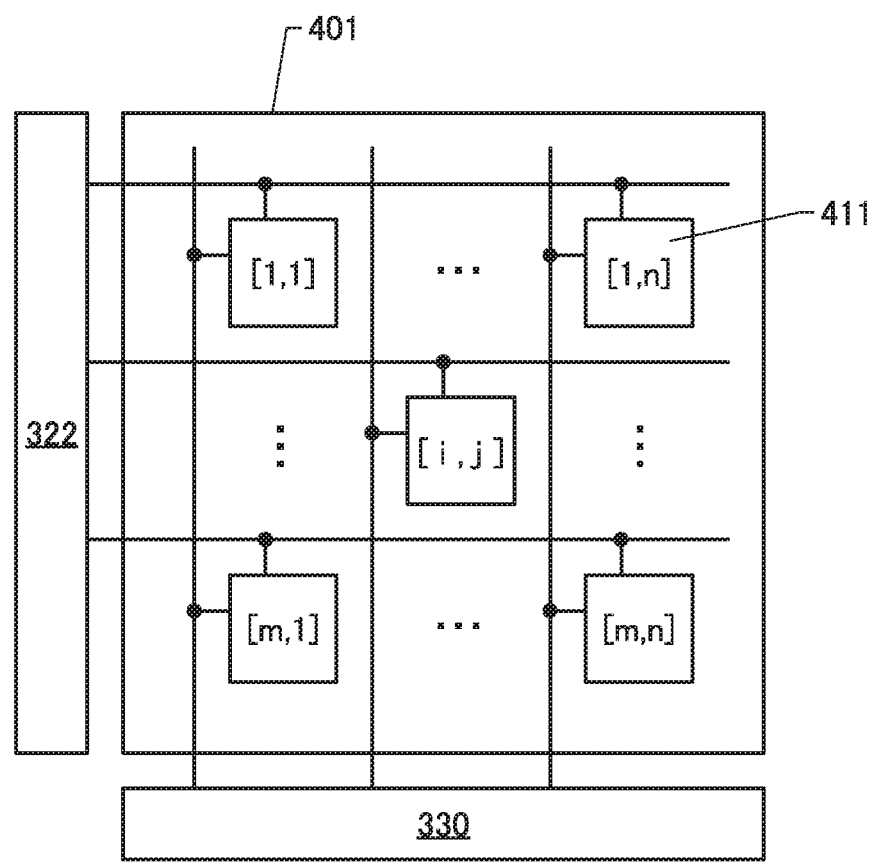
FIG. 9 A diagram illustrating a configuration example of a memory cell array.

FIG. 9 illustrates the details of the cell array 401. The cell array 401 includes a total of m×n memory cells 411 of m cells (m is an integer of 1 or more) in one column and n cells (n is an integer of 1 or more) in one row, and the memory cells 411 are arranged in a matrix. FIG. 9 also illustrates addresses of the memory cells 411. For example, [1,1] represents a memory cell 411 positioned at an address of the first row and the first column, and [i,j] (i is an integer of 1 to m, and j is an integer of 1 to n) represents a memory cell 411 positioned at an address of the i-th row and the j-th column. The number of wirings connecting the cell array 401 and the word line driver circuit 322 is determined by the configuration of the memory cell 411, the number of memory cells 411 included in one column, or the like. The number of wirings connecting the cell array 401 and the bit line driver circuit 330 is determined by the configuration of the memory cell 411, the number of memory cells 411 included in one row, or the like.

[Configuration Example of Memory Cell]

FIG. 10 illustrates configuration examples of a memory cell 411A to a memory cell 411E that can be used as the above memory cell 411.

[DOSRAM]

Figure 10A:
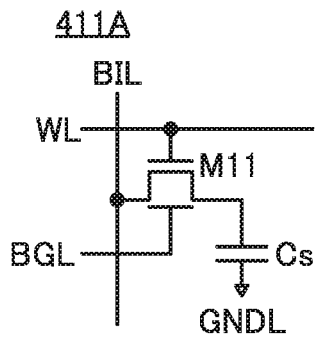
FIGS. 10A-10E Circuit diagrams illustrating configuration examples a memory cells.

FIG. 10(A) illustrates a circuit configuration example of the memory cell 411A of DRAM type. In this specification and the like, a DRAM using an OS transistor is referred to as a DOSRAM (Dynamic Oxide Semiconductor Random Access Memory). The memory cell 411A includes the transistor M11 and a capacitor Cs.

The first terminal of the transistor M11 is connected to a first terminal of the capacitor Cs, the second terminal of the transistor M11 is connected to the wiring BIL, the gate of the transistor M11 is connected to the wiring WL, and the back gate of the transistor M11 is connected to a wiring BGL. A second terminal of the capacitor Cs is connected to a wiring GNDL. The wiring GNDL is a wiring that supplies a low-level potential (sometimes referred to as a reference potential).

The wiring BIL functions as a bit line, and the wiring WL functions as a word line. The wiring BGL functions as a wiring for applying a potential to the back gate of the transistor M11. The wiring BGL is electrically connected to the output terminal OUT of the semiconductor device 100. By applying a given potential to the wiring BGL, the threshold voltage of the transistor M11 can be increased or decreased.

Data writing and reading are performed in such a manner that a high-level potential is applied to the wiring WL to turn on the transistor M11 so that the wiring BIL is electrically connected to the first terminal of the capacitor Cs.

The memory cell included in the memory device 300 is not limited to the memory cell 411A, and the circuit configuration can be changed.

In the case where the transistor M11 is used in the memory cell, an OS transistor is preferably used as the transistor M11. For a semiconductor layer of the OS transistor, an oxide semiconductor containing one of indium, an element M (the element M is aluminum, gallium, yttrium, or tin), and zinc is preferably used. In particular, an oxide semiconductor containing indium, gallium, and zinc is preferably used.

The OS transistor using the oxide semiconductor containing indium, gallium, and zinc has a feature of an extremely low off-state current. The use of the OS transistor as the transistor M11 enables the leakage current of the transistor M11 to be extremely low. That is, written data can be retained for a long time by the transistor M11; thus, the frequency of refresh of the memory cell can be reduced. Alternatively, the refresh operation of the memory cell can be omitted. In addition, the extremely low leakage current allows multi-level data or analog data to be retained in the memory cell 411A.

A DOSRAM can be formed by using the OS transistor as the transistor M11.

[NOSRAM]

Figure 10B:
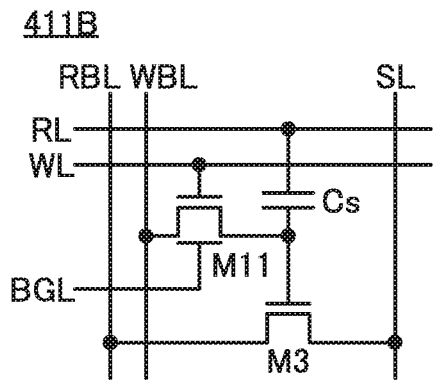

FIG. 10(B) illustrates a circuit configuration example of the memory cell 411B of gain cell type including two transistors and one capacitor (also referred to as "2Tr1C type"). The memory cell 411B includes the transistor M11, a transistor M3, and the capacitor Cs.

The first terminal of the transistor M11 is connected to the first terminal of the capacitor Cs, the second terminal of the transistor M11 is connected to a wiring WBL, the gate of the transistor M11 is connected to the wiring WL, and the back gate of the transistor M11 is connected to the wiring BGL. The second terminal of the capacitor Cs is connected to a wiring RL. A first terminal of the transistor M3 is connected to the wiring RBL, a second terminal of the transistor M3 is connected to the wiring SL, and a gate of the transistor M3 is connected to the first terminal of the capacitor Cs.

The wiring WBL functions as a write bit line, the wiring RBL functions as a read bit line, and the wiring WL functions as a word line. The wiring RL functions as a wiring for applying a predetermined potential to the second terminal of the capacitor Cs. The reference potential is preferably applied to the wiring RL at the time of data writing and during data retention.

The wiring BGL functions as a wiring for applying a potential to the back gate of the transistor M11. The wiring BGL is electrically connected to the output terminal OUT of the semiconductor device 100. By applying a given potential to the wiring BGL, the threshold voltage of the transistor M11 can be increased or decreased.

Data writing is performed in such a manner that a high-level potential is applied to the wiring WL to turn on the transistor M11 so that the wiring WBL is electrically connected to the first terminal of the capacitor Cs. Specifically, when the transistor M11 is in an on state, a potential corresponding to information to be stored is applied to the wiring WBL, whereby the potential is written to the first terminal of the capacitor Cs and the gate of the transistor M3. After that, a low-level potential is applied to the wiring WL to turn off the transistor M11, whereby the potential of the first terminal of the capacitor Cs and the potential of the gate of the transistor M3 are retained.

Data reading is performed by applying a predetermined potential to the wiring RL and the wiring SL. A current flowing between a source and a drain of the transistor M3 and the potential of the first terminal of the transistor M3 are determined by the potential of the gate of the transistor M3 and the potential of the second terminal of the transistor M3; thus, by reading out the potential of the wiring RBL connected to the first terminal of the transistor M3, the potential retained at the first terminal of the capacitor Cs (or the gate of the transistor M3) can be read. In other words, information written to this memory cell can be read from the potential retained at the first terminal of the capacitor Cs (or the gate of the transistor M3). Alternatively, existence or absence of information written to this memory cell can be found.

The memory cell included in the memory device 300 is not limited to the memory cell 411B, and the circuit configuration can be changed.

Figure 10C:
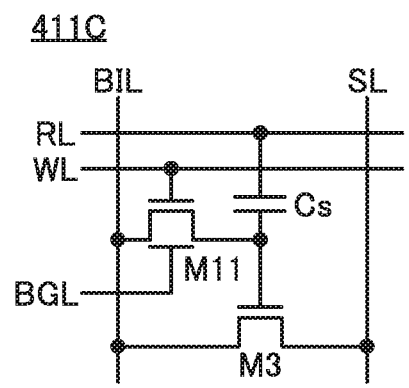

For example, the wiring WBL and the wiring RBL may be combined into one wiring BIL. FIG. 10(C) illustrates a circuit configuration example of this memory cell. In the memory cell 411C, one wiring BIL corresponds to the wiring WBL and the wiring RBL in the memory cell 411B, and the second terminal of the transistor M11 and the first terminal of the transistor M3 are connected to the wiring BIL. In other words, in the memory cell 411C, one wiring BIL functions as a write bit line and a read bit line.

Note that also in the memory cell 411B and the memory cell 411C, an OS transistor is preferably used as the transistor M11. A memory device using a 2Tr1C-type memory cell using an OS transistor as the transistor M11, such as the memory cell 411B and the memory cell 411C, is referred to as a NOSRAM (Non-volatile Oxide Semiconductor Random Access Memory).

Note that a channel formation region of the transistor M3 preferably contains silicon. In particular, the silicon can be amorphous silicon, polycrystalline silicon, or low temperature polysilicon (LTPS) (hereinafter the transistor containing the silicon is referred to as a Si transistor). Since a Si transistor has higher field-effect mobility than an OS transistor in some cases, the use of the Si transistor as a reading transistor is suitable.

In the case where an OS transistor is used as the transistor M3, the memory cell can be composed of a single-polarity circuit.

Figure 10D:
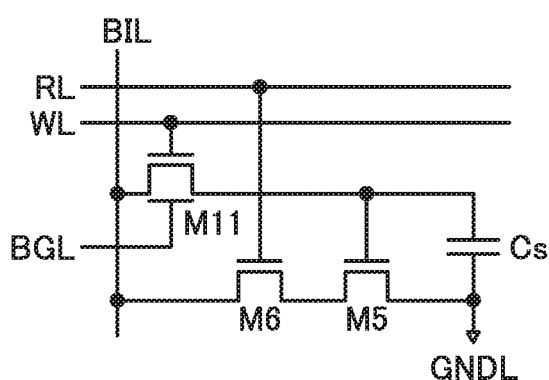

FIG. 10(D) illustrates a circuit configuration example of the memory cell 411D of gain cell type including three transistors and one capacitor (also referred to as "3Tr1C type"). The memory cell 411D includes the transistor M11, a transistor M5, a transistor M6, and the capacitor Cs.

The first terminal of the transistor M11 is connected to the first terminal of the capacitor Cs, the second terminal of the transistor M11 is connected to the wiring BIL, the gate of the transistor M11 is connected to the wiring WL, and the back gate of the transistor M11 is electrically connected to the wiring BGL. The second terminal of the capacitor Cs is electrically connected to a first terminal of the transistor M5 and the wiring GNDL. A second terminal of the transistor M5 is connected to a first terminal of the transistor M6, and a gate of the transistor M5 is connected to the first terminal of the capacitor Cs. A second terminal of the transistor M6 is connected to the wiring BIL, and a gate of the transistor M6 is connected to the wiring RL.

The wiring BIL functions as a bit line, the wiring WL functions as a write word line, and the wiring RL functions as a read word line.

The wiring BGL functions as a wiring for applying a potential to the back gate of the transistor M11. The wiring BGL is electrically connected to the output terminal OUT of the semiconductor device 100. By applying a given potential to the wiring BGL, the threshold voltage of the transistor M11 can be increased or decreased.

Data writing is performed in such a manner that a high-level potential is applied to the wiring WL to turn on the transistor M11 so that the wiring BIL is connected to the first terminal of the capacitor Cs. Specifically, when the transistor M11 is in an on state, a potential corresponding to information to be stored is applied to the wiring BIL, whereby the potential is written to the first terminal of the capacitor Cs and the gate of the transistor M5. After that, a low-level potential is applied to the wiring WL to turn off the transistor M11, whereby the potential of the first terminal of the capacitor Cs and the potential of the gate of the transistor M5 are retained.

Data reading is performed in such a manner that after a predetermined potential is precharged to the wiring BIL, the wiring BIL is made in an electrically floating state, and a high-level potential is applied to the wiring RL. Since the wiring RL has the high-level potential, the transistor M6 is turned on, which electrically connects the wiring BIL and the second terminal of the transistor M5. At this time, the potential of the wiring BIL is applied to the second terminal of the transistor M5; the potential of the second terminal of the transistor M5 and the potential of the wiring BIL are changed in accordance with the potential retained at the first terminal of the capacitor Cs (or the gate of the transistor M5). Here, by reading out the potential of the wiring BIL, the potential retained at the first terminal of the capacitor Cs (or the gate of the transistor M5) can be read. In other words, information written to the memory cell can be read from the potential retained at the first terminal of the capacitor Cs (or the gate of the transistor M5). Alternatively, existence or absence of information written to this memory cell can be found.

The circuit configuration of the memory cell included in the memory device 300 can be changed as appropriate.

Note that also in the memory cell 411D, an OS transistor is preferably used as the transistor M11. The 3Tr1C-type memory cell 411D using an OS transistor as the transistor M11 is one embodiment of the NOSRAM.

Note that channel formation regions of the transistors M5 and M6 described in this embodiment preferably contain silicon. In particular, the silicon can be amorphous silicon, polycrystalline silicon, or low-temperature polysilicon. Since a Si transistor has higher field-effect mobility than an OS transistor in some cases, the use of the Si transistor as a reading transistor is suitable.

In the case where OS transistors are used as the transistors M5 and M6, the memory cell can be composed of a single-polarity circuit.

[oxSRAM]

Figure 10E:
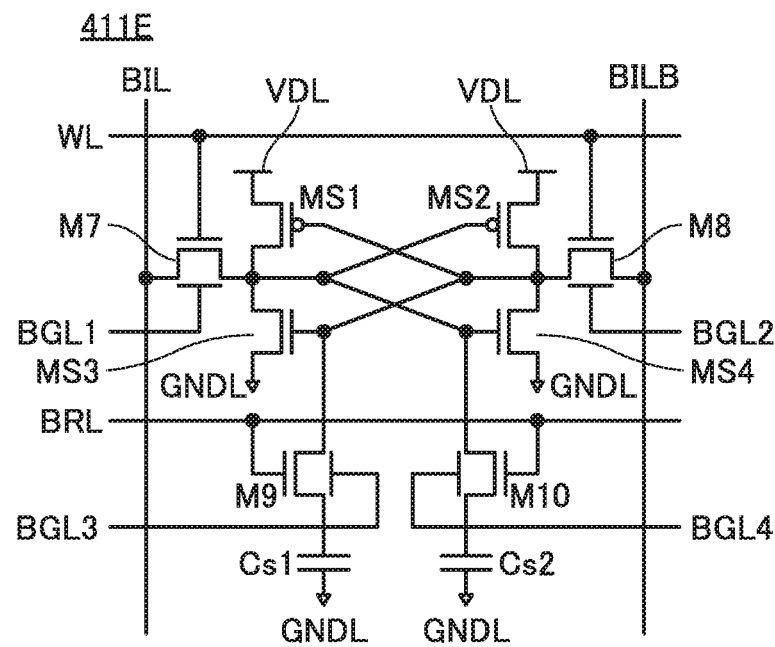

FIG. 10(E) illustrates a circuit configuration example of the memory cell 411E of SRAM (Static Random Access Memory) type using an OS transistor. In this specification and the like, an SRAM using an OS transistor is referred to as an oxSRAM. Note that the memory cell 411E illustrated in FIG. 10(E) is an SRAM-type memory cell capable of backup.

The memory cell 411E includes a transistor M7 to a transistor M10, a transistor MS1 to a transistor MS4, a capacitor Cs1, and a capacitor Cs2. The transistor M7 and the transistor M8 each correspond to the transistor M11. The transistor M7 to the transistor M10 are each a transistor including a back gate. Note that the transistor MS1 and the transistor MS2 are p-channel transistors, and the transistor MS3 and the transistor MS4 are n-channel transistors.

A first terminal of the transistor M7 is connected to the wiring BIL, and a second terminal of the transistor M7 is connected to a first terminal of the transistor MS1, a first terminal of the transistor MS3, a gate of the transistor MS2, a gate of the transistor MS4, and a first terminal of the transistor M10. A gate of the transistor M7 is connected to the wiring WL, and a back gate of the transistor M7 is connected to a wiring BGL1.

A first terminal of the transistor M8 is connected to a wiring BILB, and a second terminal of the transistor M8 is connected to a first terminal of the transistor MS2, a first terminal of the transistor MS4, a gate of the transistor MS1, a gate of the transistor MS3, and a first terminal of the transistor M9. A gate of the transistor M8 is connected to the wiring WL, and a back gate of the transistor M8 is connected to a wiring BGL2.

A second terminal of the transistor MS1 is electrically connected to a wiring VDL. A second terminal of the transistor MS2 is electrically connected to the wiring VDL. A second terminal of the transistor MS3 is electrically connected to the wiring GNDL. A second terminal of the transistor MS4 is connected to the wiring GNDL.

A second terminal of the transistor M9 is connected to a first terminal of the capacitor Cs1, a gate of the transistor M9 is connected to the wiring BRL, and a back gate of the transistor M9 is connected to a wiring BGL3. A second terminal of the transistor M10 is connected to a first terminal of the capacitor Cs2, a gate of the transistor M10 is connected to the wiring BRL, and a back gate of the transistor M10 is connected to a wiring BGL4.

A second terminal of the capacitor Cs1 is connected to the wiring GNDL, and a second terminal of the capacitor Cs2 is connected to the wiring GNDL.

The wiring BIL and the wiring BILB each function as a bit line, the wiring WL functions as a word line, and the wiring BRL is a wiring that controls the on state and the off state of the transistor M9 and the transistor M10.

The wiring BGL1 to the wiring BGL4 function as wirings for applying a potential to the back gates of the transistor M7 to the transistor M10, respectively.

The wiring BGL1 to the wiring BGL4 are electrically connected to the output terminal OUT of the semiconductor device 100. Note that a plurality of semiconductor devices 100 may be provided in the memory device 300, and the wiring BGL1 to the wiring BGL4 may be electrically connected to different semiconductor devices 100. By applying a given potential to the wiring BGL1 to the wiring BGL4, the threshold voltages of the transistor M7 to the transistor M10 can be increased or decreased, respectively.

The wiring VDL is a wiring supplying a high-level potential, and the wiring GNDL is a wiring supplying a low-level potential.

Data writing is performed by applying a high-level potential to the wiring WL and applying a high-level potential to the wiring BRL. Specifically, when the transistor M10 is in an on state, a potential corresponding to information to be stored is applied to the wiring BIL, whereby the potential is written to the second terminal side of the transistor M10.

In the memory cell 411E, the transistor MS1 and the transistor MS2 form an inverter loop; thus, an inverted signal of a data signal corresponding to the potential is input to the second terminal side of the transistor M8. Since the transistor M8 is in an on state, an inverted signal of the potential applied to the wiring BIL, that is, the signal input to the wiring BIL is output to the wiring BILB. Since the transistor M9 and the transistor M10 are in an on state, the potential of the second terminal of the transistor M7 and the potential of the second terminal of the transistor M8 are respectively retained at the first terminal of the capacitor Cs2 and the first terminal of the capacitor Cs1. Then, a low-level potential is applied to the wiring WL and a low-level potential is applied to the wiring BRL to turn off the transistor M7 to the transistor M10, so that the potentials of the first terminal of the capacitor Cs1 and the first terminal of the capacitor Cs2 are retained.

Data reading is performed in such a manner that after the wiring BIL and the wiring BILB are precharged at a predetermined potential in advance, a high-level potential is applied to the wiring WL and a high-level potential is applied to the wiring BRL, whereby the potential of the first terminal of the capacitor Cs1 is refreshed by the inverter loop in the memory cell 411E and is output to the wiring BILB. Moreover, the potential of the first terminal of the capacitor Cs2 is refreshed by the inverter loop in the memory cell 411E and is output to the wiring BIL. Since the potentials of the wiring BIL and the wiring BILB are changed from the precharged potentials to the potential of the first terminal of the capacitor Cs2 and the potential of the first terminal of the capacitor Cs1, respectively, the potential retained in the memory cell can be read from the potential of the wiring BIL or the wiring BILB.

Note that OS transistors are preferably used as the transistor M7 to the transistor M10. The use of OS transistors as the transistor M7 to the transistor M10 allows data written to the memory cell 411E to be retained for a long time, so that the frequency of refresh of the memory cell 411E can be reduced. Alternatively, the refresh operation of the memory cell 411E can be omitted. In addition, extremely low leakage current allows multi-level data or analog data to be retained in the memory cell 411E.

Note that channel formation regions of the transistor MS1 to the transistor MS4 preferably contain silicon. In particular, the silicon can be amorphous silicon, polycrystalline silicon, or low-temperature polysilicon. Since a Si transistor has higher field-effect mobility than an OS transistor in some cases, the use of Si transistors as the transistors included in the inverter is suitable.

When an OS transistor is used in the memory cell, information written to the memory cell can be retained for a long time even when power supply to the memory cell is stopped. Accordingly, power supply to part or the whole of the peripheral circuit 311 can be stopped in a period during which it is not necessary to write and read information.

One semiconductor device 100 may be electrically connected to all memory cells. Alternatively, a plurality of semiconductor devices 100 may be provided in the memory device 300, and a plurality of memory cells in one column or a plurality of columns may be electrically connected to one semiconductor device 100. Alternatively, a plurality of memory cells in one row or a plurality of rows may be electrically connected to one semiconductor device 100. Alternatively, a plurality of memory cells included in the cell array may be divided into a plurality of blocks, and one semiconductor device 100 may be provided for one block or a plurality of blocks.

The memory cell described in this embodiment can be used for a memory element of a register, a cache, and the like included in a CPU, a GPU, and the like.

This embodiment can be implemented in an appropriate combination with the structures described in the other embodiments and the like.

Embodiment 3

In this embodiment, a structure example of the cell array 401 included in the memory device 300 and an operation example thereof will be described. In this embodiment, the memory cell 411A of DRAM type is used as the memory cell 411.

Figure 11:
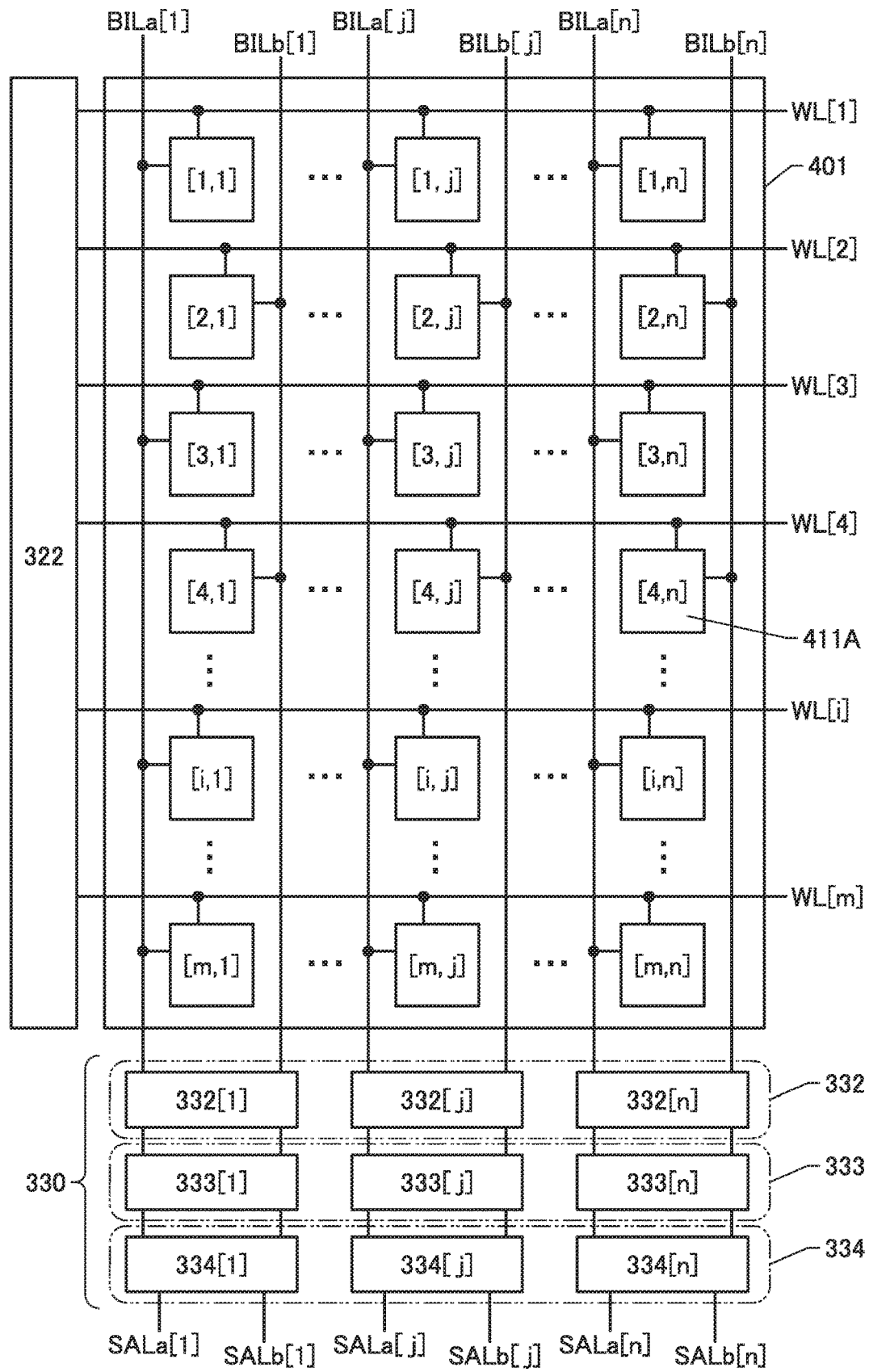
FIG. 11 A diagram illustrating a configuration example of a memory cell array and a bit line driver circuit.

FIG. 11 illustrates an example of the cell array 401, which is different from that in FIG. 9. FIG. 11 illustrates a memory cell array having a folded bit-line architecture. Note that the memory cell 411A can also be used for a memory cell array having an open bit-line architecture.

The cell array 401 illustrated in FIG. 11 includes a total of m×n memory cells 411A of m cells (m is an integer of 1 or more) in one column and n cells (n is an integer of 1 or more) in one row, and the memory cells 411A are arranged in a matrix. FIG. 11 also illustrates addresses of the memory cells 411A. For example, [i,j] represents a memory cell 411A positioned at an address of the i-th row and the j-th column.

The cell array 401 illustrated in FIG. 11 includes m wirings WL electrically connected to the word line driver circuit 322. A wiring WL[1] is electrically connected to the memory cells 411A in the first row. Similarly, a wiring WL[i] is electrically connected to the memory cells 411A in the i-th row.

In addition, the cell array 401 illustrated in FIG. 11 includes two wirings BIL (a wiring BILa and a wiring BILb) in one column. In FIG. 11, the wiring BILa in the first column is referred to as a wiring BILa[1], and the wiring BILb in the j-th column is referred to as a wiring BILb[j].

The memory cell 411A placed in an odd-numbered row is electrically connected to one of the wiring BILa and the wiring BILb, and the memory cell 411A placed in an even-numbered row is electrically connected to the other of the wiring BILa and the wiring BILb.

Moreover, the wiring BILa and the wiring BILb are electrically connected to the precharge circuit 332, the amplifier circuit 333, and the input/output circuit 334, which are provided in every column. The input/output circuit 334 is electrically connected to a wiring SALa and a wiring SALb in every column. In FIG. 11, the precharge circuit 332 in the first column is referred to as a precharge circuit 332[1], and the precharge circuit 332 in the j-th column is referred to as a precharge circuit 332[j]. The same manner of reference applies to the amplifier circuit 333 and the input/output circuit 334. Note that the bit line driver circuit 330 includes the column decoder 331 (see FIG. 8).

<Circuit Configuration Example>

Figure 12:
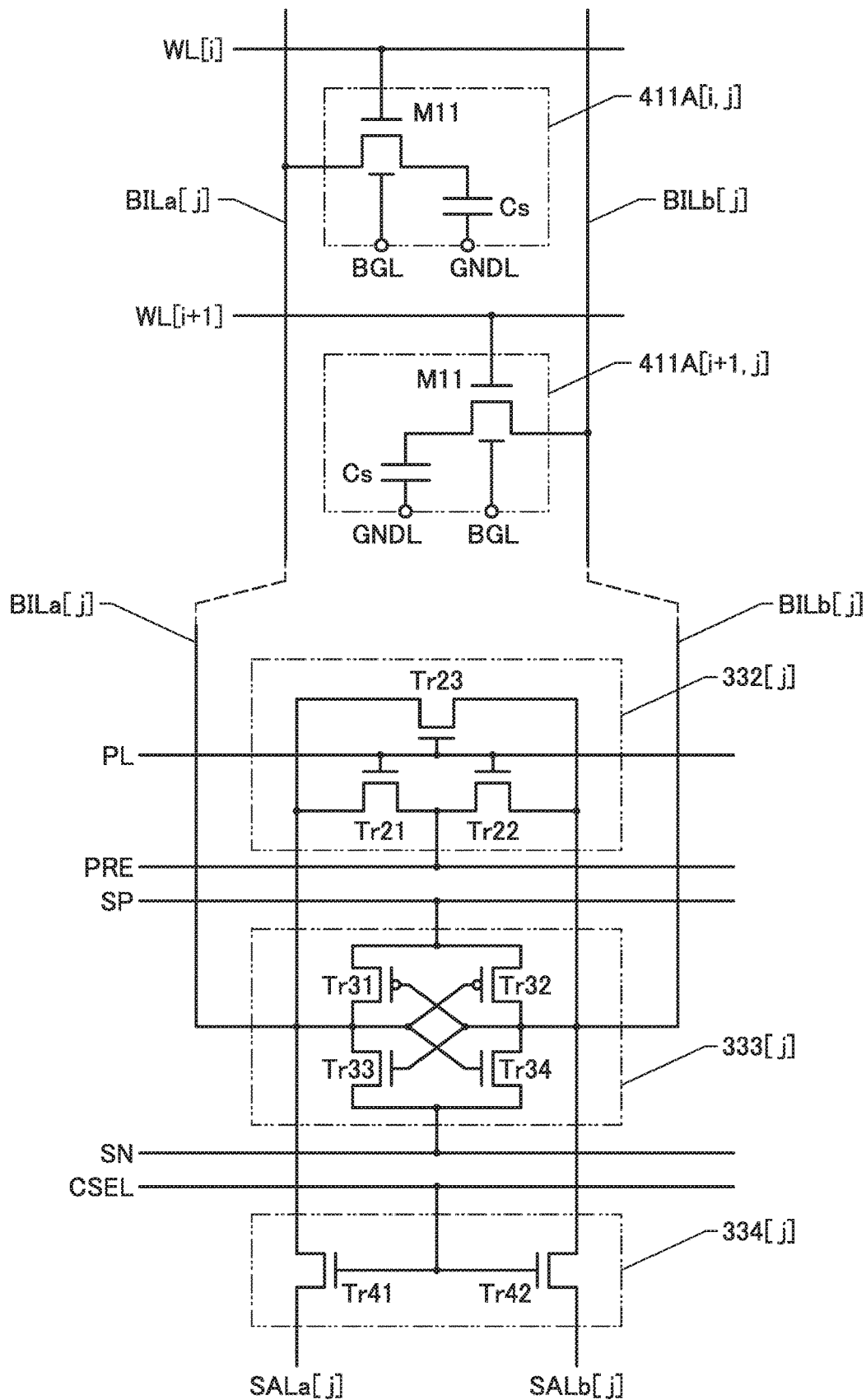
FIG. 12 A diagram illustrating a circuit configuration example.

FIG. 12 illustrates a circuit configuration example of the memory cell 411A, the precharge circuit 332, the amplifier circuit 333, and the input/output circuit 334 that are in the J-th column.

[Precharge Circuit 332]

The precharge circuit 332[j] includes an n-channel transistor Tr21 to an n-channel transistor Tr23. Note that the transistor Tr21 to the transistor Tr23 may be p-channel transistors. One of a source and a drain of the transistor Tr21 is connected to a wiring BILa[j], and the other of the source and the drain is connected to a wiring PRE. One of a source and a drain of the transistor Tr22 is connected to the wiring BILb[j], and the other of the source and the drain is connected to the wiring PRE. One of a source and a drain of the transistor Tr23 is connected to the wiring BILa[j], and the other of the source and the drain is connected to the wiring BILb[j]. A gate of the transistor Tr21, a gate of the transistor Tr22, and a gate of the transistor Tr23 are connected to a wiring PL. The precharge circuit 332[j] has a function of initializing the potentials of the wiring BILa[j] and the wiring BILb[j].

[Amplifier Circuit 333]

An amplifier circuit 333[j] includes a p-channel transistor Tr31, a p-channel transistor Tr32, an n-channel transistor Tr33, and an n-channel transistor Tr34. One of a source and a drain of the transistor Tr31 is connected to a wiring SP, and the other of the source and the drain is connected to a gate of the transistor Tr32, a gate of the transistor Tr34, and the wiring BILa[j]. One of a source and a drain of the transistor Tr33 is connected to the gate of the transistor Tr32, the gate of the transistor Tr34, and the wiring BILa[j], and the other of the source and the drain is connected to a wiring SN. One of a source and a drain of the transistor Tr32 is connected to the wiring SP, and the other of the source and the drain is connected to a gate of the transistor Tr31, a gate of the transistor Tr33, and the wiring BILb[j]. One of a source and a drain of the transistor Tr34 is connected to the gate of the transistor Tr31, the gate of the transistor Tr33, and the wiring BILb[j], and the other of the source and the drain is connected to the wiring SN. The amplifier circuit 333[j] has a function of amplifying the potentials of the wirings BILa[j] and BILb[1]. The amplifier circuit 333[j] functions as a latch sense amplifier.

[Input/Output Circuit 334]

An input/output circuit 334[j] includes an n-channel transistor Tr41 and an n-channel transistor Tr42. Note that the transistor Tr41 and the transistor Tr42 may be p-channel transistors. One of a source and a drain of the transistor Tr41 is connected to the wiring BILa[j], and the other of the source and the drain is connected to a wiring SALa[j]. One of a source and a drain of the transistor Tr42 is connected to the wiring BILb[j], and the other of the source and the drain is connected to a wiring SALb[j]. One of a source and a drain of the transistor Tr42 is connected to the wiring BILb[j], and the other of the source and the drain is connected to the wiring SALb[j]. A gate of the transistor Tr41 and a gate of the transistor Tr42 are connected to a wiring CSEL.

The input/output circuit 334[j] has a function of controlling the electrical continuity between the wiring BILa[j] and the wiring SALa[j] and the electrical continuity between the wiring BILb[j] and the wiring SALb[j] on the basis of a potential supplied to the wiring CSEL. That is, whether a potential is output to the wiring SALa[j] and the wiring SALb[j] can be selected by the input/output circuit 334[j].

The wiring SP, the wiring SN, the wiring CSEL, the wiring PRE, and the wiring PL have a function of transmitting a signal for controlling the operation of the precharge circuit 332, the amplifier circuit 333, and the input/output circuit 334. The wiring SP, the wiring SN, the wiring CSEL, the wiring PRE, and the wiring PL are connected to the control logic circuit 360 illustrated in FIG. 8. The control logic circuit 360 has a function of supplying a control signal to the wiring SP, the wiring SN, the wiring CSEL, the wiring PRE, and the wiring PL.

<Operation Example>

An operation mode of the memory device 300 is described using a memory cell 411A[i,j], the precharge circuit 332[j], the amplifier circuit 333[j], and the input/output circuit 334[j], which are illustrated in FIG. 12. The memory device 300 operates at 20° C. Thus, −3 V is supplied from the semiconductor device 100 to the wiring BGL.

[Reading Mode]

First, an operation example of the amplifier circuit 333[j] when data is read from the memory cell 411A[i,j] is described with reference to a timing chart shown in FIG. 13.

[Period T11]

In Period T11, the precharge circuit 332[j] is operated, and the potentials of the wiring BILa[j] and the wiring BILb[j] are initialized. Specifically, the potential of the wiring PL is set to a high level (VH_PL) to turn on the transistor Tr21 to the transistor Tr23. Thus, a potential Vpre of the wiring PRE is supplied to the wiring BILa[j] and the wiring BILb[j]. Note that the potential Vpre can be set to (VH_SP+VL_SN)/2, for example.

Note that in Period T11, the potential of the wiring CSEL is at a low level (VL_CSEL), and the transistor Tr41 and the transistor Tr42 in the input/output circuit 334[1] are in an off state. In addition, the potential of the wiring WL[i] is at a low level (VL_WL), and the transistor M11 included in the memory cell 411A[i,j] is in an off state. Similarly, although not illustrated in FIG. 13, the potential of a wiring WL[i+1] is at a low level (VL_WL), and the transistor M11 included in a memory cell 411A[i+1,j] is in an off state. In addition, the potentials of the wiring SP and the wiring SN are the potential Vpre, and the amplifier circuit 333 [j] is in a halting state.

[Period T12]

In Period T12, the potential of the wiring PL is set to a low level (VL_PL) to turn off the transistor Tr21 to the transistor Tr23. The wiring WL[i] is selected. Specifically, the potential of the wiring WL[i] is set to a high level (VH_WL) to turn on the transistor M11 included in the memory cell 411A[i,j]. This establishes electrical continuity between the wiring BILa[j] and the capacitor Cs through the transistor M11 in the memory cell 411A[i,j], and the potential of the wiring BILa[j] changes in accordance with the amount of charge retained in the capacitor Cs.

Figure 13:
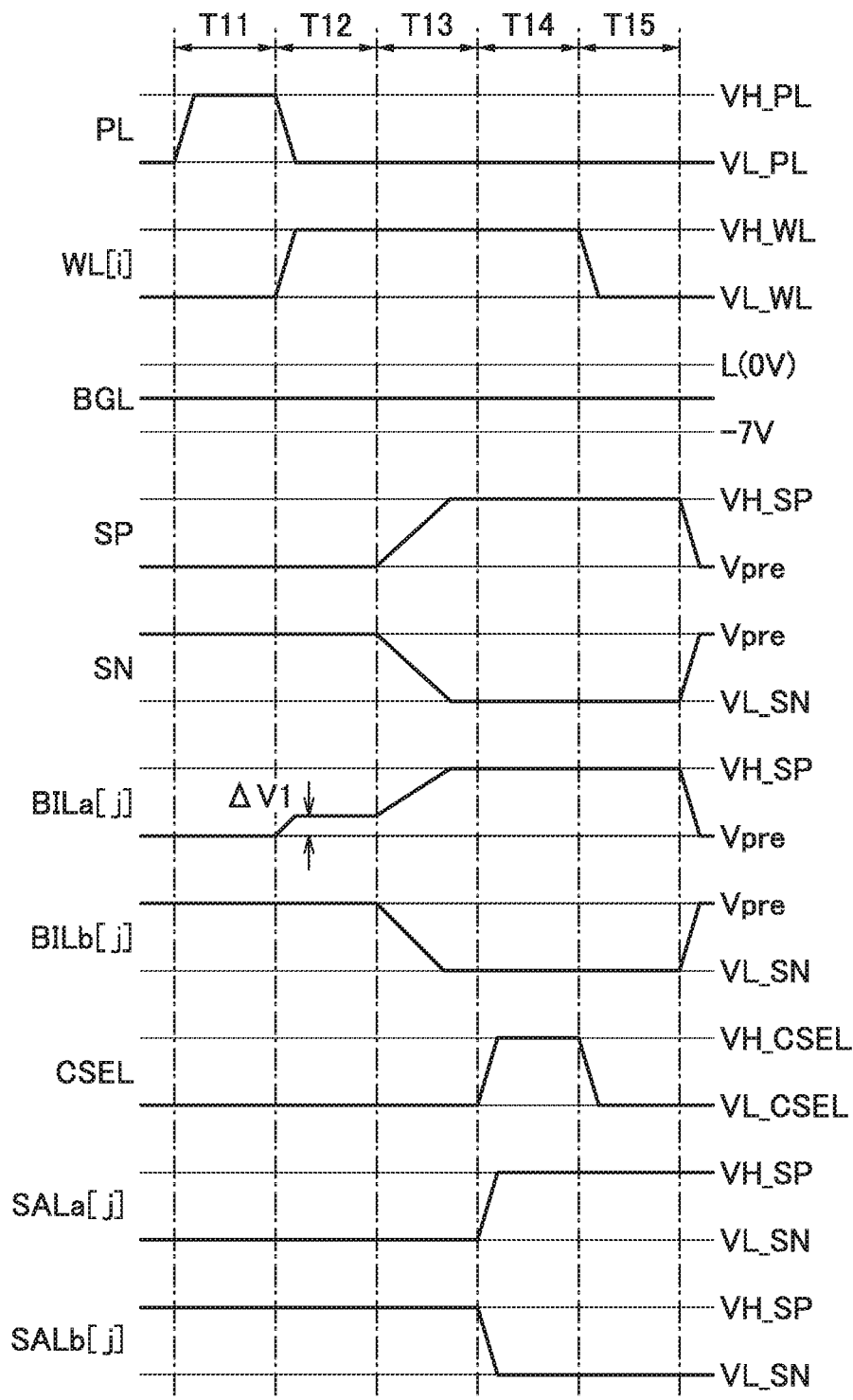
FIG. 13 A timing chart showing an operation example of a memory device.

FIG. 13 shows the case where data "1" is stored in the memory cell 411A[i,j] and the amount of charge accumulated in the capacitor Cs is large, as an example. Specifically, in the case where the amount of charge accumulated in the capacitor Cs is large, the release of charge from the capacitor Cs to the wiring BILa[j] increases the potential of the wiring BILa[j] from the potential Vpre by ΔV1. On the other hand, in the case where data "0" is stored in the memory cell 411A[i,j] and the amount of charge accumulated in the capacitor Cs is small, charge flows from the wiring BILa[j] to the capacitor Cs, decreasing the potential of the wiring BILa[j] by ΔV2 (not illustrated).

Note that in Period T12, the potential of the wiring CSEL is at a low level (VL_CSEL), and the transistor Tr41 and the transistor Tr42 in the input/output circuit 334[j] are in an off state. In addition, the potentials of the wiring SP and the wiring SN are the potential Vpre, and the amplifier circuit 333[j] remains in a halting state.

[Period T13]

In Period T13, the potential of the wiring SP is changed to a high level (VH_SP) and the potential of the wiring SN is changed to a low level (VL_SN). Thus, the amplifier circuit 333[j] is brought into an operating state. The amplifier circuit 333[j] has a function of amplifying the potential difference between the wiring BILa[j] and the wiring BILb[j] (ΔV1 in FIG. 13). Bringing the amplifier circuit 333[j] into an operating state makes the potential of the wiring BILa[j] closer to the potential of the wiring SP (VH_SP) from Vpre+ΔV1. In addition, the potential of the wiring BILb[j] gets closer to the potential of the wiring SN (VL_SN) from Vpre.

Note that in the case where the potential of the wiring BILa[j] is Vpre−ΔV2 in the initial stage of Period T13, bringing the amplifier circuit 333[j] into an operating state makes the potential of the wiring BILa[j] closer to the potential of the wiring SN (VL_SN) from Vpre−ΔV2. In addition, the potential of the wiring BILb[j] gets closer to the potential of the wiring SP (VH_SP) from the potential Vpre.

In Period T13, the potential of the wiring PL is at a low level (VL_PL), and the transistor Tr21 to the transistor Tr23 in the precharge circuit 332[j] are in an off state. In addition, the potential of the wiring CSEL is at a low level (VL_CSEL), and the transistor Tr41 and the transistor Tr42 in the input/output circuit 334[j] are in an off state. Furthermore, the potential of the wiring WL[i] is at a high level (VH_WL), and the transistor M11 included in the memory cell 411A[i,j] is in an on state. Consequently, the amount of charge corresponding to the potential of the wiring BILa[j] (VH_SP) is accumulated in the capacitor Cs in the memory cell 411A[i,j].

[Period T14]

In Period T14, the potential of the wiring CSEL is controlled to turn on the input/output circuit 334[j]. Specifically, the potential of the wiring CSEL is set to a high level (VH_CSEL) to turn on the transistor Tr41 and the transistor Tr42. Accordingly, the potential of the wiring BILa[j] is supplied to the wiring SALa[j], and the potential of the wiring BILb[j] is supplied to the wiring SALb[j].

Note that in Period T14, the potential of the wiring PL is at a low level (VL_PL), and the transistor Tr21 to the transistor Tr23 in the precharge circuit 332[j] are in an off state. In addition, the potential of the wiring WL[i] is at a high level (VH_WL), and the transistor M11 included in the memory cell 411A[i,j] is in an on state. The potential of the wiring SP is at a high level (VH_SP), the potential of the wiring SN is at a low level (VL_SN), and the amplifier circuit 333[j] is in an operating state. Consequently, charge corresponding to the potential of the wiring BILa[j] (VH_SP) is accumulated in the capacitor Cs in the memory cell 411A[i,j].

[Period T15]

In Period T15, the potential of the wiring CSEL is controlled to turn off the input/output circuit 334[j]. Specifically, the potential of the wiring CSEL is set to a low level (VL_CSEL) to turn off the transistor Tr41 and the transistor Tr42.

In addition, the wiring WL[i] is unselected in Period T15. Specifically, the potential of the wiring WL[i] is set to a low level (VL_WL). Consequently, the transistor included in the memory cell 411A[i,j] is turned off. Thus, the amount of charge corresponding to the potential of the wiring BILa (VH_SP) is retained in the capacitor Cs included in the memory cell 411A[i,j]. Accordingly, data is retained in the memory cell 411A[i,j] even after the data is read.

Note that in Period T15, even when the input/output circuit 334[j] is turned off, the potentials of the wiring BILa[j] and the wiring BILb[j] are retained by the amplifier circuit 333[j] as long as the amplifier circuit 333[j] is in an operating state. Therefore, the amplifier circuit 333[j] has a function of temporarily retaining data that has been read from the memory cell 411A[i,j].

Through the operations described above, data can be read from the memory cell 411A[i,j]. The read data is supplied to the output circuit 340 (see FIG. 8) through the wiring SALa[j] and/or the wiring SALb[j]. Note that reading of data from the memory cell 411A[i+1,j] can be performed in a manner similar to that of the memory cell 411A[i,j].

[Writing Mode]

Figure 14:
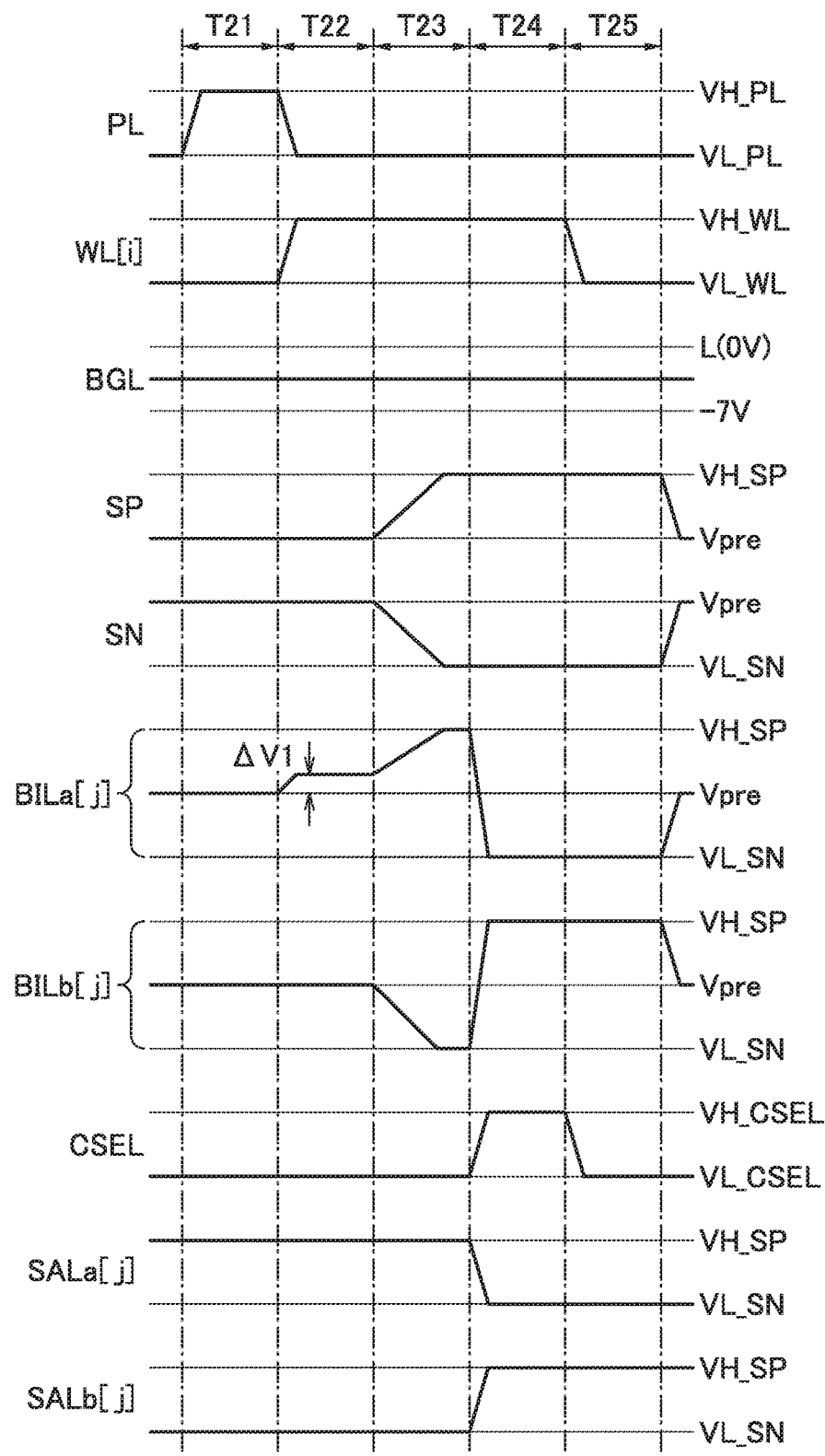
FIG. 14 A timing chart showing an operation example of a memory device.

Next, an operation example of the amplifier circuit 333[j] when data is written to the memory cell 411A[i,j] is described with reference to a timing chart shown in FIG. 14. Data can be written to the memory cell 411A[i+1,j] on the principle similar to that described above.

[Period T21]

In Period T21, the transistor Tr21 to the transistor Tr23 included in the precharge circuit 332[1] are turned on, and the potentials of the wiring BILa[j] and the wiring BILb[j] are initialized. Specifically, the potential of the wiring PL is set to a high level (VH_PL) to turn on the transistor Tr21 to the transistor Tr23. Thus, a potential Vpre of the wiring PRE is supplied to the wiring BILa[j] and the wiring BILb[j]. Note that the potential Vpre can be set to (VH_SP+VL_SN)/2, for example.

[Period T22]

After that, in Period T22, the potential of the wiring PL is set to a low level (VL_PL) to turn off the transistor Tr21 to the transistor Tr23. The wiring WL[i] connected to the memory cell 411A[i,j] to which data is written is selected. Specifically, the potential of the wiring WL[i] is set to a high level (VH_WL) to turn on the transistor M11 included in the memory cell 411A[i,j]. This establishes electrical continuity between the wiring BILa[j] and the capacitor Cs through the transistor M11 in the memory cell 411A[i,j].

At this time, in the case where data "1" is already stored in the memory cell 411A[i,j], the release of charge from the capacitor Cs to the wiring BILa[j] increases the potential of the wiring BILa[j] from the potential Vpre by $\Delta V1$.

[Period T23]

In Period T23, the potential of the wiring SP is set to a high level (VH_SP) and the potential of the wiring SN is set to a low level (VL_SN) to bring the amplifier circuit 333[j] into an operating state.

[Period T24]

In Period T24, the potential of the wiring CSEL is controlled to turn on the input/output circuit 334[j]. This establishes electrical continuity between the wiring BILa[j] and the wiring SALa[j] and electrical continuity between the wiring BILb[j] and the wiring SALb[j].

The data signal WDATA is supplied to the input/output circuit 334[j] through the wiring SALa[j] and the wiring SALb[j]. By supplying a writing potential corresponding to the data signal WDATA to the wiring SALa[j] and the wiring SALb[j], the writing potential is supplied to the wiring BILa[j] and the wiring BILb[j] through the input/output circuit 334[j]. When data "0" is stored in the memory cell 411A[i,j], a low level (VL_SN) is supplied to the wiring SALa[j] and a high level (VH_SP) is supplied to the wiring SALb[j].

Thus, the on/off state of the transistor Tr31 to the transistor Tr34 included in the amplifier circuit 333[j] is inverted, the potential of the wiring SN (VL_SN) is supplied to the wiring BILa[j], and the potential of the wiring SP (VH_SP) is supplied to the wiring BILb[j]. Accordingly, the amount of charge corresponding to the potential representing the data "0" (VL_SN) is accumulated in the capacitor Cs. Through the operations described above, data can be written to the memory cell 411A[i,j].

[Period T25]

The wiring WL[i] is unselected in Period T25. Accordingly, charge written to the memory cell 411A[i,j] is retained. In addition, the potential of the wiring CSEL is set to a low level (VL_CSEL) to turn off the transistor Tr41 and the transistor Tr42.

Note that after the potential of the wiring SALa[j] is supplied to the wiring BILa[j], the potentials of the wiring BILa[j] and the wiring BILb[j] are retained by the amplifier circuit 333[j] as long as the sense amplifier circuit 333[j] is in an operating state even when the transistor Tr41 and the transistor Tr42 are turned off in the input/output circuit 334[j]. Thus, the timing of switching the transistor Tr41 and the transistor Tr42 from an on state to an off state can be either before or after the wiring WL[i] is selected.

Through the operations described above, data can be written to the memory cell 411A[i,j]. Note that writing of data to the memory cell 411A[i+1,j] can be performed in a manner similar to that of the memory cell 411A[i,j].

[Refresh Mode]

Figure 15:
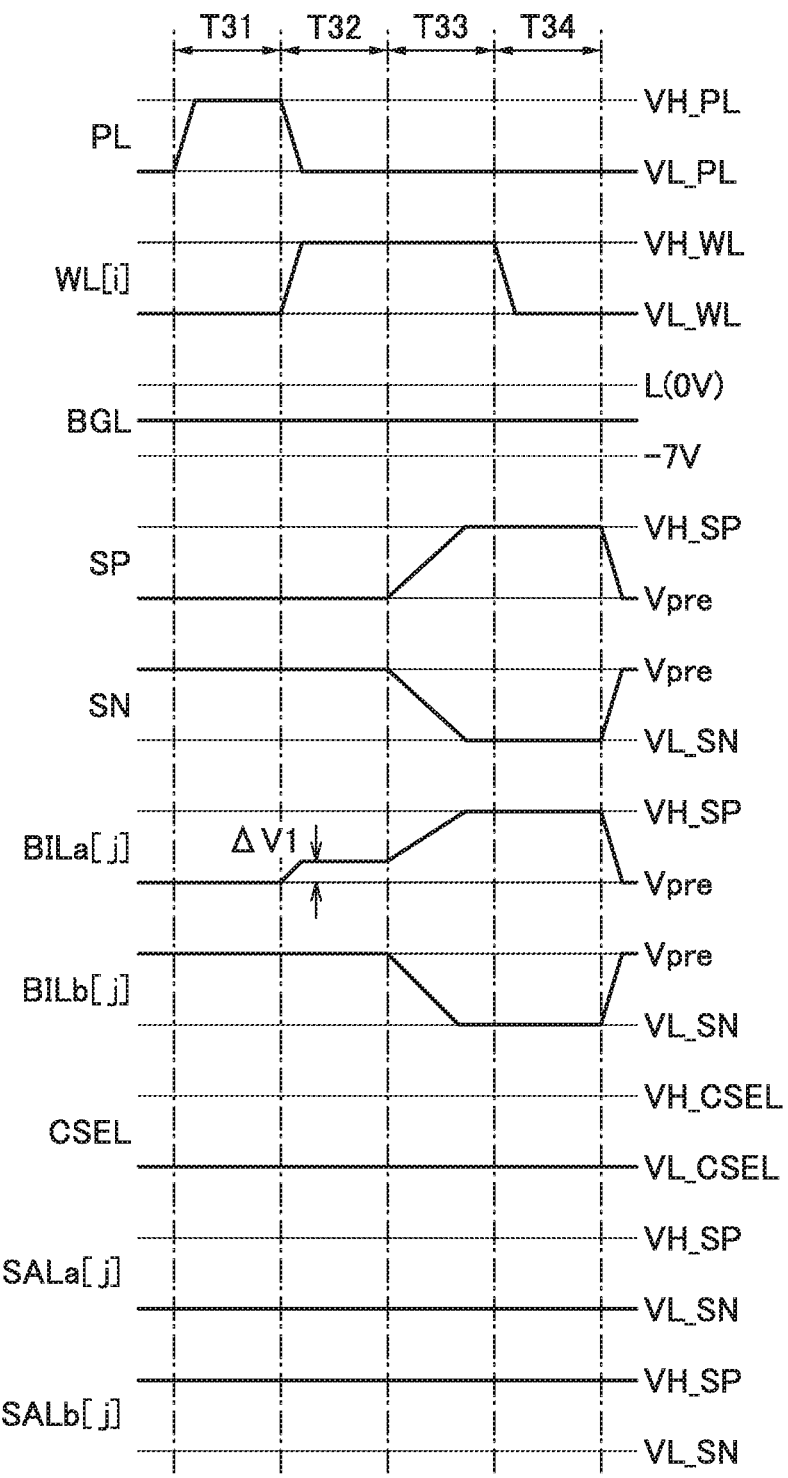
FIG. 15 A timing chart showing an operation example of a memory device.

In order to maintain data written to the memory cell 411A[ii], refresh operation (rewriting operation) is performed at regular intervals. An operation example of the amplifier circuit 333[j] at refresh operation is described with reference to a timing chart shown in FIG. 15. Note that the refresh operation can be performed in the same principle as the above.

[Period T31]

In Period T31, the transistor Tr21 to the transistor Tr23 included in the precharge circuit 332[j] are turned on, and the potentials of the wiring BILa[j] and the wiring BILb[j] are initialized. Specifically, the potential of the wiring PL is set to a high level (VH_PL) to turn on the transistor Tr21 to the transistor Tr23. Thus, a potential Vpre of the wiring PRE is supplied to the wiring BILa[j] and the wiring BILb[j].

[Period T32]

In Period T32, the potential of the wiring PL is set to a low level (VL_PL) to turn off the transistor Tr21 to the transistor Tr23. Furthermore, the wiring WL[i] connected to the memory cell 411A[i,j] to which data is written is selected. Specifically, the potential of the wiring WL[i] is set to a high level (VH_WL) to turn on the transistor M11 included in the memory cell 411A[i,j]. This establishes electrical continuity between the wiring BILa[j] and the capacitor Cs through the transistor M11 in the memory cell 411A[i,j].

At this time, in the case where data "1" is already stored in the memory cell 411A[i,j], the release of charge from the capacitor Cs to the wiring BILa[j] increases the potential of the wiring BILa[j] from the potential Vpre by $\Delta V1$.

[Period T33]

In Period T33, the potential of the wiring SP is set to a high level (VH_SP) and the potential of the wiring SN is set to a low level (VL_SN) to bring the amplifier circuit 333[j] into an operating state. Bringing the amplifier circuit 333[j] into an operating state makes the potential of the wiring BILa[j] closer to the potential of the wiring SP (VH_SP) from Vpre+$\Delta V1$. In addition, the potential of the wiring BILb[j] gets closer to the potential of the wiring SN (VL_SN) from Vpre. Note that the time required for Period T33 is referred to as "writing time" in this specification and the like.

[Period T34]

The wiring WL[i] is unselected in Period T34. Specifically, the potential of the wiring WL[i] is set to a low level (VL_WL) to turn off the transistor included in the memory cell 411A[i,j]. Thus, the amount of charge corresponding to the potential of the wiring BILa (VH_SP) is retained in the capacitor Cs included in the memory cell 411A[i,j].

Since data reading or writing is not performed in the refresh mode, the input/output circuit 334[j] remains in an off state. Thus, the refresh mode can be performed in a shorter period than the reading mode and the writing mode. Note that the refresh mode of the memory cell 411A[i+1,j] can be performed in a manner similar to that of the memory cell 411A[i,j].

[NV Mode]

Figure 16:
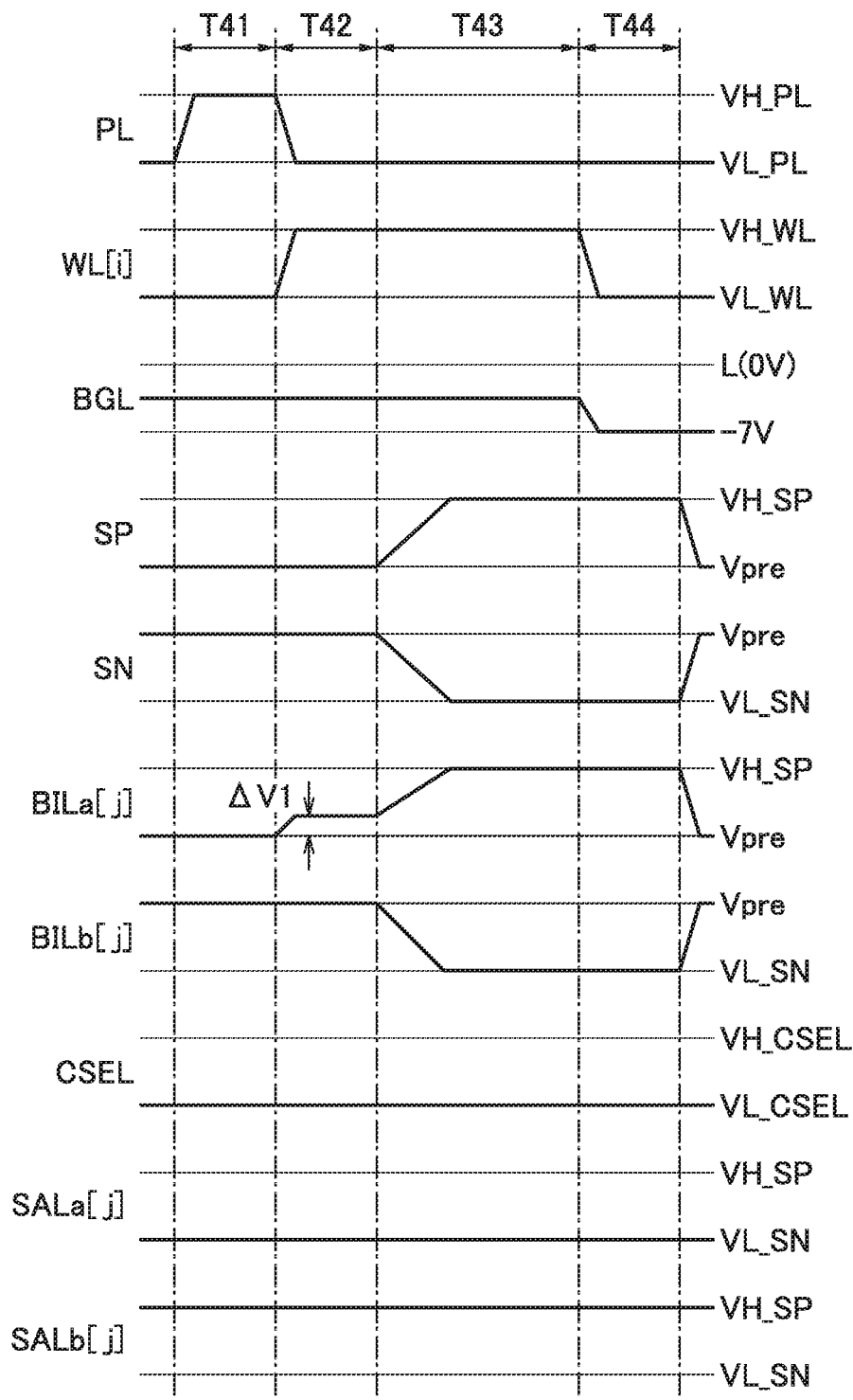
FIG. 16 A timing chart showing an operation example of a memory device.

When an OS transistor is used as the transistor M11, power supply to part or the whole of the peripheral circuit 311 and the cell array 401 can be stopped in a period during which it is not necessary to write and read information. In this case, the memory device 300 is preferably operated in an NV mode (Non-volatile mode). An NV mode operation example is described with reference to a timing chart shown in FIG. 16.

[Period T41]

In Period T41, the transistor Tr21 to the transistor Tr23 included in the precharge circuit 332[j] are turned on, and the potentials of the wiring BILa[j] and the wiring BILb[j] are initialized. Specifically, the potential of the wiring PL is set to a high level (VH_PL) to turn on the transistor Tr21 to the transistor Tr23. Thus, a potential Vpre of the wiring PRE is supplied to the wiring BILa[j] and the wiring BILb[j]. Note that Period T41 corresponds to Period T31 in the refresh mode.

[Period T42]

In Period T42, the potential of the wiring PL is set to a low level (VL_PL) to turn off the transistor Tr21 to the transistor Tr23. Furthermore, the wiring WL[i] connected to the memory cell 411A[i,j] to which data is written is selected. Specifically, the potential of the wiring WL[i] is set to a high level (VH_WL) to turn on the transistor M11 included in the memory cell 411A[i,j]. This establishes electrical continuity between the wiring BILa[j] and the capacitor Cs through the transistor M11 in the memory cell 411A[i,j].

At this time, in the case where data "1" is already stored in the memory cell 411A[i,j], the release of charge from the capacitor Cs to the wiring BILa[j] increases the potential of the wiring BILa[j] from the potential Vpre by ΔV1. Note that Period T42 corresponds to Period T32 in the refresh mode.

[Period T43]

In Period T43, the potential of the wiring SP is set to a high level (VH_SP) and the potential of the wiring SN is set to a low level (VL_SN) to bring the amplifier circuit 333[j] into an operating state. Bringing the amplifier circuit 333[j] into an operating state makes the potential of the wiring BILa[j] closer to the potential of the wiring SP (VH_SP) from Vpre+ΔV1. In addition, the potential of the wiring BILb[j] gets closer to the potential of the wiring SN (VL_SN) from Vpre. Note that Period T43 corresponds to Period T33 in the refresh mode. Thus, the time required for Period T43 is "writing time" in the NV mode.

Here, the writing time in the NV mode is made longer than the writing time in the refresh mode so that the amount of charge corresponding to data is surely accumulated in the capacitor Cs. The writing time in the NV mode is preferably 1.5 times or more, further preferably twice or more, still further preferably 5 times or more the writing time in the refresh mode. The longer writing time can prevent insufficient writing.

[Period T44]

In Period T44, the potential of the wiring WL[i] is set to a low level (VL_WL) to turn off the transistor included in the memory cell 411A[i,j]. In the case where the threshold value of the transistor M11 is VthM (VthM>0 V), a potential lower than or equal to −VthM, preferably lower than or equal to −2×VthM, further preferably lower than or equal to −3×VthM is supplied to the wiring BGL regardless of the operating temperature. For example, in the case where VthM is 2 V, a potential lower than or equal to −2 V, preferably lower than or equal to −4 V, further preferably lower than or equal to −6 V is supplied to the wiring BGL regardless of the operating temperature. In this embodiment, −7 V is supplied to the wiring BGL in Period T44.

After Period T44, power supply to part or the whole of the peripheral circuit 311 and the cell array 401 is stopped.

When the writing time is longer than the writing time in the refresh mode and a potential lower than or equal to −VthM, preferably lower than or equal to −2×VthM, further preferably lower than or equal to −3×VthM is supplied to the wiring BGL, written data can be retained for longer than or equal to ten years in an environment at 85° C. even when power supply to the cell array 401 is stopped.

This embodiment can be implemented in an appropriate combination with the structures described in the other embodiments and the like.

Embodiment 4

In this embodiment, a structure example and an operation example of a memory device 300A and a memory device 300B each of which can retain multi-bit data (multilevel data) in one memory cell. The memory device 300A is a variation example of the above-described memory device 300. In order to avoid repeated description, points of the memory device 300A that are different from those of the memory device 300 are mainly described. For parts that are not described in this embodiment, the other embodiments or common general technical knowledge known to those skilled in art can be referred to. In this embodiment, the memory cell 411A of DRAM type is used as the memory cell 411.

<<Memory Device 300A>>

<Structure Example>

Figure 17:
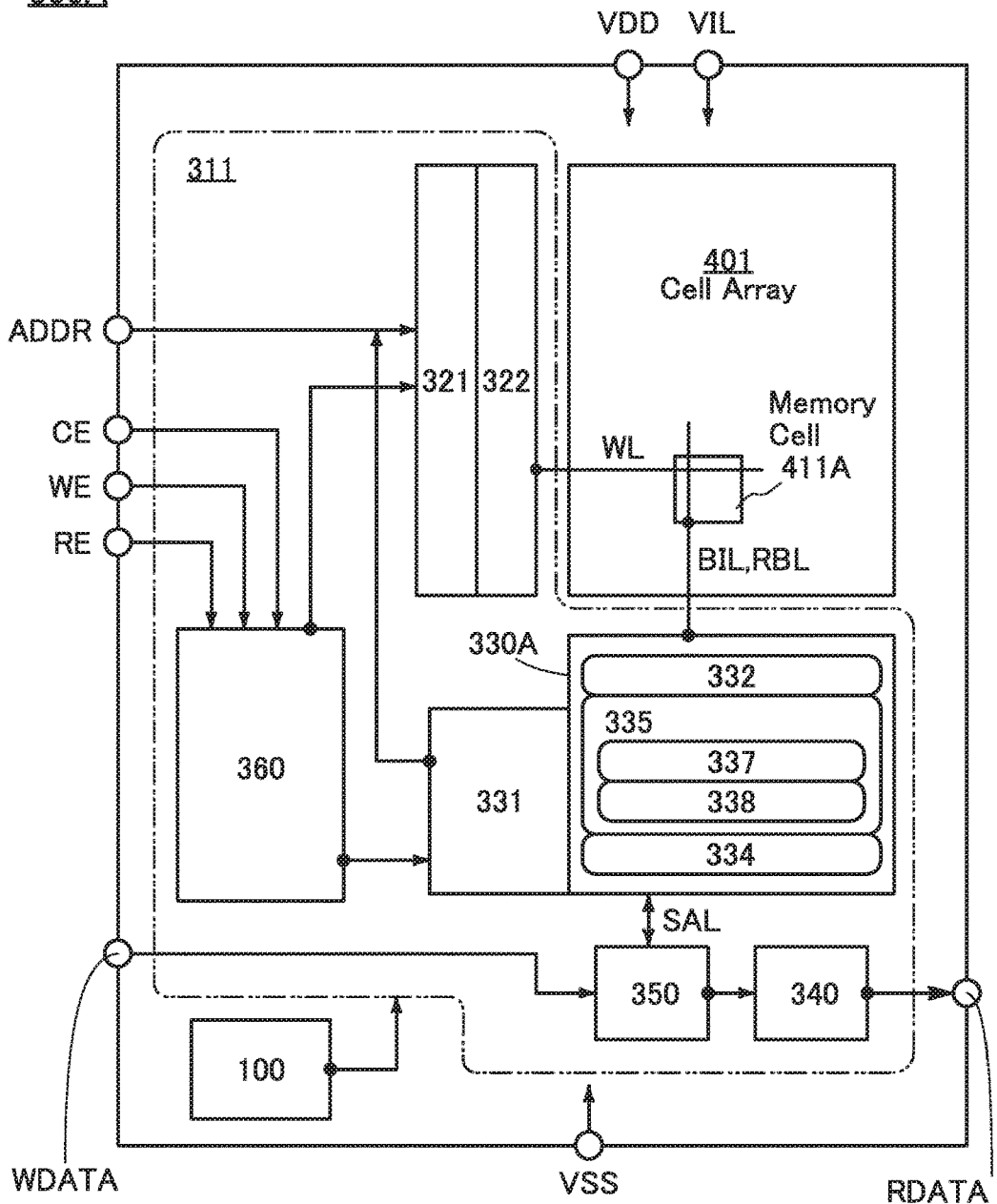
FIG. 17 A diagram illustrating a structure example of a memory device.

FIG. 17 shows a block diagram illustrating a structure example of the memory device 300A. The memory device 300A has a structure in which a global logic circuit 350 is added to the memory device 300 illustrated in FIG. 8. Furthermore, the memory device 300A includes a bit line driver circuit 330A. The bit line driver circuit 330A has a structure different from that of the bit line driver circuit 330 included in the memory device 300.

The global logic circuit 350 has a function of retaining the data signal WDATA input from the outside. The global logic circuit 350 has a function of supplying the data signal WDATA to the bit line driver circuit 330A through the wiring SAL.

Information stored in the memory cell 411A is read by the bit line driver circuit 330A and supplied to the global logic circuit 350. The global logic circuit 350 has a function of retaining the information. The global logic circuit 350 has a function of supplying the information to the output circuit 340. The output circuit 340 has a function of outputting the information to the outside as the digital data signal RDATA.

The bit line driver circuit 330A included in the memory device 300A includes the precharge circuit 332, the input/output circuit 334, and a signal converter circuit 335. The signal converter circuit 335 includes a DAC (Digital to Analog Converter) 337 and an ADC (Analog to Digital Converter) 338.

Figure 18:
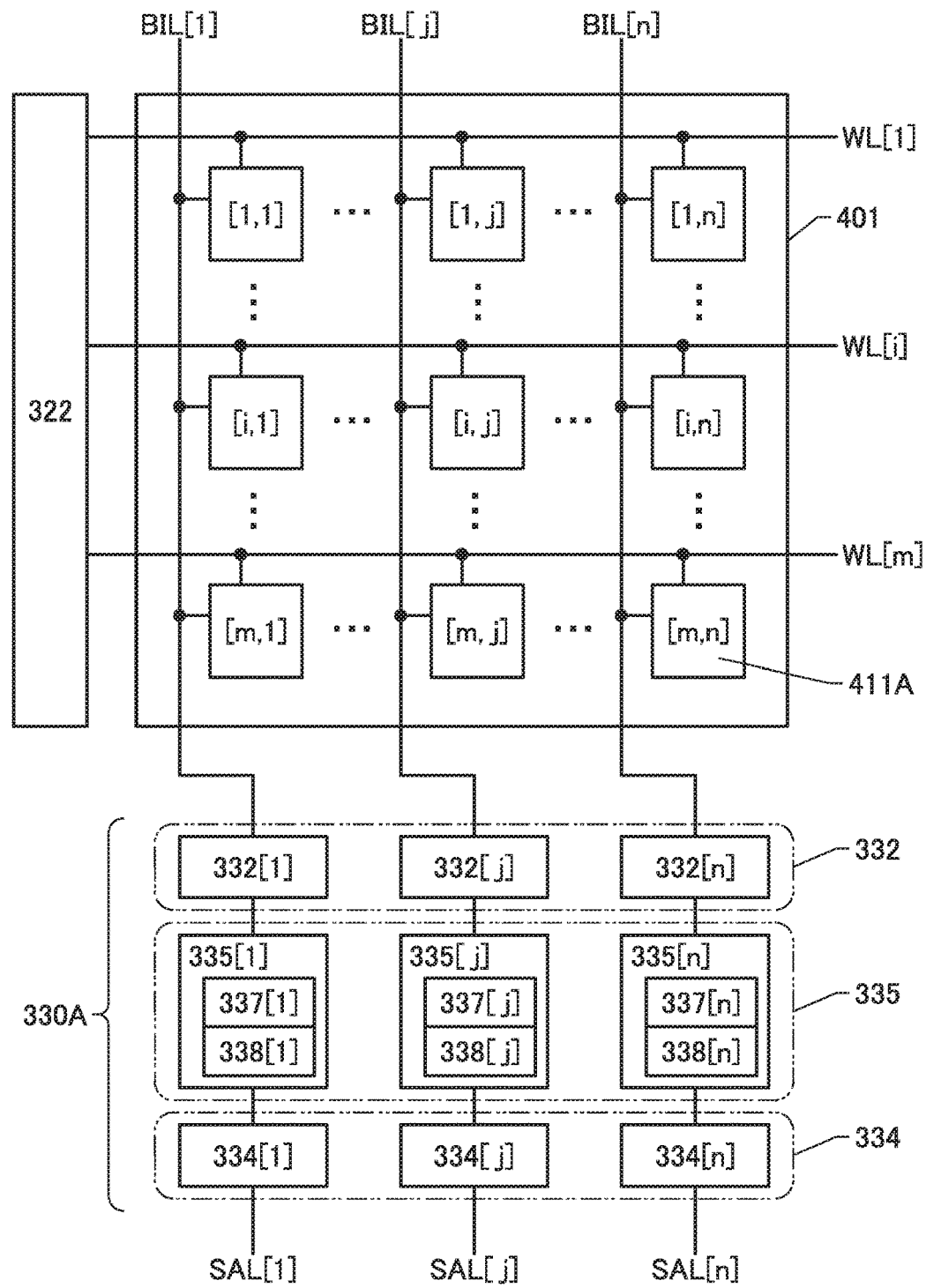
FIG. 18 A diagram illustrating a configuration example of a memory cell array and a bit line driver circuit.

FIG. 18 shows a configuration example of the cell array 401 and the bit line driver circuit 330A of the memory device 300A. The cell array 401 illustrated in FIG. 18 includes a total of m×n memory cells 411A of m cells in one column and n cells in one row, and the memory cells 411A are arranged in a matrix.

The cell array 401 illustrated in FIG. 18 includes m wirings WL electrically connected to the word line driver circuit 322. The wiring WL[1] is electrically connected to the memory cells 411A in the first row. Similarly, the wiring WL[i] is electrically connected to the memory cells 411A in the i-th row.

The cell array 401 illustrated in FIG. 18 includes n wirings BIL electrically connected to the bit line driver circuit 330A. A wiring BIL[1] is electrically connected to the memory cells 411A in the first column. Similarly, a wiring BIL[j] is electrically connected to the memory cells 411A in the j-th column.

The wiring BIL is electrically connected to the precharge circuit 332, the signal converter circuit 335 (the DAC 337 and the ADC 338), and the input/output circuit 334, which are provided in every column. As in FIG. 11 and the like, the precharge circuit 332 in the first column is referred to as the precharge circuit 332[1], and the precharge circuit 332 in the j-th column is referred to as the precharge circuit 332[j] also in FIG. 18. The same manner of reference applies to the signal converter circuit 335, the input/output circuit 334, and the like.

The input/output circuit 334 included in the memory device 300A has a function of determining the operation of the signal converter circuit 335. The input/output circuit 334 has a function of switching reading data stored in the memory cell 411A and writing data to be stored in the memory cell 411A in accordance with the operation mode. The input/output circuit 334 is electrically connected to the global logic circuit 350 through the wiring SAL.

Note that the operation of the precharge circuit 332, the signal converter circuit 335, the input/output circuit 334, and the like can be controlled by the control logic circuit 360 (see FIG. 17).

Figure 19:
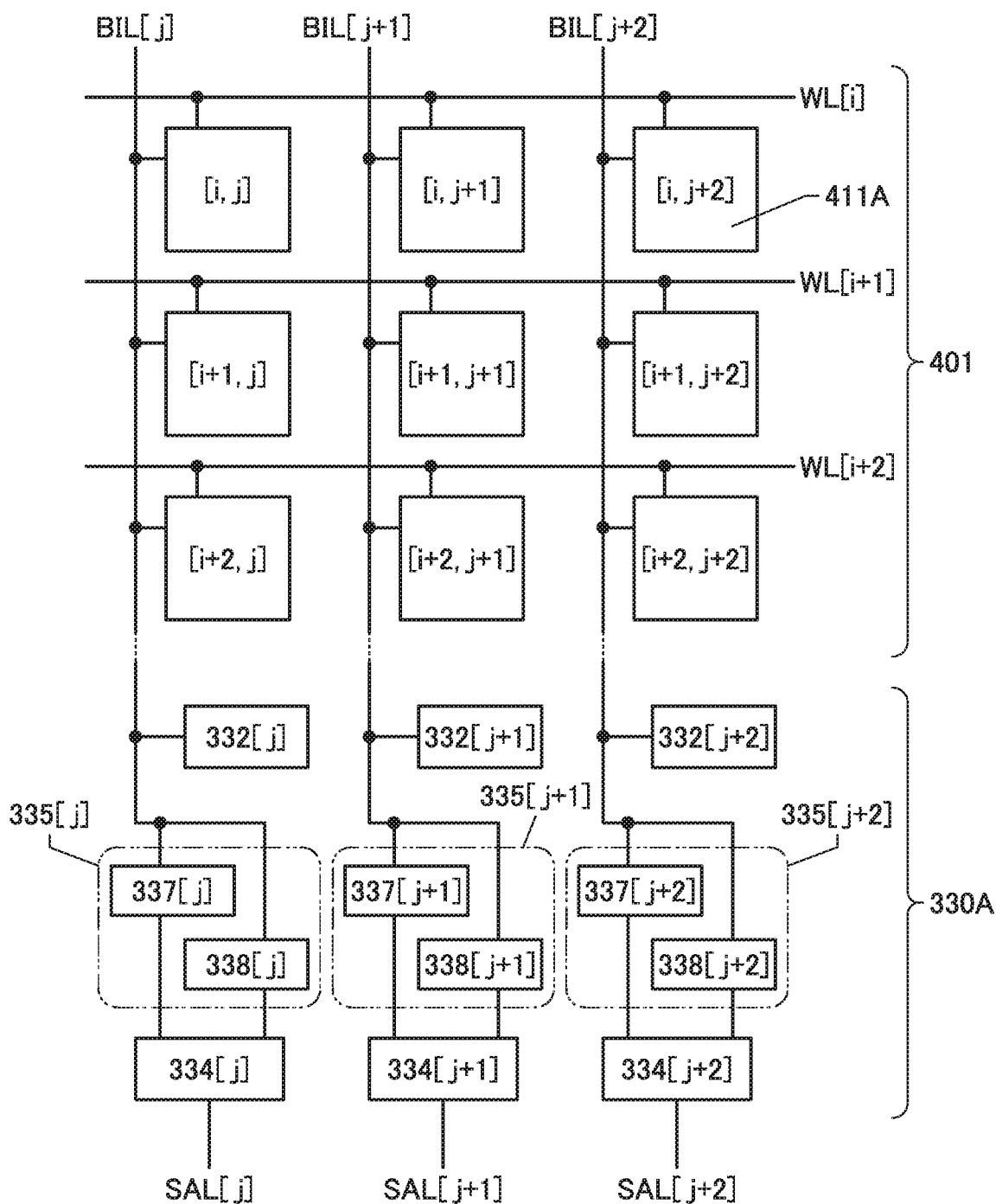
FIG. 19 A diagram illustrating a configuration example of a memory cell array and a bit line driver circuit.

FIG. 19 illustrates a more detailed configuration example of the cell array 401 and the bit line driver circuit 330A. FIG. 19 illustrates nine memory cells 411A in the i-th row and the j-th column to the i+2-th row and the j+2-th column, and part of the bit line driver circuits 330A respectively corresponding to the j-th column to the j+2-th column.

The precharge circuit 332[*j*] is electrically connected to the wiring BIL[j]. The precharge circuit 332[*j*] has a function of precharging the wiring BIL[j]. The input/output circuit 334[*j*] has a function of determining the operation of a DAC 337[*j*] and an ADC 338[*j*] in accordance with the operation mode. Specifically, in the writing mode operation, the DAC 337[*j*] is operated and the ADC 338[*j*] is stopped.

An input terminal of the DAC 337[*j*] is electrically connected to the input/output circuit 334[*j*], and an output terminal is electrically connected to the wiring BIL[j]. An input terminal of the ADC 338[*j*] is electrically connected to the wiring BIL[/], and an output terminal is electrically connected to the input/output circuit 334[*j*].

Note that an amplifier circuit may be provided between the wiring BIL[j] and the ADC 338 [j].

The DAC 337[*j*] has a function of converting k-bit (k is an integer of 2 or more) digital data supplied from the input/output circuit 334 into multilevel data (analog data). The ADC 338[*j*] has a function of converting multilevel data (analog data) stored in the memory cell 411A[i,j] into k-bit digital data.

<Operation Example>

Next, an operation mode of the memory device 300A is described. The memory device 300A operates at 20° C. Thus, −3 V is supplied from the semiconductor device 100 to the wiring BGL.

[Reading Mode]

Next, an operation example of the bit line driver circuit 330A when data is read from the memory cell 411A[i,j] is described with reference to a timing chart shown in FIG. 20. In addition, the amount of charge corresponding to data "1010" in 4-bit (16-level) digital data is retained in the capacitor Cs of the memory cell 411A[i,j].

[Period T51]

In Period T51, the precharge circuit 332[*j*] is operated, and the potential of the wiring BIL[j] is initialized. Specifically, a potential Vpre is supplied to the wiring BIL[j]. Note that in this embodiment, the potential Vpre is an average potential of the highest potential output from the DAC 337[*j*] (VH_DA) and the lowest potential output from the DAC 337[*j*] (VL_DA). That is, the potential Vpre= (VH_DA+VL_DA)/2.

In Period T51, the potential of the wiring WL[i] is at a low level (VL_WL), and the transistor M11 is in an off state. In addition, the DAC 337[*j*], the ADC 338[*j*], and the input/output circuit 334[*j*] are in a halting state. Although not illustrated in FIG. 20, the potentials of the wirings WL other than the wiring WL[i] are also at VL_WL.

[Period T52]

In Period T52, the precharge circuit 332[*j*] is stopped and the wiring WL[i] is selected. Specifically, the potential of the wiring WL[i] is set to a high level (VH_WL) to turn on the transistor M11 included in the memory cell 411A[i,j]. This establishes electrical continuity between the wiring BIL[j] and the capacitor Cs through the transistor M11 in the memory cell 411A[i,j], and the potential of the wiring BIL[j] changes in accordance with the amount of charge retained in the capacitor Cs.

Figure 20:
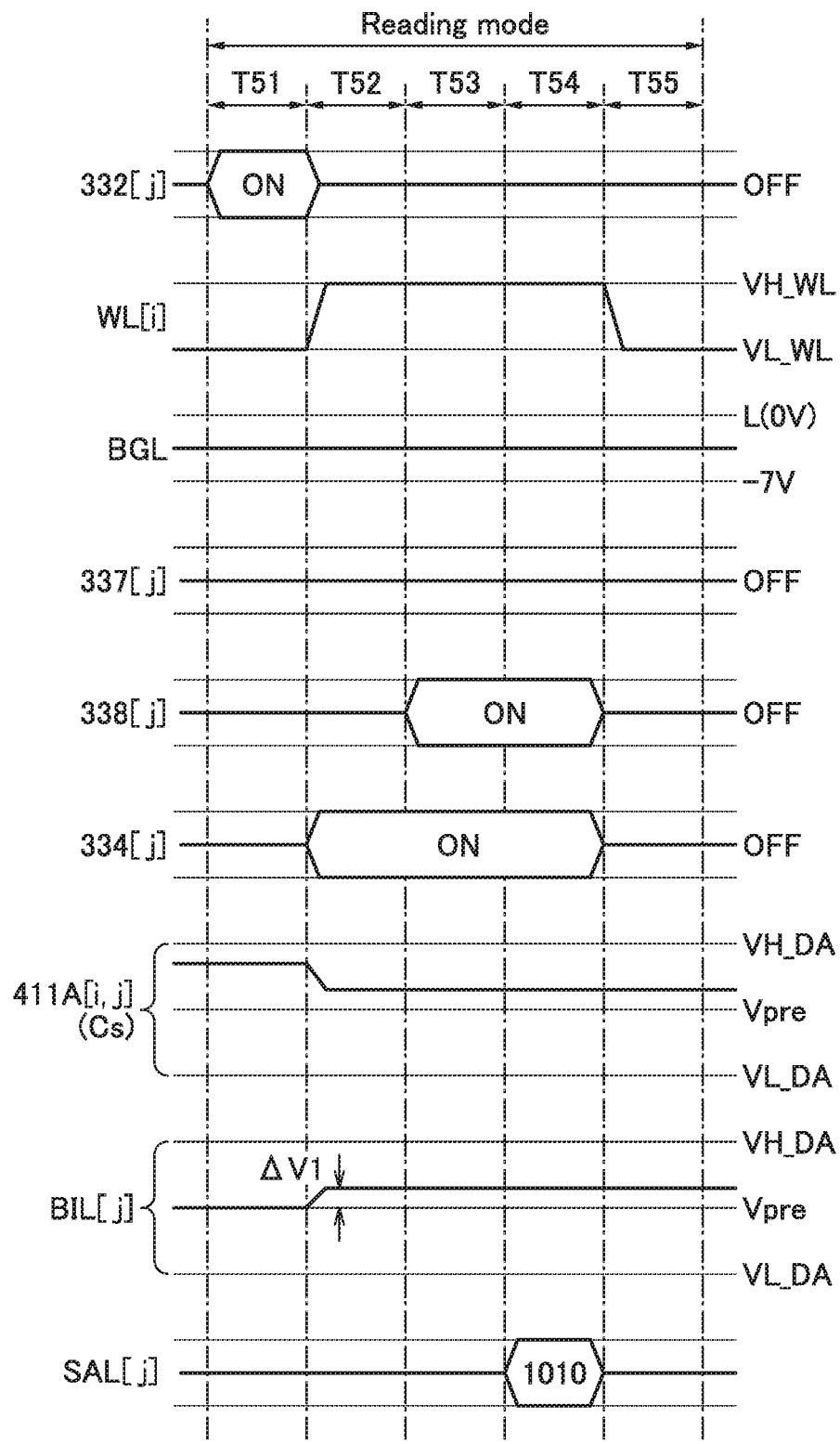
FIG. 20 A timing chart showing an operation example of a memory device.

In FIG. 20, the amount of charge corresponding to the data "1010" is retained in the capacitor Cs of the memory cell 411A[i,j]. The release of charge from the capacitor Cs to the wiring BIL[j] increases the potential of the wiring BIL[j] from the potential Vpre by ΔV1. Depending on the amount of charge retained in the capacitor Cs, the potential of the wiring BIL[j] decreases in some cases. When the transistor M11 is turned on, the potential of the capacitor Cs of the memory cell 411A[i,j] and the potential of the wiring BIL[j] become the same. Moreover, the operation of the input/output circuit 334[*j*] is started.

[Period T53]

In Period T53, the operation of the ADC 338[*j*] is started. Moreover, in Period T53, the potential of the wiring WL[i] may be set to VL_WL.

[Period T54]

In Period T54, the ADC 338[*j*] converts the potential of the wiring BIL[j] into digital data and outputs the digital data to a wiring SAL[j].

[Period T55]

The wiring WL[i] is unselected in Period T55. Specifically, the potential of the wiring WL[i] is set to a low level (VL_WL). In addition, the operation of the ADC 338[*j*] and the input/output circuit 334[*j*] is stopped.

Through the operations described above, data can be read from the memory cell 411A[i,j]. The read data is supplied to the global logic circuit 350 through the wiring SAL[j]. As described above, the global logic circuit 350 has a function of retaining the data and supplying the data to the output circuit 340. The data is output as the data signal RDATA to the outside through the output circuit 340.

The amount of charge retained in the memory cell 411A [i,j] changes in the reading mode operation. In other words, information stored in the memory cell 411A[i,j] is broken.

In order to restore the broken information, after the reading mode operation, the memory device 300A is operated in a writing mode described later. Specifically, the data of the memory cell 411A[i,j] that is retained in the global logic circuit 350 in the reading mode operation is written to the memory cell 411A[i,j] again.

[Writing Mode]

Figure 21:
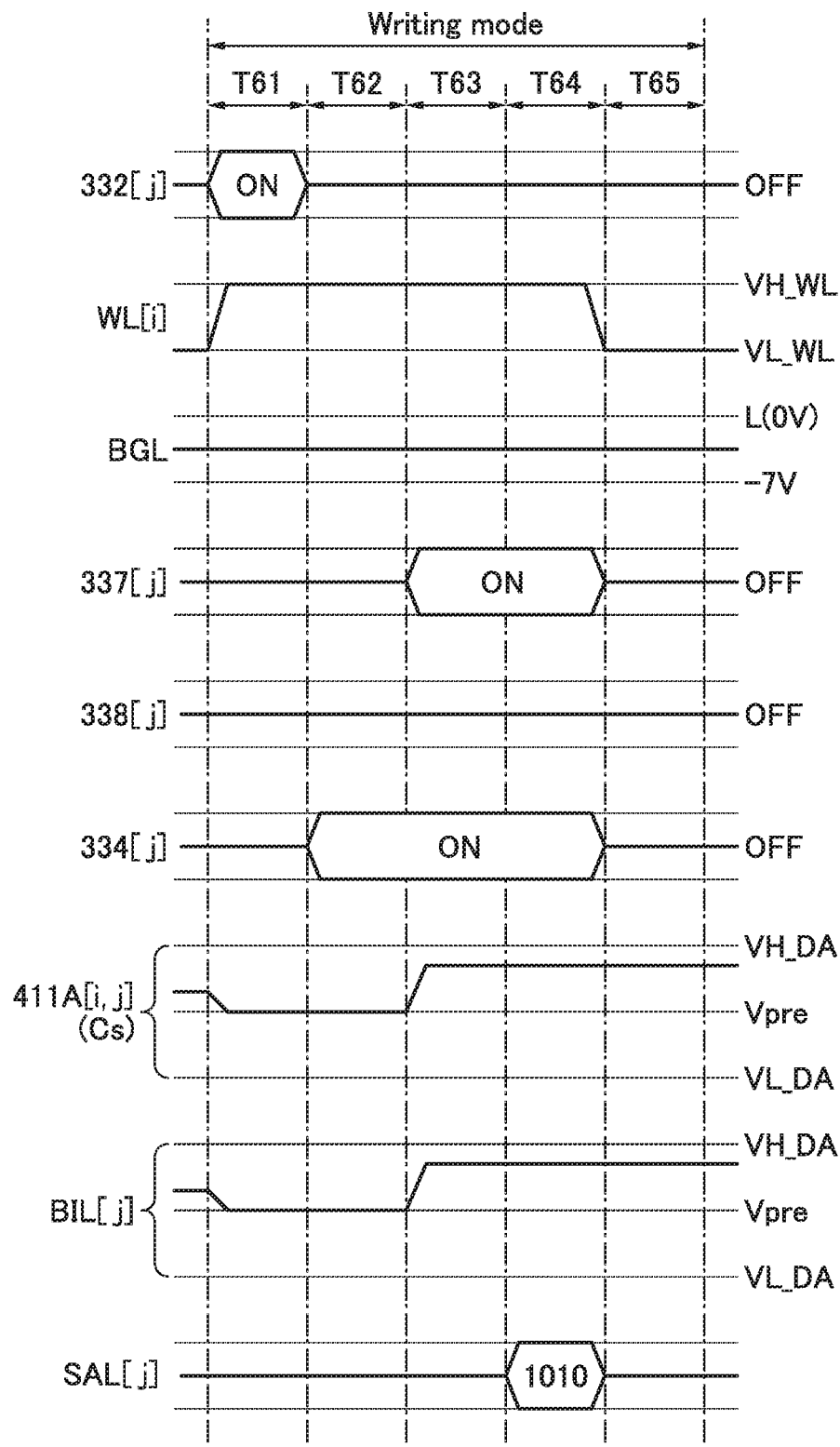
FIG. 21 A timing chart showing an operation example of a memory device.

Next, an operation example of the bit line driver circuit 330A when data is written to the memory cell 411A[i,j] is described with reference to a timing chart shown in FIG. 21. In this embodiment, the amount of charge corresponding to the data "1010" in 4-bit (16-level) digital data is written to the capacitor Cs of the memory cell 411A[i,j].

[Period T61]

In Period T61, the precharge circuit 332[*j*] is operated, and the potential of the wiring BIL[j] is initialized. Specifically, a potential Vpre is supplied to the wiring BIL[j]. In addition, the wiring WL[i] is selected to turn on the transistor M11. Thus, the potential of the capacitor Cs of the memory cell 411A[i,j] also becomes the potential Vpre.

In Period T61, the DAC 337[*j*], the ADC 338[*j*], and the input/output circuit 334[*j*] are in a halting state.

[Period T62]

In Period T62, the operation of the input/output circuit 334[j] is started.

[Period T63]

In Period T63, the operation of the DAC 337[j] is started.

[Period T64]

In Period T64, the data signal WDATA input from the outside is supplied to the wiring SAL[j] through the global logic circuit 350. In this embodiment, the data "1010" is supplied to the wiring SAL[j] as the data signal WDATA.

The data "1010" supplied to the wiring SAL[j] is converted into a potential corresponding to the data "1010" by the DAC 337[j] and then supplied to the wiring BIL[j]. At this time, the transistor M11 is in an on state, so that the amount of charge with which the potential becomes the same as that of the wiring BIL[j] is supplied to the capacitor Cs of the memory cell 411A[i,j].

[Period T65]

In Period T65, the wiring WL[i] is brought into a non-selected state to turn off the transistor M11, whereby the amount of charge corresponding to the data "1010" is retained in the memory cell 411A[i,j]. In addition, the operation of the ADC 338[j] and the input/output circuit 334[j] is stopped.

Through the operations described above, data can be written to the memory cell 411A[i,j]. In this embodiment, the time required for Period T64 is "writing time".

[Refresh Mode]

In order to maintain data written to the memory cell 411A[i,j] refresh operation (rewriting operation) is performed at regular intervals. Specifically, first, the memory device 300A is operated in the reading mode, and the data retained in the memory cell 411A[i,j] is retained in the global logic circuit 350. Then, the memory device 300A is operated in the writing mode and the data retained in the global logic circuit 350 is written to the memory cell 411A[i,j] again. Also in the refresh mode, the time required for Period T64 is "writing time".

In the refresh mode, the data signal WDATA is not input to the global logic circuit 350 and is not output from the global logic circuit 350 to the output circuit 340.

[NV Mode]

An NV mode is performed after the reading mode is executed. Before the execution of the NV mode, the memory device 300A is operated in the reading mode as pretreatment, and the data retained in the memory cell 411A[i,j] is retained in the global logic circuit 350. In the reading mode executed as the pretreatment of the NV mode, the data signal WDATA is not necessarily input to the global logic circuit 350 and is not necessarily output from the global logic circuit 350 to the output circuit 340 as in the execution of the refresh mode.

Figure 22:
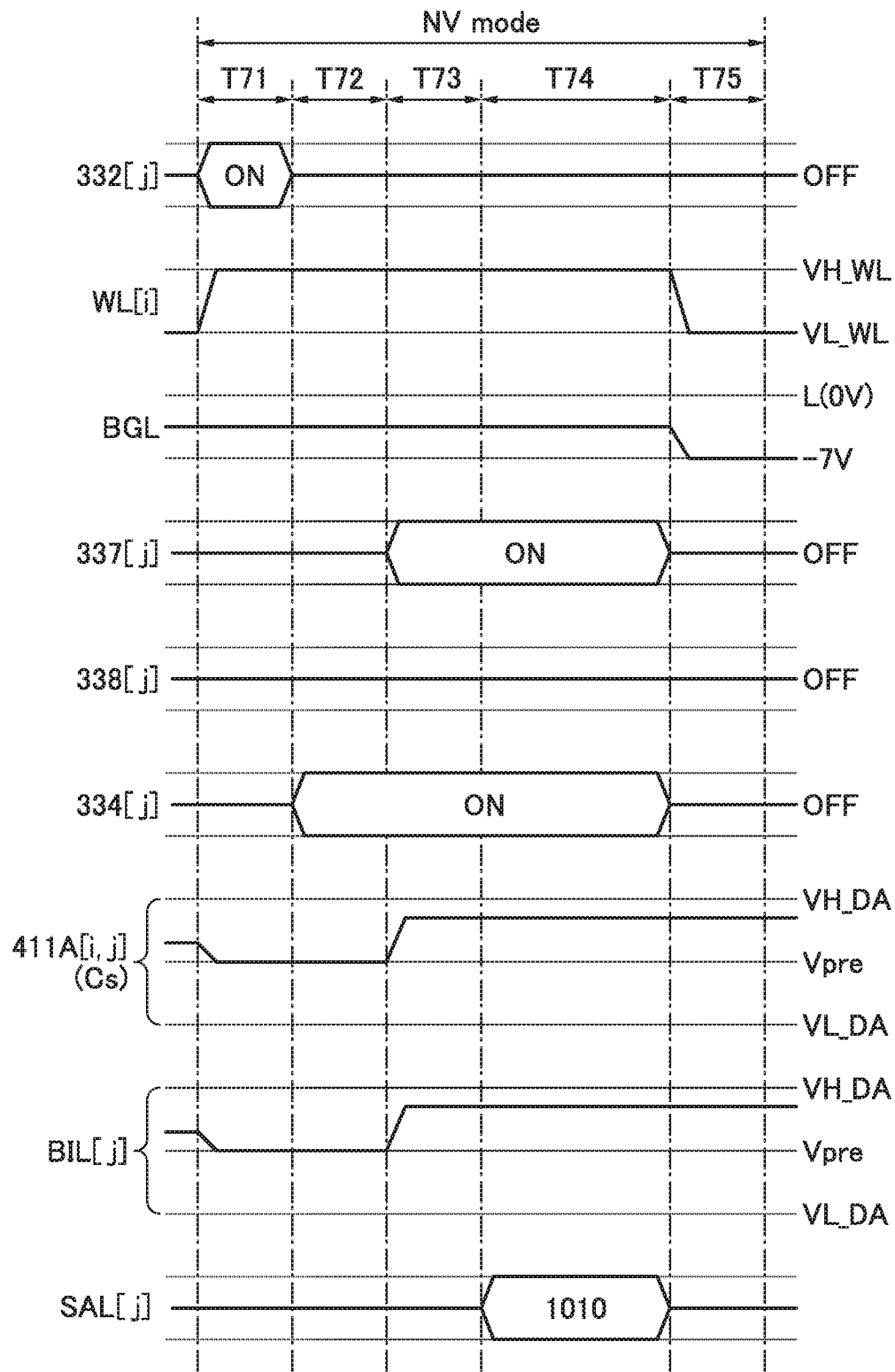
FIG. 22 A timing chart showing an operation example of a memory device.

An NV mode operation example of the memory device 300A is described with reference to a timing chart shown in FIG. 22. The NV mode is an operation mode substantially the same as the writing mode. In FIG. 22, the NV mode is denoted by Period T71 to Period T75. In addition, Period T71 to Period T74 correspond to Period T61 to Period T64 in the writing mode. Therefore, the description of Period T71 to Period T74 is omitted.

The writing time in the NV mode is made longer than the writing time in the refresh mode so that the amount of charge corresponding to data is surely accumulated in the capacitor Cs. The time required for Period T74 is "writing time" in the NV mode. The writing time in the NV mode is preferably 1.5 times or more, further preferably twice or more, still further preferably 5 times or more the writing time in the refresh mode. The longer writing time can prevent insufficient writing.

[Period T75]

In Period T75, the potential of the wiring WL[i] is set to a low level (VL_WL) to turn off the transistor included in the memory cell 411A[i,j]. By turning off the transistor M11, the amount of charge corresponding to the data "1010" is retained in the memory cell 411A[i,j].

In the case where the threshold value of the transistor M11 is VthM (VthM>0 V), a potential lower than or equal to −VthM, preferably lower than or equal to −2×VthM, further preferably lower than or equal to −3×VthM is supplied to the wiring BGL regardless of the operating temperature. For example, in the case where VthM is 2 V, a potential lower than or equal to −2 V, preferably lower than or equal to −4 V, further preferably lower than or equal to −6 V is supplied to the wiring BGL regardless of the operating temperature. In this embodiment, −7 V is supplied to the wiring BGL in Period T75. In addition, the operation of the ADC 338[j] and the input/output circuit 334[j] is stopped.

After Period T75, power supply to part or the whole of the peripheral circuit 311 and the cell array 401 is stopped.

When the writing time in the NV mode is longer than the writing time in the refresh mode and a potential lower than or equal to −VthM, preferably lower than or equal to −2×VthM, further preferably lower than or equal to −3×VthM is supplied to the wiring BGL, written data can be retained for longer than or equal to ten years in an environment at 85° C. even when power supply to the cell array 401 is stopped.

The precharge circuit 332, the signal converter circuit 335 (the DAC 337 and the ADC 338), and the input/output circuit 334 are provided in every column of a plurality of memory cells 411A included in the cell array 401, and thus data reading and writing can be performed at high speed.

This embodiment can be implemented in an appropriate combination with the structures described in the other embodiments and the like.

Embodiment 5

As the number of bits of the data signal WDATA increases, the area occupied by the bit line driver circuit 330 increases exponentially. In particular, the area occupied by the signal converter circuit 335 increases. Thus, when the precharge circuit 332, the signal converter circuit 335, and the input/output circuit 334 are provided for every memory cell column, the size of the memory device 300 itself increases.

In this embodiment, the memory device 300B having a structure in which the area occupied by the bit line driver circuit 330 is unlikely to increase even when the number of bits of the data signal WDATA increases is described. Note that the memory device 300B is a variation example of the memory device 300A. The structure example shown in the memory device 300B is particularly effective when the data signal WDATA is digital data of three or more bits.

<<Memory Device 300B>>

<Configuration Example>

Figure 23:
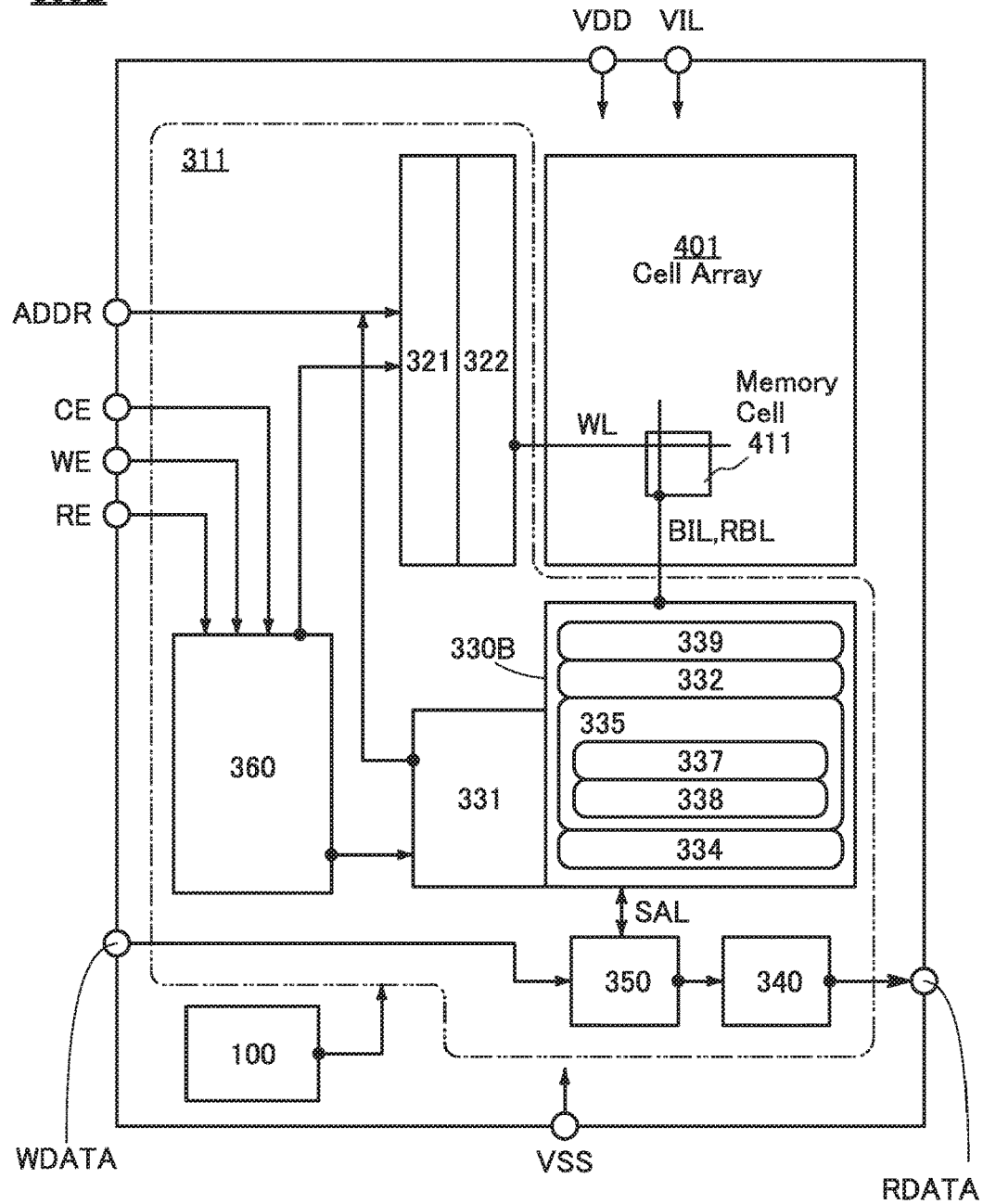
FIG. 23 A diagram illustrating a structure example of a memory device.

FIG. 23 shows a block diagram illustrating a configuration example of the memory device 300B. The memory device 300B includes a bit line driver circuit 330B instead of the bit line driver circuit 330A. The bit line driver circuit 330B includes a column switching circuit 339 between the cell array 401 and the precharge circuit 332.

Figure 24:
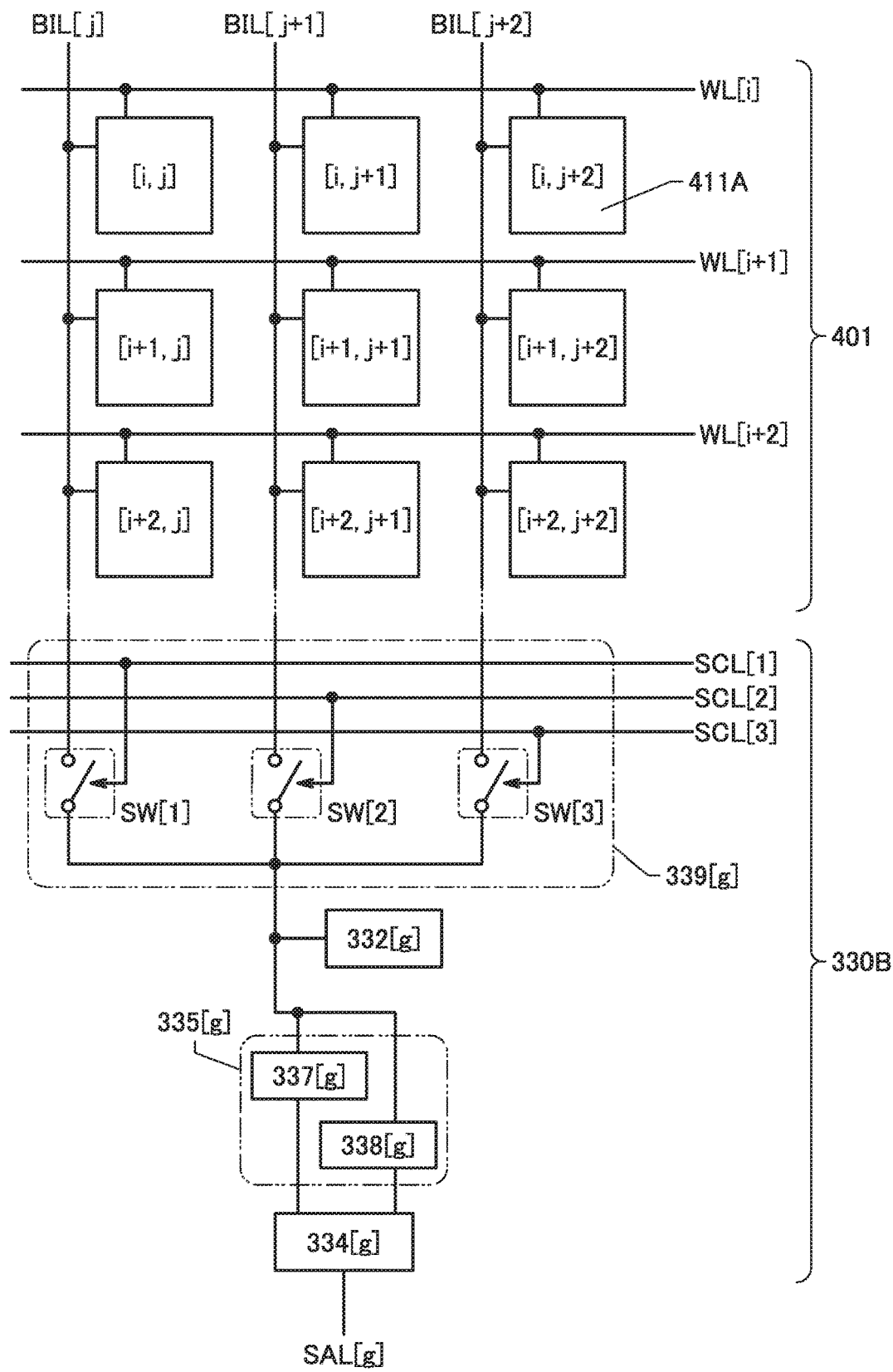
FIG. 24 A diagram illustrating a configuration example of a memory cell array and a bit line driver circuit.

FIG. 24 shows a configuration example of part of the cell array 401 and the bit line driver circuit 330B. FIG. 24 illustrates three columns including the memory cells 411A in the i-th row and the j-th column to the i+2-th row and the j+2-th column. Moreover, in the configuration shown in FIG. 24, the column switching circuit 339, the precharge circuit 332, the signal converter circuit 335, and the input/output circuit 334 are provided for every three columns.

In FIG. 24, the g-th column switching circuit 339 is referred to as a column switching circuit 339[g] (g is an integer of 1 or more). The same manner of reference applies to the precharge circuit 332, the signal converter circuit 335, the input/output circuit 334, and the like. In the case where the column switching circuit 339, the precharge circuit 332, the signal converter circuit 335, and the input/output circuit 334 are provided for every f columns is an integer of 2 or more), g can be represented by n/f. Therefore, n is preferably a multiple of f.

The column switching circuit 339 includes f switches SW. Moreover, the column switching circuit 339 is electrically connected to f wirings SCL. FIG. 24 shows the case where f is 3. Accordingly, the column switching circuit 339 illustrated in FIG. 24 includes a switch SW[1] to a switch SW[3] and is electrically connected to a wiring SCL[1] to a wiring SCL[3].

The wiring SCL[1] is electrically connected to the switch SW[1] and has a function of controlling the on state and the off state of the switch SW[1]. The wiring SCL [2] is electrically connected to the switch SW[2] and has a function of controlling the on state and the off state of the switch SW[2]. The wiring SCL[3] is electrically connected to the switch SW[3] and has a function of controlling the on state and the off state of the switch SW[3].

An amplifier circuit may be provided between the circuit 339[g] and an ADC 338[g]. An amplifier circuit may be provided between the wiring BIL[j] and the switch SW[1]. An amplifier circuit may be provided between a wiring BIL[j+1] and the switch SW[2]. An amplifier circuit may be provided between a wiring BIL[j+2] and the switch SW[3].

<Operation Example>

Next, an operation mode of the memory device 300B is described. The memory device 300B operates at 20° C. Thus, −3 V is supplied from the semiconductor device 100 to the wiring BGL.

[Reading Mode]

Figure 25:
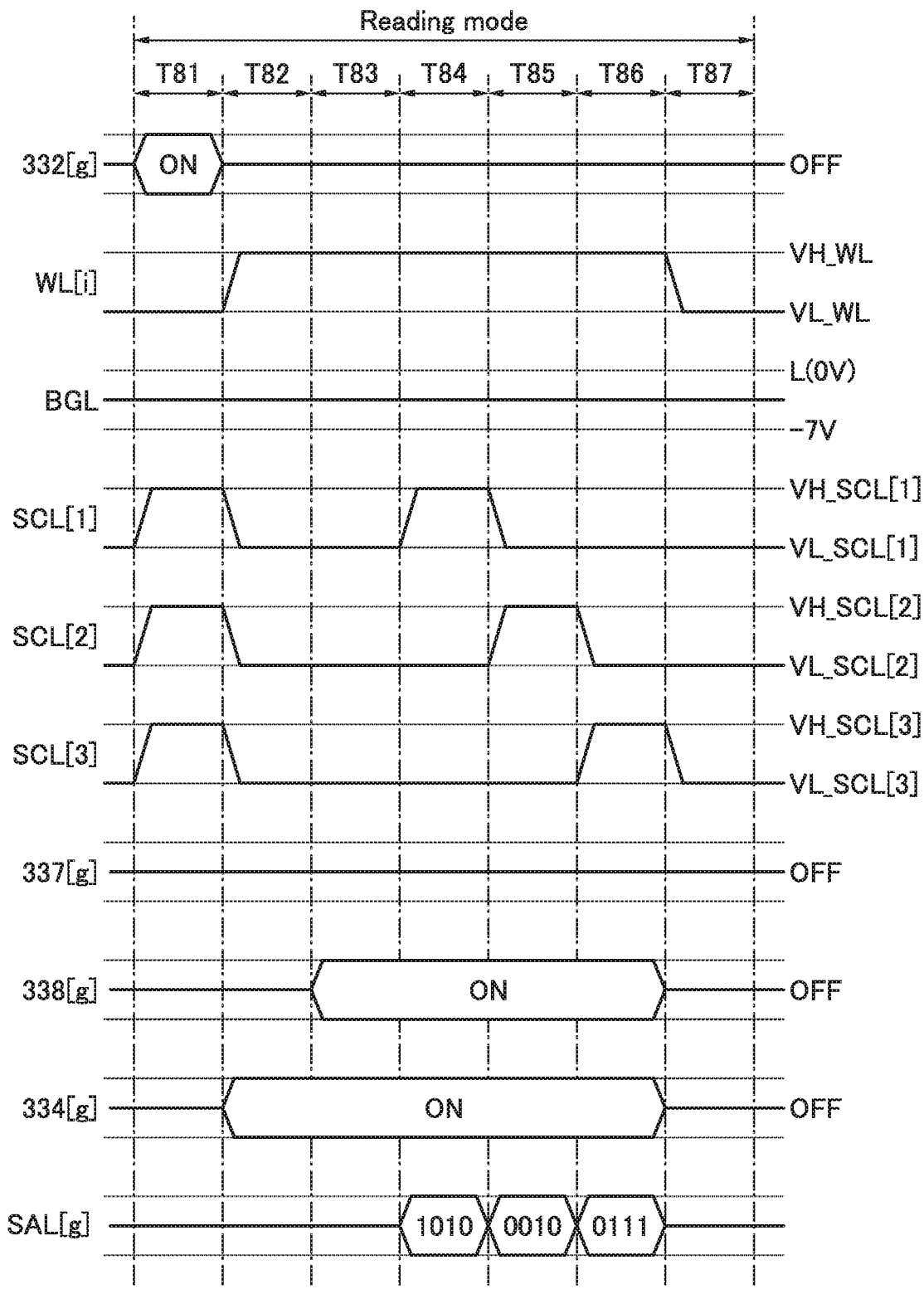
FIG. 25 A timing chart showing an operation example of a memory device.

Next, an operation example of the bit line driver circuit 330B when data is read from the memory cell 411A[i,f] to the memory cell 411A[i,j+2] is described with reference to a timing chart shown in FIG. 25. In addition, the amount of charge corresponding to data "1010" in 4-bit (16-level) digital data is retained in the capacitor Cs of the memory cell 411A[i,j]. In addition, the amount of charge corresponding to data "0010" in 4-bit (16-level) digital data is retained in the capacitor Cs of the memory cell 411A[i+1,j]. In addition, the amount of charge corresponding to data "0111" in 4-bit (16-level) digital data is retained in the capacitor Cs of the memory cell 411A[i+2,j].

[Period T81]

In Period T81, a precharge circuit 332[g] is operated. In addition, a high-level potential (VH_SCL) is supplied to each of the wiring SCL[1] to the wiring SCL[3] to turn on the switch SW[1] to the switch SW[3]. Thus, the potentials of the wiring BIL[j] to the wiring BIL[j+2] (not illustrated in FIG. 25) are initialized. Specifically, a potential Vpre is supplied to the wiring BIL[j] to the wiring BIL[j+2].

In Period T81, the potential of the wiring WL[i] is at a low level (VL_WL), and the transistor M11 is in an off state. In addition, the DAC 337[g], the ADC 338[g], and the input/output circuit 334[g] are in a halting state.

[Period T82]

In Period T82, the precharge circuit 332[g] is stopped. In addition, a low-level potential (VL_SCL) is supplied to each of the wiring SCL[1] to the wiring SCL[3] to turn off the switch SW[1] to the switch SW[3]. The wiring WL[i] is selected. Specifically, the potential of the wiring WL[i] is set to a high level (VH_WL) to turn on the transistor M11 included in the memory cell 411A[i,j].

This establishes electrical continuity between the wiring BIL[j] and the capacitor Cs through the transistor M11 in the memory cell 411A[i,j], and the potential of the wiring BIL[j] changes in accordance with the amount of charge retained in the capacitor Cs. The memory cell 411A[i+1,j] and the memory cell 411A[i+2,f] similarly operate, whereby the potentials of the wiring BIL[j+1] and the wiring BIL[j+2] change.

Moreover, the operation of the input/output circuit 334[g] is started.

[Period T83]

In Period T83, the operation of the ADC 338[g] is started. Moreover, in Period T83, the potential of the wiring WL[i] may be set to VL_WL.

[Period T84]

In Period T84, the potential of the wiring SCL[1] is set to a high level (VH_SCL[1]), and the wiring BIL[j] and the ADC 338[g] are electrically connected to each other. The ADC 338[g] converts the potential of the wiring BIL[j] into digital data and outputs the digital data to the wiring SAL[g].

[Period T85]

In Period T85, the potential of the wiring SCL[1] is set to a low level (VL_SCL[1]). The potential of the wiring SCL[2] is set to a high level (VH_SCL[2]), and the wiring BIL[j+1] and the ADC 338[g] are electrically connected to each other. The ADC 338[g] converts the potential of the wiring BIL[j+1] into digital data and outputs the digital data to the wiring SAL[g].

[Period T86]

In Period T86, the potential of the wiring SCL[2] is set to a low level (VL_SCL[2]). The potential of the wiring SCL[3] is set to a high level (VH_SCL[3]), and the wiring BIL[j+2] and the ADC 338[g] are electrically connected to each other. The ADC 338[g] converts the potential of the wiring BIL[j+2] into digital data and outputs the digital data to the wiring SAL[g].

[Period T87]

The wiring WL[i] is unselected in Period T87. Specifically, the potential of the wiring WL[i] is set to a low level (VL_WL). The potential of the wiring SCL[3] is set to a low level (VL_SCL[3]). In addition, the operation of the ADC 338[g] and the input/output circuit 334[g] is stopped.

Through the operations described above, data retained in the memory cell 411A[i,j] to the memory cell 411A[i+2,j] can be read sequentially. The read data is supplied to the global logic circuit 350 through the wiring SAL[g]. The data is output as the data signal RDATA to the outside through the output circuit 340.

As the switch SW included in the column switching circuit 339, a switching element such as a transistor is used. In addition, in the memory device 300B, data retained in the memory cell 411A[i,j] to the memory cell 411A[i+2,j] are read sequentially. Thus, a transistor having an extremely low off-state current, such as an OS transistor, is preferably used as the switch SW (the switch SW[1] to the switch SW[3]) included in the column switching circuit 339.

The amount of charge retained in the memory cell 411A[i,j] to the memory cell 411A[i+2,j] changes in the reading mode operation. In other words, information stored in the memory cell 411A[i,j] to the memory cell 411A[i+2,j] is broken.

In order to restore the broken information, after the reading mode operation, the memory device 300B is operated in a writing mode described later. Specifically, data of the memory cell 411B[i,j] to the memory cell 411A[i+2,j] that is retained in the global logic circuit 350 in the reading mode operation is written to the memory cell 411A[i,j] to the memory cell 411A[i+2,j] again.

[Writing Mode]

Figure 26:
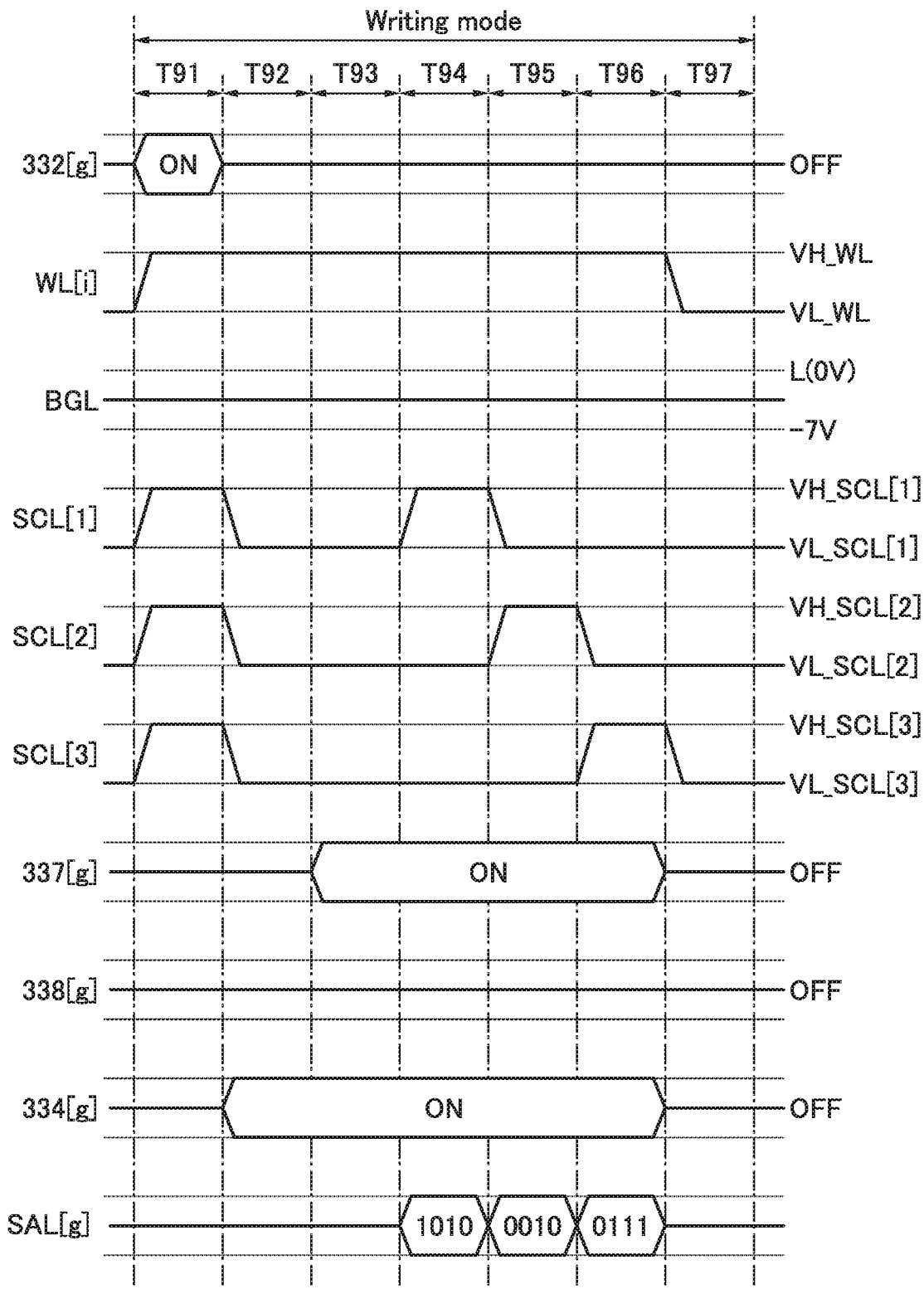
FIG. 26 A timing chart showing an operation example of a memory device.

Next, an operation example of the bit line driver circuit 330B when data is written to the memory cell 411A[i,j] is described with reference to a timing chart shown in FIG. 26. In this embodiment, the amount of charge corresponding to the data "1010" in 4-bit (16-level) digital data is written to the capacitor Cs of the memory cell 411A[i,j]. In addition, the amount of charge corresponding to the data "0010" in 4-bit (16-level) digital data is written to the capacitor Cs of the memory cell 411A[i,j+1]. In addition, the amount of charge corresponding to the data "0111" in 4-bit (16-level) digital data is written to the capacitor Cs of the memory cell 411A[i,j+2].

[Period T91]

In Period T91, the precharge circuit 332[g] is operated. In addition, a high-level potential (VH_SCL) is supplied to each of the wiring SCL[1] to the wiring SCL[3] to turn on the switch SW[1] to the switch SW[3]. Thus, the potentials of the wiring BIL[j] to the wiring BIL[j+2] (not illustrated in FIG. 26) are initialized. In addition, the wiring WL[i] is selected to turn on the transistor M11. Then, the potentials of the capacitors Cs of the memory cell 411A[i,j] to the memory cell 411A[i,j+2] are also initialized.

In Period T91, the DAC 337[g], the ADC 338[g], and the input/output circuit 334[g] are in a halting state.

[Period T92]

In Period T92, the operation of the input/output circuit 334[g] is started.

[Period T93]

In Period T93, the operation of the DAC 337[g] is started.

[Period T94]

In Period T94, the potential of the wiring SCL[1] is set to a high level (VH_SCL[1]), and the wiring BIL[j] and the DAC 337[g] are electrically connected to each other. In addition, the data signal WDATA input from the outside is supplied to the wiring SAL[g] through the global logic circuit 350. Here, the data "1010" is supplied to the wiring SAL[j] as the data signal WDATA.

The data "1010" supplied to the wiring SAL[j] is converted into a potential corresponding to the data "1010" by the DAC 337[g] and then supplied to the wiring BIL[j]. At this time, the transistor M11 is in an on state, so that the amount of charge with which the potential becomes the same as that of the wiring BIL[j] is supplied to the capacitor Cs of the memory cell 411A[i,j].

[Period T95]

In Period T95, the potential of the wiring SCL[1] is set to a low level (VL_SCL[1]). The potential of the wiring SCL[2] is set to a high level (VH_SCL[2]), and the wiring BIL[j+1] and the DAC 337[g] are electrically connected to each other. In addition, the data signal WDATA input from the outside is supplied to the wiring SAL[g] through the global logic circuit 350. Here, the data "0010" is supplied to the wiring SAL[g] as the data signal WDATA.

The data "0010" supplied to the wiring SAL[g] is converted into a potential corresponding to the data "0010" by the DAC 337[g] and then supplied to the wiring BIL[j+1]. At this time, the transistor M11 is in an on state, so that the amount of charge with which the potential becomes the same as that of the wiring BIL[j+1] is supplied to the capacitor Cs of the memory cell 411A[i,j+1].

[Period T96]

In Period T96, the potential of the wiring SCL[2] is set to a low level (VL_SCL[2]). The potential of the wiring SCL[3] is set to a high level (VH_SCL[3]), and the wiring BIL[j+2] and the DAC 337[g] are electrically connected to each other. In addition, the data signal WDATA input from the outside is supplied to the wiring SAL[g] through the global logic circuit 350. Here, the data "0010" is supplied to the wiring SAL[g] as the data signal WDATA.

The data "0010" supplied to the wiring SAL[g] is converted into a potential corresponding to the data "0010" by the DAC 337[g] and then supplied to the wiring BIL[j+2]. At this time, the transistor M11 is in an on state, so that the amount of charge with which the potential becomes the same as that of the wiring BIL[j+2] is supplied to the capacitor Cs of the memory cell 411A[i,j+2].

[Period T97]

In Period T97, the wiring WL[i] is brought into a non-selected state to turn off the transistor M11, whereby the amount of charge corresponding to the data is retained in the memory cell 411A[i,j] to the memory cell 411A[i,j+2]. The potential of the wiring SCL[3] is set to a low level (VL_SCL[3]). In addition, the operation of the ADC 338[g] and the input/output circuit 334[g] is stopped.

Through the operations described above, data can be written to the memory cell 411A[i,j]. In this embodiment, the time required for Period T94 to Period T96 is "writing time".

[Refresh Mode]

The memory device 300B in the refresh mode may operate in a manner similar to that of the memory device 300A. Thus, detailed description is omitted here.

[NV Mode]

Figure 27:
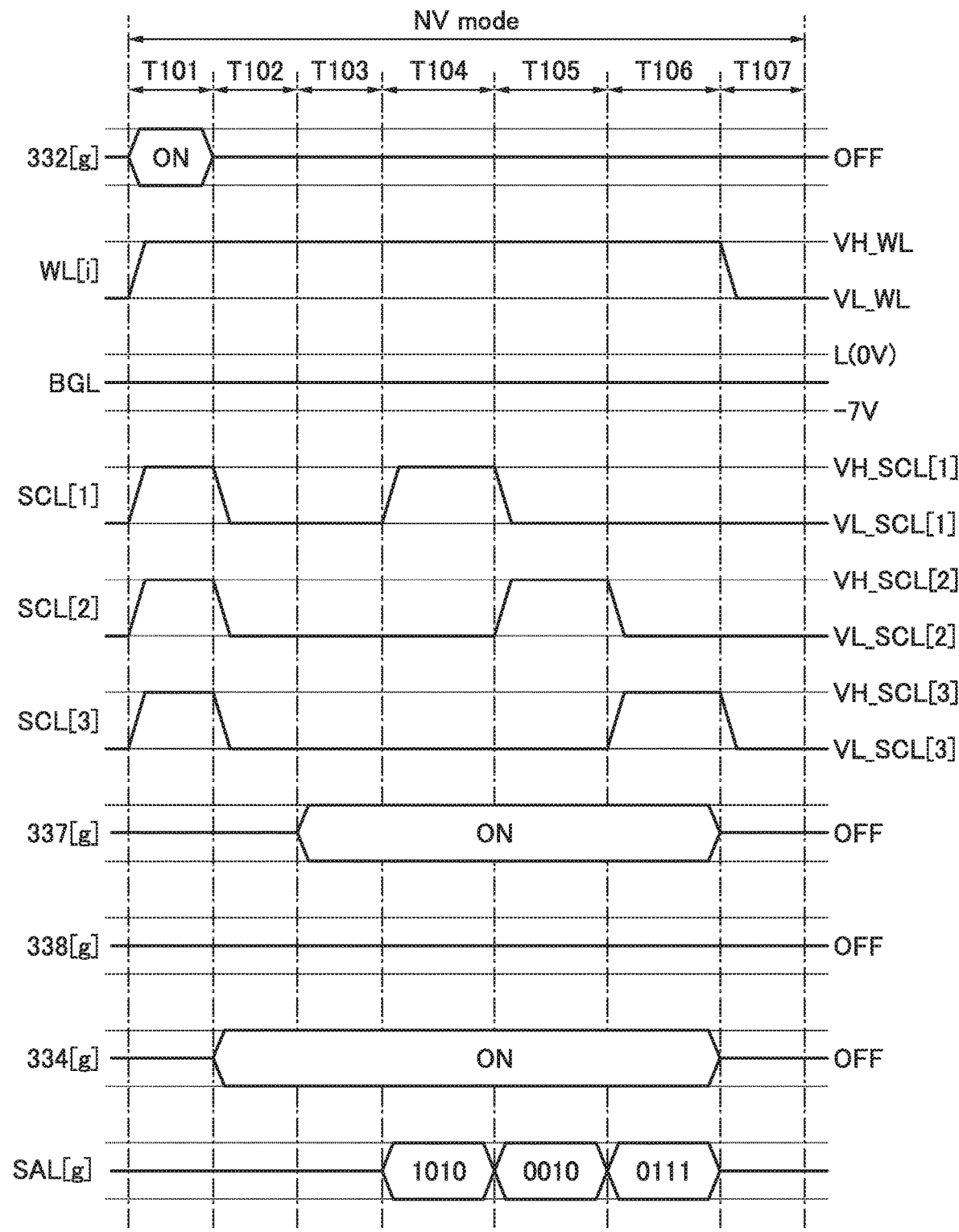
FIG. 27 A timing chart showing an operation example of a memory device.

An NV mode of the memory device 300B is executed, as in the memory device 300A, after the reading mode is executed. FIG. 27 shows a timing chart showing an NV mode operation example of the memory device 300B. The NV mode is an operation mode substantially the same as the writing mode. In FIG. 27, the NV mode is denoted by Period T101 to Period T107. In addition, Period T101 to Period T106 correspond to Period T91 to Period T96 in the writing mode. Therefore, the description of Period T101 to Period T106 is omitted.

In the NV mode, in order to surely accumulate the amount of charge corresponding to data in the capacitor Cs, writing time is made longer than the writing time in the refresh mode. The time required for Period T104 to Period T106 is "writing time" in the NV mode. The writing time in the NV mode is 1.5 times or more, further preferably twice or more, still further preferably 5 times or more the writing time in the refresh mode. The longer writing time can prevent insufficient writing.

[Period T107]

In Period T107, the potential of the wiring WL[i] is set to a low level (VL_WL) to turn off the transistors included in the memory cell 411A[i,j] to the memory cell 411A[i,j+2]. By turning off the transistor M11, the amount of charge corresponding to the data is retained in the memory cell 411A[i,j] to the memory cell 411A[i,j+2].

In the case where the threshold value of the transistor M11 is VthM (VthM>0 V), a potential lower than or equal to −VthM, preferably lower than or equal to −2×VthM, further preferably lower than or equal to −3×VthM is supplied to the wiring BGL regardless of the operating temperature. For example, in the case where VthM is 2 V, a potential lower than or equal to −2 V, preferably lower than or equal to −4 V, further preferably lower than or equal to −6 V is supplied to the wiring BGL regardless of the operating temperature. In this embodiment, −7 V is supplied to the wiring BGL in Period T75. In addition, the operation of the ADC 338[g] and the input/output circuit 334[g] is stopped.

After Period T75, power supply to part or the whole of the peripheral circuit 311 and the cell array 401 is stopped.

When the writing time in the NV mode is longer than the writing time in the refresh mode and a potential lower than or equal to −VthM, preferably lower than or equal to −2×VthM, further preferably lower than or equal to −3×VthM is supplied to the wiring BGL, written data can be retained for longer than or equal to ten years in an environment at 85° C. even when power supply to the cell array 401 is stopped.

This embodiment can be implemented in an appropriate combination with the structures described in the other embodiments and the like.

Embodiment 6

In this embodiment, a cross-sectional structure example of the memory device 300 will be described with reference to drawings.

<Structure Example of Memory Device>

Figure 28:
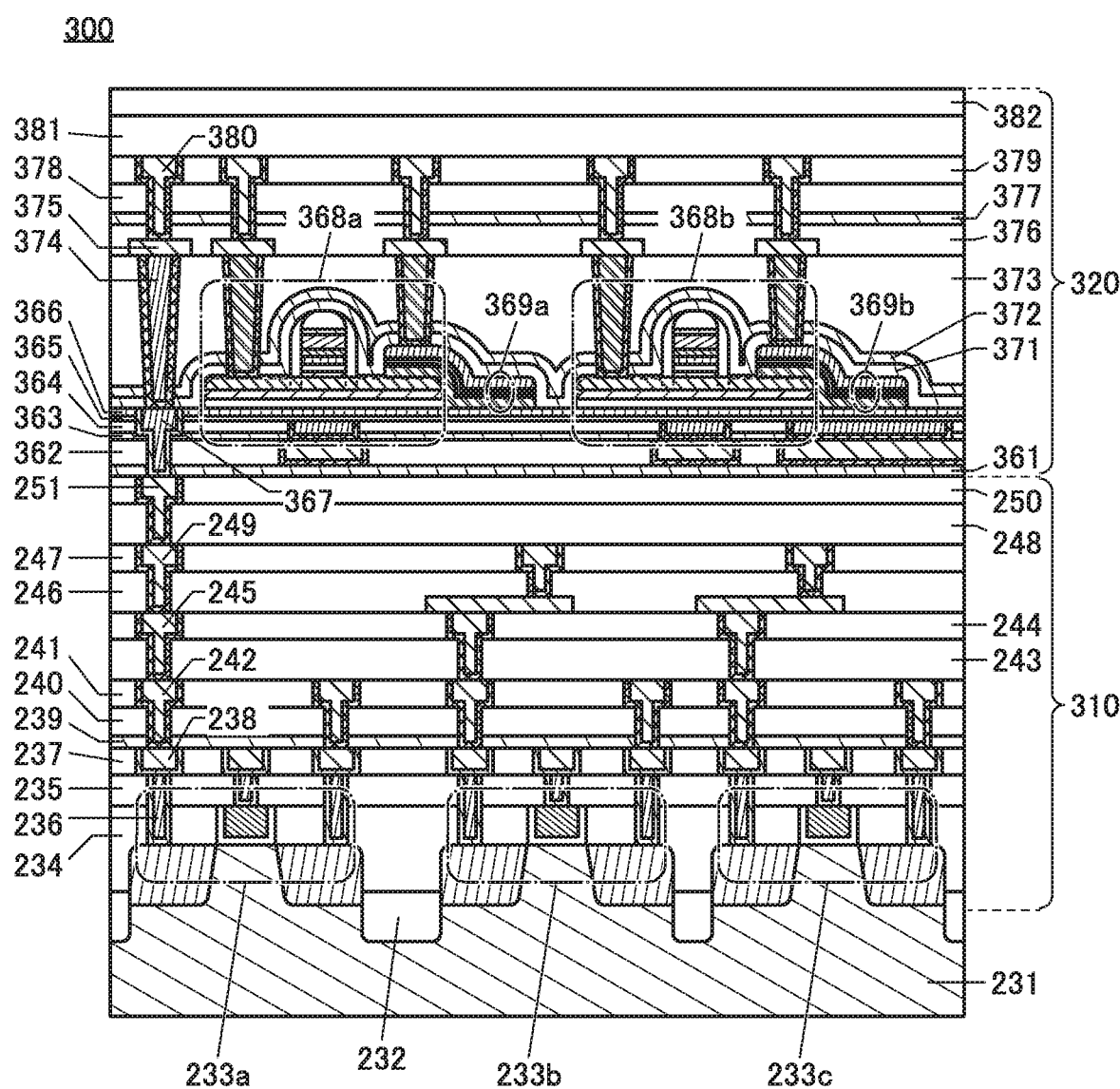
FIG. 28 A diagram illustrating a structure example of a memory device.

FIG. 28 illustrates a cross section of part of the memory device 300. In the memory device 300 illustrated in FIG. 28, a layer 310 and a layer 320 are stacked over a substrate 231. FIG. 28 illustrates the case where a single crystal semiconductor substrate (e.g., a single crystal silicon substrate) is used as the substrate 231.

[Layer 310]

In FIG. 28, the layer 310 includes a transistor 233a, a transistor 233b, and a transistor 233c on the substrate 231. FIG. 28 illustrates cross sections of the transistor 233a, the transistor 233b, and the transistor 233c in the channel length direction.

Channels of the transistor 233a, the transistor 233b, and the transistor 233c are formed in part of the substrate 231. When an integrated circuit is required to operate at high speed, a single crystal semiconductor substrate is preferably used as the substrate 231.

The transistor 233a, the transistor 233b, and the transistor 233c are electrically isolated from each other by an element isolation layer 232. The element isolation layer can be formed by a LOCOS (Local Oxidation of Silicon) method, an STI (Shallow Trench Isolation) method, or the like.

An insulating layer 234 is provided over the substrate 231; an insulating layer 235 and an insulating layer 237 are provided over the transistor 233a, the transistor 233b, and the transistor 233c; and an electrode 238 is embedded in the insulating layer 237. The electrode 238 is electrically connected to one of a source and a drain of the transistor 233a through a contact plug 236.

An insulating layer 239, an insulating layer 240, and an insulating layer 241 are provided over the electrode 238 and the insulating layer 237, and an electrode 242 is embedded in the insulating layer 239, the insulating layer 240, and the insulating layer 241. The electrode 242 is electrically connected to the electrode 238.

An insulating layer 243 and an insulating layer 244 are provided over the electrode 242 and the insulating layer 241, and an electrode 245 is embedded in the insulating layer 243 and the insulating layer 244. The electrode 245 is electrically connected to the electrode 242.

An insulating layer 246 and an insulating layer 247 are provided over the electrode 245 and the insulating layer 244, and an electrode 249 is embedded in the insulating layer 246 and the insulating layer 247. The electrode 249 is electrically connected to the electrode 245.

An insulating layer 248 and an insulating layer 250 are provided over the electrode 249 and the insulating layer 247, and an electrode 251 is embedded in the insulating layer 248 and the insulating layer 250. The electrode 251 is electrically connected to the electrode 249.

[Layer 320]

The layer 320 is provided over the layer 310. The layer 320 includes a transistor 368a, a transistor 368b, a capacitor 369a, and a capacitor 369b. FIG. 28 illustrates cross sections of the transistor 368a and the transistor 368b in the channel length direction. The transistor 368a and the transistor 368b are each a transistor including a back gate.

The transistor 368a and the transistor 368b each correspond to the transistor M11 described in the above embodiment. Therefore, an oxide semiconductor, which is one kind of metal oxide, is preferably used for semiconductor layers of the transistor 368a and the transistor 368b. That is, OS transistors are preferably used as the transistor 368a and the transistor 368b.

The transistor 368a and the transistor 368b are provided over an insulating layer 361 and an insulating layer 362. An insulating layer 363 and an insulating layer 364 are provided over the insulating layer 362. The back gates of the transistor 368a and the transistor 368b are embedded in the insulating layer 363 and the insulating layer 364. An insulating layer 365 and an insulating layer 366 are provided over the insulating layer 364. An electrode 367 is embedded in the insulating layer 361 to the insulating layer 366. The electrode 367 is electrically connected to the electrode 251.

An insulating layer 371, an insulating layer 372, and an insulating layer 373 are formed over the transistor 368a, the transistor 368b, the capacitor 369a, and the capacitor 369b, and an electrode 375 is formed over the insulating layer 373. The electrode 375 is electrically connected to the electrode 367 through a contact plug 374.

An insulating layer 376, an insulating layer 377, an insulating layer 378, and an insulating layer 379 are provided over the electrode 375. An electrode 380 is embedded in the insulating layer 376 to the insulating layer 379. The electrode 380 is electrically connected to the electrode 375.

An insulating layer 381 and an insulating layer 382 are provided over the electrode 380 and the insulating layer 379.

<Variation Example>

Figure 29:
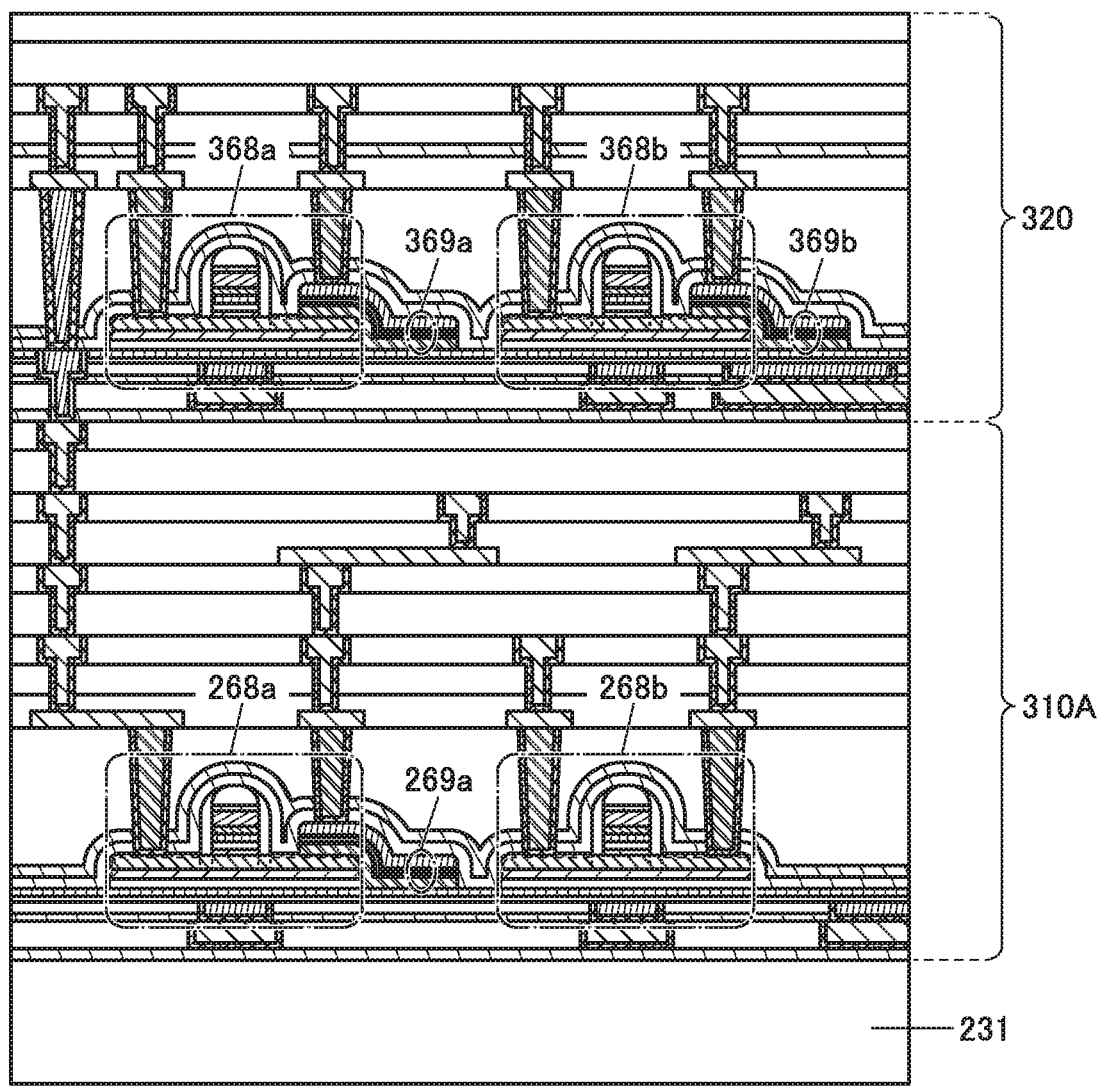
FIG. 29 A diagram illustrating a structure example of a memory device.

FIG. 29 illustrates a cross section of part of the memory device 300A. The memory device 300A is a variation example of the memory device 300. The memory device 300A includes a layer 310A and the layer 320. An insulating substrate (e.g., a glass substrate) is used as the substrate 231 of the memory device 300A.

The layer 310A includes a transistor 268a, a transistor 268b, and a capacitor 269a. Thin film transistors (e.g., OS transistors) are used as the transistors included in the layer 310A. Using OS transistors as all the transistors included in the layer 310A enables the layer 310A to be a single-polarity integrated circuit. Using OS transistors as all the transistors included in the memory device 300A enables the memory device 300A to be a single-polarity memory device.

<Materials>
[Substrate]

Although there is no particular limitation on a material used for a substrate, it is required to have heat resistance high enough to withstand at least heat treatment performed later. For example, a single crystal semiconductor substrate or a polycrystalline semiconductor substrate using silicon, silicon carbide, or the like as a material or a compound semiconductor substrate using silicon germanium or the like as a material can be used as the substrate. Furthermore, an SOI substrate, a semiconductor substrate on which a semiconductor element such as a strained transistor or a FIN-type transistor is provided, or the like can be used. Alternatively, gallium arsenide, aluminum gallium arsenide, indium gallium arsenide, gallium nitride, indium phosphide, silicon germanium, or the like that can be used for a high electron mobility transistor (HEMT) may be used. That is, the substrate is not limited to a simple supporting substrate and may be a substrate where a device such as another transistor is formed.

Furthermore, a glass substrate of barium borosilicate glass, aluminoborosilicate glass, or the like, a ceramic substrate, a quartz substrate, a sapphire substrate, or the like can be used as the substrate. Note that a flexible substrate may be used as the substrate. In the case where a flexible substrate is used, a transistor, a capacitor, or the like may be directly fabricated over the flexible substrate, or a transistor, a capacitor, or the like may be fabricated over another fabrication substrate and then separated therefrom and transferred onto the flexible substrate. Note that to perform separation from the fabrication substrate and transfer to the flexible substrate, a separation layer is preferably provided between the fabrication substrate and the transistor, the capacitor, or the like.

For the flexible substrate, for example, a metal, an alloy, a resin, glass, or fiber thereof can be used. The flexible substrate used as the substrate preferably has a lower coefficient of linear expansion because deformation due to an environment is inhibited. For the flexible substrate used as the substrate, for example, a material whose coefficient of linear expansion is lower than or equal to $1\times10^{-3}$/K, lower than or equal to $5\times10^{-5}$/K, or lower than or equal to $1\times10^{-5}$/K is used. Examples of the resin include polyester, polyolefin, polyamide (e.g., nylon and aramid), polyimide, polycarbonate, and acrylic. In particular, aramid is suitable for the flexible substrate because of its low coefficient of linear expansion.

[Insulating Layer]

For the insulating layer, a single layer or a stack of a material selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, aluminum silicate, and the like is used. A material in which a plurality of materials selected from an oxide material, a nitride material, an oxynitride material, and a nitride oxide material are mixed may be used.

Note that in this specification and the like, a nitride oxide refers to a compound in which the nitrogen content is higher than the oxygen content. An oxynitride refers to a compound in which the oxygen content is higher than the nitrogen content. The content of each element can be measured by Rutherford backscattering spectrometry (RBS), for example.

When an oxide semiconductor, which is one kind of metal oxide, is used for the semiconductor layer, the hydrogen concentration in the insulating layer is preferably lowered in order to prevent an increase in the hydrogen concentration in the semiconductor layer. Specifically, the hydrogen concentration in the insulating layer is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$ in secondary ion mass spectrometry (SIMS). It is particularly preferable to lower the hydrogen concentration in the insulating layer in contact with the semiconductor layer.

Furthermore, the nitrogen concentration in the insulating layer is preferably lowered in order to prevent an increase in the nitrogen concentration in the semiconductor layer. Specifically, the nitrogen concentration in the insulating layer is lower than or equal to $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

It is preferred that at least a region of the insulating layer in contact with the semiconductor layer have few defects and typically have as few signals observed by electron spin resonance (ESR) spectroscopy as possible. An example of the signals is an E' center observed at a g-factor of 2.001. Note that the E' center is due to the dangling bond of silicon. For example, in the case where a silicon oxide layer or a silicon oxynitride layer is used as the insulating layer, a silicon oxide layer or a silicon oxynitride layer whose spin density due to the E' center is lower than or equal to $3\times10^{17}$ spins/cm$^3$, preferably lower than or equal to $5\times10^{16}$ spins/cm$^3$ is used.

In addition to the above-described signal, a signal due to nitrogen dioxide (NO$_2$) may be observed. The signal is divided into the following three signals according to the N nuclear spin: a signal observed at a g-factor of greater than or equal to 2.037 and less than or equal to 2.039 (referred to as a first signal), a signal observed at a g-factor of greater than or equal to 2.001 and less than or equal to 2.003 (referred to as a second signal), and a signal observed at a g-factor of greater than or equal to 1.964 and less than or equal to 1.966 (referred to as a third signal).

For example, as the insulating layer, it is suitable to use an insulating layer whose spin density of a signal due to nitrogen dioxide (NO$_2$) is higher than or equal to $1\times10^{17}$ spins/cm$^3$ and lower than $1\times10^{18}$ spins/cm$^3$.

Note that nitrogen oxide (NO$_2$) including nitrogen dioxide (NO$_2$) forms a state in the insulating layer. The state is positioned in the energy gap of the oxide semiconductor layer. Thus, when nitrogen oxide (NO$_x$) is diffused into the interface between the insulating layer and the oxide semiconductor layer, an electron may be trapped by the state on the insulating layer side. As a result, the trapped electron remains in the vicinity of the interface between the insulating layer and the oxide semiconductor layer; hence, the threshold voltage of the transistor is shifted in the positive direction. Accordingly, the use of a film with a low nitrogen oxide content as the insulating layer and the insulating layer can reduce a shift in the threshold voltage of the transistor.

As an insulating layer that releases a small amount of nitrogen oxide (NO)), for example, a silicon oxynitride layer can be used. The silicon oxynitride layer is a film that releases more ammonia than nitrogen oxide (NO$_x$) in thermal desorption spectroscopy (TDS); the typical released amount of ammonia is greater than or equal to $1\times10^{18}$/cm$^3$ and less than or equal to $5\times10^{19}$/cm$^3$. Note that the released amount of ammonia is the total amount in the range of the heat treatment temperature in TDS from 50° C. to 650° C. or from 50° C. to 550° C.

Since nitrogen oxide ($NO_x$) reacts with ammonia and oxygen in heat treatment, the use of an insulating layer that releases a large amount of ammonia reduces nitrogen oxide ($NO_x$).

At least one of the insulating layers in contact with the oxide semiconductor layer is preferably formed using an insulating layer from which oxygen is released by heating. Specifically, it is preferable to use an insulating layer in which the amount of released oxygen converted into oxygen atoms is $1.0 \times 10^{18}$ atoms/cm$^3$ or more, $1.0 \times 10^{19}$ atoms/cm$^3$ or more, or $1.0 \times 10^{20}$ atoms/cm$^3$ or more in TDS performed with heat treatment where the surface temperature of the insulating layer is higher than or equal to 100° C. and lower than or equal to 700° C., preferably higher than or equal to 100° C. and lower than or equal to 500° C. Note that in this specification and the like, oxygen released by heating is also referred to as "excess oxygen".

Furthermore, an insulating layer containing excess oxygen can also be formed by performing treatment for adding oxygen to an insulating layer. The treatment for adding oxygen can be performed by heat treatment, plasma treatment, or the like in an oxidizing atmosphere. Alternatively, oxygen may be added by an ion implantation method, an ion doping method, a plasma immersion ion implantation method, or the like. Examples of a gas used in the treatment for adding oxygen include an oxygen gas such as $^{16}O_2$ or $^{18}O_2$ and a gas containing oxygen, such as a nitrous oxide gas or an ozone gas. Note that in this specification, the treatment for adding oxygen is also referred to as "oxygen doping treatment". The oxygen doping treatment may be performed while the substrate is heated.

For the insulating layer, a heat-resistant organic material such as polyimide, an acrylic-based resin, a benzocyclobutene-based resin, polyamide, or an epoxy-based resin can be used. Other than the above organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating layers formed of these materials.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. In addition, the organic group may include a fluoro group.

There is no particular limitation on the method for forming the insulating layer. Note that a baking step is necessary in some cases depending on a material used for the insulating layer. In this case, when the baking step of the insulating layer also serves as another heat treatment step, the transistor can be manufactured efficiently.

[Electrode]

As a conductive material for forming the electrode, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like can be used. A semiconductor having high electrical conductivity, typified by polycrystalline silicon containing an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, indium gallium zinc oxide, or indium tin oxide to which silicon is added may be used. Furthermore, indium gallium zinc oxide containing nitrogen may be used.

A stack including a plurality of conductive layers formed of the above materials may be used. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed. A stacked-layer structure combining a conductive material containing nitrogen and a conductive material containing oxygen may be employed.

Note that in the case where an oxide semiconductor is used for the semiconductor layer and the gate electrode employs a stacked-layer structure combining a material containing the above metal element and a conductive material containing oxygen, the conductive material containing oxygen is preferably provided on the semiconductor layer side. By providing the conductive material containing oxygen on the semiconductor layer side, oxygen released from the conductive material is easily supplied to the semiconductor layer.

For the electrode, a conductive material with high embeddability, such as tungsten or polysilicon, can be used, for example. A conductive material with high embeddability and a barrier layer (a diffusion prevention layer) such as a titanium layer, a titanium nitride layer, or a tantalum nitride layer may be used in combination. Note that the electrode may be referred to as a "contact plug".

In particular, for the electrode in contact with the gate insulator, a conductive material through which impurities are less likely to pass is preferably used. An example of the conductive material through which impurities are less likely to pass is tantalum nitride.

When an insulating material through which impurities are less likely to pass is used for the insulating layer and a conductive material through which impurities are less likely to pass is used for the electrode, diffusion of impurities to the transistor can be further inhibited. Thus, the reliability of the transistor can be further increased. That is, the reliability of the memory device can be further increased.

[Semiconductor Layer]

For the semiconductor layer, a single crystal semiconductor, a polycrystalline semiconductor, a microcrystalline semiconductor, an amorphous semiconductor, or the like can be used alone or in combination. As a semiconductor material, silicon, germanium, or the like can be used, for example. Furthermore, a compound semiconductor such as silicon germanium, silicon carbide, gallium arsenide, an oxide semiconductor, or a nitride semiconductor, an organic semiconductor, or the like can be used.

In the case of using an organic semiconductor for the semiconductor layer, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

Note that semiconductor layers may be stacked. In the case of stacking semiconductor layers, semiconductors having different crystal states may be used or different semiconductor materials may be used.

The bandgap of an oxide semiconductor, which is one kind of metal oxide, is greater than or equal to 2 eV; thus, the use of the oxide semiconductor for the semiconductor layer can achieve a transistor with an extremely low off-state current. Specifically, the off-state current per micrometer of channel width at room temperature (typically 25° C.) at a voltage between a source and a drain of 3.5 V can be lower than $1\times10^{-20}$ A, lower than $1\times10^{-22}$ A, or lower than $1\times10^{-24}$ A. That is, the on/off ratio can be greater than or equal to 20 digits. In addition, a transistor using an oxide semiconductor for the semiconductor layer (an OS transistor) has high withstand voltage between its source and drain. Thus, a transistor with high reliability can be provided. A transistor with high output voltage and high withstand voltage can be provided. A memory device or the like with high reliability can be provided. A memory device or the like with high output voltage and high withstand voltage can be provided.

In this specification and the like, a transistor in which silicon having crystallinity is used for a semiconductor layer where a channel is formed is also referred to as a "crystalline Si transistor".

The crystalline Si transistor tends to have relatively high mobility compared with the OS transistor. On the other hand, the crystalline Si transistor has difficulty in achieving an extremely low off-state current such as one in the OS transistor. Thus, it is important that the semiconductor material used for the semiconductor layer be properly selected depending on the purpose and the usage. For example, depending on the purpose and the usage, the OS transistor and the crystalline Si transistor and the like may be used in combination.

In the case where an oxide semiconductor layer is used as the semiconductor layer, the oxide semiconductor layer is preferably formed by a sputtering method. The oxide semiconductor layer is preferably formed by a sputtering method, in which case the density of the oxide semiconductor layer can be increased. When the oxide semiconductor layer is formed by a sputtering method, a rare gas (typically argon), oxygen, or a mixed gas of a rare gas and oxygen is used as a sputtering gas. In addition, increasing the purity of a sputtering gas is necessary. For example, as an oxygen gas or a rare gas used as a sputtering gas, a gas that is highly purified to have a dew point of −60° C. or lower, preferably −100° C. or lower is used. When the highly purified sputtering gas is used for the deposition, entry of moisture or the like into the oxide semiconductor layer can be prevented as much as possible.

Furthermore, in the case where the oxide semiconductor layer is formed by a sputtering method, moisture in a deposition chamber of a sputtering apparatus is preferably removed as much as possible. For example, with an adsorption vacuum evacuation pump such as a cryopump, the deposition chamber is preferably evacuated to be a high vacuum state (to a degree of approximately $5\times10^{-7}$ Pa to $1\times10^{-4}$ Pa). In particular, the partial pressure of gas molecules corresponding to $H_2O$ (gas molecules corresponding to m/z=18) in the deposition chamber in the standby mode of the sputtering apparatus is preferably lower than or equal to $1\times10^{-4}$ Pa, further preferably lower than or equal to $5\times10^{-5}$ Pa.

[Metal Oxide]

An oxide semiconductor, which is one kind of metal oxide, preferably contains at least indium or zinc. In particular, indium and zinc are preferably contained. Furthermore, aluminum, gallium, yttrium, tin, or the like is preferably contained in addition to them. Furthermore, one or more kinds selected from boron, silicon, titanium, iron, nickel, germanium, zirconium, molybdenum, lanthanum, cerium, neodymium, hafnium, tantalum, tungsten, magnesium, and the like may be contained.

Here, the case where an oxide semiconductor contains indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, magnesium, and the like. Note that it is sometimes acceptable to use a plurality of the above-described elements in combination as the element M.

Note that in this specification and the like, a metal oxide containing nitrogen is also collectively referred to as a metal oxide in some cases. A metal oxide containing nitrogen may be referred to as a metal oxynitride.

[Composition of Metal Oxide]

The composition of a CAC (Cloud-Aligned Composite)—OS that can be used in a transistor disclosed in one embodiment of the present invention will be described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. In some cases, the conductive regions are observed to be coupled in a cloud-like manner with their boundaries blurred.

In the CAC-OS or the CAC-metal oxide, in some cases, the conductive regions and the insulating regions each have a size greater than or equal to 0.5 nm and less than or equal to 10 nm, preferably greater than or equal to 0.5 nm and less than or equal to 3 nm, and are dispersed in the material.

The CAC-OS or the CAC-metal oxide includes components having different bandgaps. For example, the CAC-OS or the CAC-metal oxide includes a component having a wide gap due to the insulating region and a component having a narrow gap due to the conductive region. In this structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

[Structure of Metal Oxide]

An oxide semiconductor, which is one kind of metal oxide, is classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear grain boundary even in the vicinity of distortion in the CAAC-OS. That is, formation of a grain boundary is inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can also be referred to as an (In,M) layer.

The CAAC-OS is a metal oxide with high crystallinity. On the other hand, in the CAAC-OS, a reduction in electron mobility due to a grain boundary is less likely to occur because it is difficult to observe a clear grain boundary. Furthermore, entry of impurities, formation of defects, or the like might decrease the crystallinity of a metal oxide, which means that the CAAC-OS is a metal oxide having small amounts of impurities and defects (e.g., oxygen vacancies). Thus, a metal oxide including the CAAC-OS is physically stable. Therefore, the metal oxide including the CAAC-OS is resistant to heat and has high reliability.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (a metal oxide) can have various structures with different properties. The oxide semiconductor may include two or more of an amorphous oxide semiconductor, a polycrystalline oxide semiconductor, an a-like OS, an nc-OS, and a CAAC-OS.

[Transistor Including Metal Oxide]

Next, the case where the above metal oxide is used in a channel formation region of a transistor will be described.

Note that when the above metal oxide is used in a channel formation region of a transistor, a transistor having high field-effect mobility can be achieved. In addition, a transistor having high reliability can be achieved.

Furthermore, a metal oxide with a low carrier density is preferably used for the transistor. In the case where the carrier density of a metal oxide film is reduced, the impurity concentration in the metal oxide film is reduced to reduce the density of defect states. In this specification and the like, a state with a low impurity concentration and a low density of defect states is referred to as a highly purified intrinsic or substantially highly purified intrinsic state. For example, a metal oxide has a carrier density lower than $8 \times 10^{11}/cm^3$, preferably lower than $1 \times 10^{11}/cm^3$, further preferably lower than $1 \times 10^{10}/cm^3$, and higher than or equal to $1 \times 10^{-9}/cm^3$.

A highly purified intrinsic or substantially highly purified intrinsic metal oxide film has a low density of defect states and accordingly may have a low density of trap states.

Charges trapped by the trap states in the metal oxide take a long time to disappear and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration in the metal oxide. In addition, in order to reduce the impurity concentration in the metal oxide, the impurity concentration in an adjacent film is also preferably reduced. Examples of impurities include hydrogen, nitrogen, an alkali metal, an alkaline earth metal, iron, nickel, and silicon.

[Impurities]

Here, the influence of each impurity in the metal oxide will be described.

When silicon or carbon, which is a Group 14 element, is contained in the metal oxide, defect states are formed in the metal oxide. Thus, the concentration of silicon or carbon in the metal oxide and the concentration of silicon or carbon in the vicinity of an interface with the metal oxide (the concentration measured by secondary ion mass spectrometry (SIMS)) are set lower than or equal to $2 \times 10^{18}$ atoms/cm$^3$, preferably lower than or equal to $2 \times 10^{17}$ atoms/cm$^3$.

When the metal oxide contains an alkali metal or an alkaline earth metal, defect states are formed and carriers are generated in some cases. Thus, a transistor using a metal oxide that contains an alkali metal or an alkaline earth metal for its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

When containing nitrogen, the metal oxide easily becomes n-type by generation of electrons serving as carriers and an increase in carrier density. As a result, a transistor using a metal oxide that contains nitrogen for its channel formation region is likely to have normally-on characteristics. Thus, nitrogen in the channel formation region in the metal oxide is preferably reduced as much as possible. For example, the nitrogen concentration in the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor using the metal oxide that contains hydrogen for its channel formation region is likely to have normally-on characteristics. Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide in which the impurities are sufficiently reduced is used in a channel formation region of a transistor, stable electrical characteristics can be given.

<Deposition Method>

An insulating material for forming the insulating layer, a conductive material for forming the electrode, or a semiconductor material for forming the semiconductor layer can be formed by a sputtering method, a spin coating method, a CVD (Chemical Vapor Deposition) method (including a thermal CVD method, an MOCVD (Metal Organic Chemical Vapor Deposition) method, a PECVD (Plasma Enhanced CVD) method, a high density plasma CVD method, an LPCVD (low pressure CVD) method, an APCVD (atmospheric pressure CVD) method, and the like), an ALD (Atomic Layer Deposition) method, or an MBE (Molecular Beam Epitaxy) method, or a PLD (Pulsed Laser Deposition) method, a dipping method, a spray coating method, a droplet discharging method (e.g., an inkjet method), or a printing method (e.g., screen printing or offset printing).

By a plasma CVD method, a high-quality film can be obtained at a relatively low temperature. With the use of a deposition method that does not use plasma at the time of deposition, such as an MOCVD method, an ALD method, or a thermal CVD method, damage is not easily caused on a surface where the film is deposited. For example, a wiring, an electrode, an element (e.g., a transistor or a capacitor), or the like included in a memory device might be charged up by receiving charges from plasma. In that case, accumulated charges might break the wiring, electrode, element, or the like included in the memory device. By contrast, in the case of a deposition method not using plasma, such plasma damage is not caused; thus, the yield of memory devices can be increased. Moreover, since plasma damage during deposition is not caused, a film with few defects can be obtained.

Unlike a deposition method in which particles ejected from a target or the like are deposited, a CVD method and an ALD method are deposition methods in which a film is formed by reaction at a surface of an object. Thus, a CVD method and an ALD method are deposition methods that enable favorable step coverage almost regardless of the shape of an object. In particular, an ALD method enables excellent step coverage and excellent thickness uniformity and can be favorably used to cover a surface of an opening with a high aspect ratio, for example. Note that an ALD method has a relatively low deposition rate, and thus is preferably used in combination with another deposition method with a high deposition rate, such as a CVD method, in some cases.

When a CVD method or an ALD method is used, the composition of a film to be formed can be controlled with a flow rate ratio of source gases. For example, by a CVD method or an ALD method, a film with a certain composition can be deposited depending on the flow rate ratio of the source gases. Moreover, with a CVD method or an ALD method, by changing the flow rate ratio of the source gases while depositing the film, a film whose composition is continuously changed can be deposited. In the case of depositing a film while changing the flow rate ratio of the source gases, as compared with the case of depositing a film with the use of a plurality of deposition chambers, the time taken for the deposition can be shortened because the time taken for transfer and pressure adjustment is omitted. Thus, memory devices can be manufactured with improved productivity in some cases.

Note that in the case of depositing a film by an ALD method, a gas that does not contain chlorine is preferably used as a material gas.

This embodiment can be implemented in an appropriate combination with the structures described in the other embodiments and the like.

Embodiment 7

In this embodiment, a structure example of a transistor that can be used in the semiconductor device and the like described in the above embodiment will be described.

<Transistor Structure Example 1>

Figure 30A:
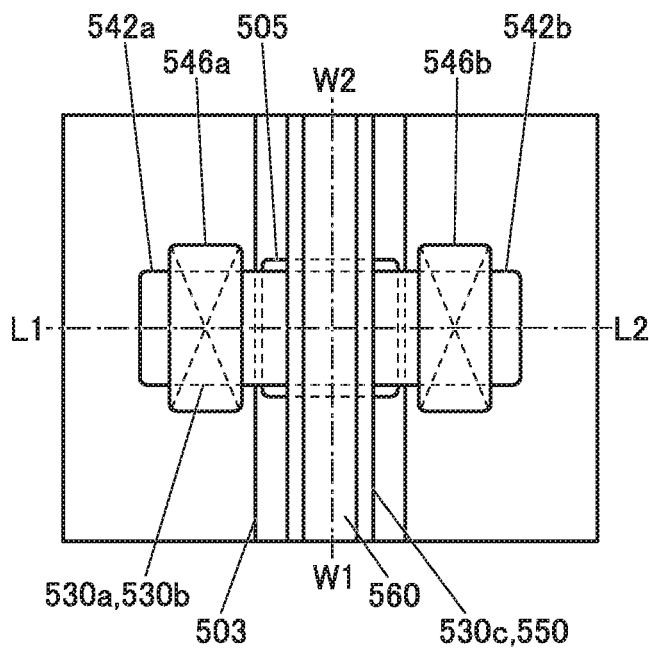
FIGS. 30A-30C Diagrams illustrating a structure example of a transistor.
Figure 30C:
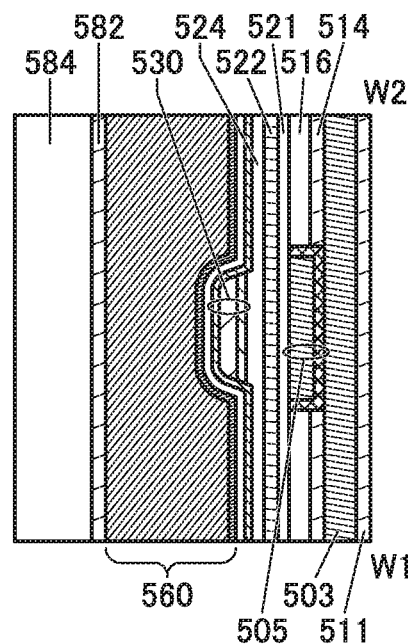
Figure 30B:
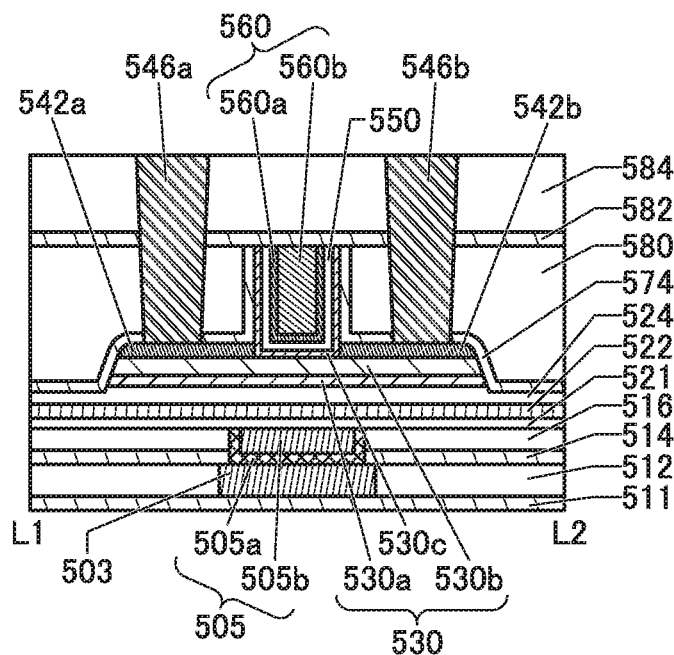

A structure example of a transistor 510A is described with reference to FIGS. 30(A), 30(B), and 30(C). FIG. 30(A) is a top view of the transistor 510A. FIG. 30(B) is a cross-sectional view of a portion indicated by a dashed-dotted line L1-L2 in FIG. 30(A). FIG. 30(C) is a cross-sectional view of a portion indicated by a dashed-dotted line W1-W2 in FIG. 30(A). For clarity of the drawing, some components are not illustrated in the top view of FIG. 30(A).

FIGS. 30(A), 30(B), and 30(C) illustrate the transistor 510A and an insulating layer 511, an insulating layer 512, an insulating layer 514, an insulating layer 516, an insulating layer 580, an insulating layer 582, and an insulating layer 584 that function as interlayer films. In addition, a conductive layer 546 (a conductive layer 546*a* and a conductive layer 546*b*) that is electrically connected to the transistor 510A and functions as a contact plug, and a conductive layer 503 functioning as a wiring are illustrated.

The transistor 510A includes a conductive layer 560 (a conductive layer 560a and a conductive layer 560b) functioning as a first gate electrode; a conductive layer 505 (a conductive layer 505a and a conductive layer 505b) functioning as a second gate electrode; an insulating layer 550 functioning as a first gate insulator; an insulating layer 521, an insulating layer 522, and an insulating layer 524 that function as a second gate insulator; an oxide 530 (an oxide 530a, an oxide 530b, and an oxide 530c) including a region where a channel is formed; a conductive layer 542a functioning as one of a source and a drain; a conductive layer 542b functioning as the other of the source and the drain; and an insulating layer 574.

In the transistor 510A illustrated in FIG. 30, the oxide 530c, the insulating layer 550, and the conductive layer 560 are positioned in an opening provided in the insulating layer 580 with the insulating layer 574 positioned therebetween. Moreover, the oxide 530c, the insulating layer 550, and the conductive layer 560 are positioned between the conductive layer 542a and the conductive layer 542b.

The insulating layer 511 and the insulating layer 512 function as interlayer films.

As the interlayer film, a single layer or stacked layers of an insulator such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or $(Ba,Sr)TiO_3$ (BST) can be used. Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the insulator.

For example, the insulating layer 511 preferably functions as a barrier layer that inhibits entry of impurities such as water and hydrogen into the transistor 510A from the substrate side. Accordingly, for the insulating layer 511, it is preferable to use an insulating material that has a function of inhibiting diffusion of impurities such as a hydrogen atom, a hydrogen molecule, a water molecule, and a copper atom (through which the above impurities are less likely to pass). Alternatively, it is preferable to use an insulating material that has a function of inhibiting diffusion of oxygen (e.g., at least one of oxygen atoms, oxygen molecules, and the like) (through which the above oxygen is less likely to pass). Moreover, aluminum oxide or silicon nitride, for example, may be used for the insulating layer 511. This structure can inhibit diffusion of impurities such as hydrogen and water to the transistor 510A side from the substrate side of the insulating layer 511.

For example, the dielectric constant of the insulating layer 512 is preferably lower than that of the insulating layer 511. When a material with a low dielectric constant is used for the interlayer film, the parasitic capacitance generated between wirings can be reduced.

The conductive layer 503 is formed to be embedded in the insulating layer 512. Here, the level of the top surface of the conductive layer 503 and the level of the top surface of the insulating layer 512 can be substantially the same. Note that although a structure in which the conductive layer 503 is a single layer is illustrated, the present invention is not limited thereto. For example, the conductive layer 503 may have a stacked-layer structure of two or more layers. Note that for the conductive layer 503, a conductive material that has high conductivity and contains tungsten, copper, or aluminum as its main component is preferably used.

In the transistor 510A, the conductive layer 560 sometimes functions as a first gate (also referred to as a top gate) electrode. The conductive layer 505 functions as a second gate (also referred to as a bottom gate) electrode. In that case, the threshold voltage of the transistor 510A can be controlled by changing a potential applied to the conductive layer 505 not in synchronization with but independently of a potential applied to the conductive layer 560. In particular, the threshold voltage of the transistor 510A can be higher than 0 V and the off-state current can be reduced by applying a negative potential to the conductive layer 505. Thus, drain current at the time when a potential applied to the conductive layer 560 is 0 V can be lower in the case where a negative potential is applied to the conductive layer 505 than in the case where a negative potential is not applied to the conductive layer 505.

For example, when the conductive layer 505 and the conductive layer 560 overlap with each other, in the case where a potential is applied to the conductive layer 560 and the conductive layer 505, an electric field generated from the conductive layer 560 and an electric field generated from the conductive layer 505 are connected and can cover a channel formation region formed in the oxide 530.

That is, the channel formation region can be electrically surrounded by the electric field of the conductive layer 560 having a function of the first gate electrode and the electric field of the conductive layer 505 having a function of the second gate electrode. In this specification, a transistor structure in which a channel formation region is electrically surrounded by electric fields of a first gate electrode and a second gate electrode is referred to as a surrounded channel (S-channel) structure.

Like the insulating layer 511 and the insulating layer 512, the insulating layer 514 and the insulating layer 516 function as interlayer films. For example, the insulating layer 514 preferably functions as a barrier layer that inhibits entry of impurities such as water and hydrogen into the transistor 510A from the substrate side. This structure can inhibit diffusion of impurities such as hydrogen and water to the transistor 510A side from the substrate side of the insulating layer 514. Moreover, for example, the insulating layer 516 preferably has a lower dielectric constant than the insulating layer 514. When a material with a low dielectric constant is used for the interlayer film, the parasitic capacitance generated between wirings can be reduced.

In the conductive layer 505 functioning as the second gate, the conductive layer 505a is formed in contact with an inner wall of an opening in the insulating layer 514 and the insulating layer 516, and the conductive layer 505b is formed further inside. Here, the top surfaces of the conductive layer 505a and the conductive layer 505b and the top surface of the insulating layer 516 can be substantially level with each other. Although the transistor 510A having a structure in which the conductive layer 505a and the conductive layer 505b are stacked is illustrated, the present invention is not limited thereto. For example, the conductive layer 505 may have a single-layer structure or a stacked-layer structure of three or more layers.

Here, for the conductive layer 505a, a conductive material that has a function of inhibiting diffusion of impurities such as a hydrogen atom, a hydrogen molecule, a water molecule, and a copper atom (through which the above impurities are less likely to pass) is preferably used. Alternatively, it is preferable to use a conductive material that has a function of inhibiting diffusion of oxygen (e.g., at least one of oxygen atoms, oxygen molecules, and the like) (through which the above oxygen is less likely to pass). Note that in this specification, a function of inhibiting diffusion of impurities or oxygen means a function of inhibiting diffusion of any one or all of the above impurities and the above oxygen.

For example, when the conductive layer 505a has a function of inhibiting diffusion of oxygen, a reduction in conductivity of the conductive layer 505b due to oxidation can be inhibited.

In the case where the conductive layer 505 doubles as a wiring, for the conductive layer 505b, it is preferable to use a conductive material that has high conductivity and contains tungsten, copper, or aluminum as its main component. In that case, the conductive layer 503 is not necessarily provided. Note that the conductive layer 505b is illustrated as a single layer but may have a stacked-layer structure, for example, a stack of any of the above conductive materials and titanium or titanium nitride.

The insulating layer 521, the insulating layer 522, and the insulating layer 524 function as a second gate insulator.

The insulating layer 522 preferably has a barrier property. The insulating layer 522 having a barrier property functions as a layer that inhibits entry of impurities such as hydrogen into the transistor 510A from the surroundings of the transistor 510A.

For the insulating layer 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current may arise because of a thinner gate insulator. When a high-k material is used for an insulator functioning as the gate insulator, a gate potential during operation of the transistor can be reduced while the physical thickness of the gate insulator is maintained.

For example, it is preferable that the insulating layer 521 be thermally stable. For example, silicon oxide and silicon oxynitride, which have thermal stability, are preferable. In addition, a combination of an insulator of a high-k material and silicon oxide or silicon oxynitride allows the insulating layer 521 to have a stacked-layer structure with thermal stability and a high dielectric constant.

Note that the second gate insulator is shown to have a three-layer stacked structure in FIG. 30, but may have a single-layer structure or a stacked-layer structure of two or more layers. In that case, without limitation to a stacked-layer structure formed of the same material, a stacked-layer structure formed of different materials may be employed.

The oxide 530 including a region functioning as the channel formation region includes the oxide 530a, the oxide 530b over the oxide 530a, and the oxide 530c over the oxide 530b. Including the oxide 530a under the oxide 530b makes it possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c. As the oxide 530, the oxide semiconductor described in the above embodiment, which is one kind of metal oxide, can be used.

Note that the oxide 530c is preferably provided in the opening provided in the insulating layer 580 with the insulating layer 574 positioned therebetween. When the insulating layer 574 has a barrier property, diffusion of impurities from the insulating layer 580 into the oxide 530 can be inhibited.

One of conductive layers 542 functions as a source electrode and the other functions as a drain electrode.

For the conductive layer 542a and the conductive layer 542b, a metal such as aluminum, titanium, chromium, nickel, copper, yttrium, zirconium, molybdenum, silver, tantalum, or tungsten or an alloy containing any of the metals as its main component can be used. In particular, a metal nitride film of tantalum nitride or the like is preferable because it has a barrier property against hydrogen or oxygen and its oxidation resistance is high.

Although a single-layer structure is shown in FIG. 30, a stacked-layer structure of two or more layers may be employed. For example, a tantalum nitride film and a tungsten film may be stacked. Alternatively, a titanium film and an aluminum film may be stacked. Further alternatively, a two-layer structure in which an aluminum film is stacked over a tungsten film, a two-layer structure in which a copper film is stacked over a copper-magnesium-aluminum alloy film, a two-layer structure in which a copper film is stacked over a titanium film, or a two-layer structure in which a copper film is stacked over a tungsten film may be employed.

A three-layer structure consisting of a titanium film or a titanium nitride film, an aluminum film or a copper film stacked over the titanium film or the titanium nitride film, and a titanium film or a titanium nitride film formed thereover; a three-layer structure consisting of a molybdenum film or a molybdenum nitride film, an aluminum film or a copper film stacked over the molybdenum film or the molybdenum nitride film, and a molybdenum film or a molybdenum nitride film formed thereover; or the like may be employed. Note that a transparent conductive material containing indium oxide, tin oxide, or zinc oxide may be used.

A barrier layer may be provided over the conductive layer 542. For the barrier layer, a material having a barrier property against oxygen or hydrogen is preferably used. This structure can inhibit oxidation of the conductive layer 542 at the time of depositing the insulating layer 574.

A metal oxide can be used for the barrier layer, for example. In particular, an insulating film of aluminum oxide, hafnium oxide, gallium oxide, or the like, which has a barrier property against oxygen and hydrogen, is preferably used. Alternatively, silicon nitride formed by a CVD method may be used.

With the barrier layer, the range of choices for the material of the conductive layer 542 can be expanded. For example, a material having a low oxidation resistance and high conductivity, such as tungsten or aluminum, can be used for the conductive layer 542. Moreover, for example, a conductor that can be easily deposited or processed can be used.

The insulating layer 550 functions as a first gate insulator. The insulating layer 550 is preferably provided in the opening provided in the insulating layer 580 with the oxide 530c and the insulating layer 574 positioned therebetween.

As miniaturization and high integration of transistors progress, a problem such as leakage current may arise because of a thinner gate insulator. In that case, the insulating layer 550 may have a stacked-layer structure like the second gate insulator. When the insulator functioning as the gate insulator has a stacked-layer structure of a high-k material and a thermally stable material, a gate potential during operation of the transistor can be reduced while the physical thickness of the gate insulator is maintained. Furthermore, the stacked-layer structure can be thermally stable and have a high dielectric constant.

The conductive layer 560 functioning as a first gate electrode includes the conductive layer 560a and the conductive layer 560b over the conductive layer 560a. Like the conductive layer 505a, for the conductive layer 560a, it is preferable to use a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

As a conductive material having a function of inhibiting diffusion of oxygen, for example, tantalum, tantalum nitride, ruthenium, or ruthenium oxide is preferably used. For the conductive layer 560a, the oxide semiconductor that can be used as the oxide 530 can be used. In that case, when the conductive layer 560b is deposited by a sputtering method, the electric resistance of the oxide semiconductor is lowered so that the conductive layer 560a can become a conductor. This can be referred to as an OC (Oxide Conductor) electrode.

For the conductive layer 560b, it is preferable to use a conductive material containing tungsten, copper, or aluminum as its main component. The conductive layer 560 functions as a wiring and thus a conductor having high conductivity is preferably used. For example, a conductive material containing tungsten, copper, or aluminum as its main component can be used. The conductive layer 560b may have a stacked-layer structure, for example, a stack of any of the above conductive materials and titanium or titanium nitride.

The insulating layer 574 is positioned between the insulating layer 580 and the transistor 510A. For the insulating layer 574, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 574 can inhibit diffusion of impurities such as water and hydrogen contained in the insulating layer 580 into the oxide 530b through the oxide 530c and the insulating layer 550. In addition, oxidation of the conductive layer 560 due to excess oxygen contained in the insulating layer 580 can be inhibited.

The insulating layer 580, the insulating layer 582, and the insulating layer 584 function as interlayer films.

Like the insulating layer 514, the insulating layer 582 preferably functions as a barrier insulating film that inhibits entry of impurities such as water and hydrogen into the transistor 510A from the outside.

Like the insulating layer 516, the insulating layer 580 and the insulating layer 584 preferably have a lower dielectric constant than the insulating layer 582. When a material with a low dielectric constant is used for the interlayer films, the parasitic capacitance generated between wirings can be reduced.

The transistor 510A may be electrically connected to another component through a plug or a wiring such as the conductive layer 546 embedded in the insulating layer 580, the insulating layer 582, and the insulating layer 584.

As a material for the conductive layer 546, a conductive material such as a metal material, an alloy material, a metal nitride material, or a metal oxide material can be used as a single layer or stacked layers, as in the conductive layer 505. For example, it is preferable to use a high-melting-point material that has both heat resistance and conductivity, such as tungsten or molybdenum. Alternatively, it is preferable to use a low-resistance conductive material such as aluminum or copper. The use of a low-resistance conductive material can reduce wiring resistance.

For example, when the conductive layer 546 has a stacked-layer structure of tantalum nitride or the like, which is a conductor having a barrier property against hydrogen and oxygen, and tungsten, which has high conductivity, diffusion of impurities from the outside can be inhibited while the conductivity of a wiring is maintained.

With the above structure, a semiconductor device including a transistor that contains an oxide semiconductor and has a high on-state current can be provided. Alternatively, a semiconductor device including a transistor that contains an oxide semiconductor and has a low off-state current can be provided. Alternatively, a semiconductor device that has small variations in electrical characteristics, stable electrical characteristics, and high reliability can be provided.

<Transistor Structure Example 2>

Figure 31A:
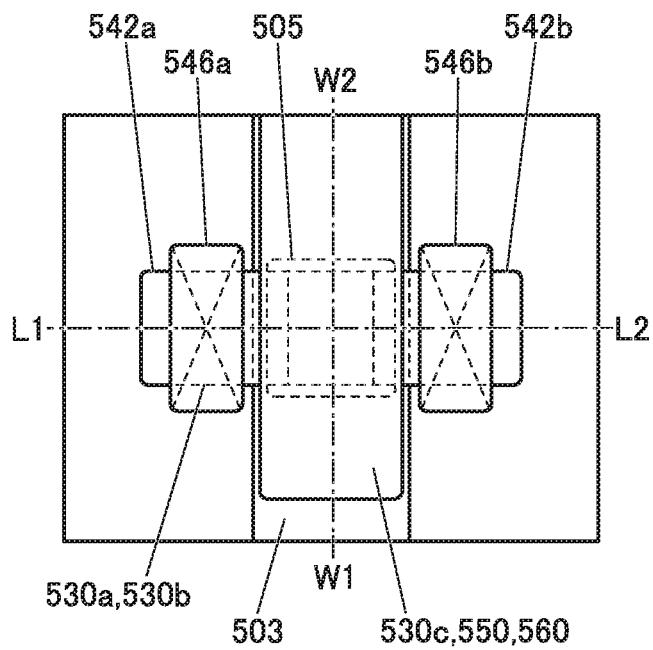
FIGS. 31A-31C Diagrams illustrating a structure example of a transistor.
Figure 31C:
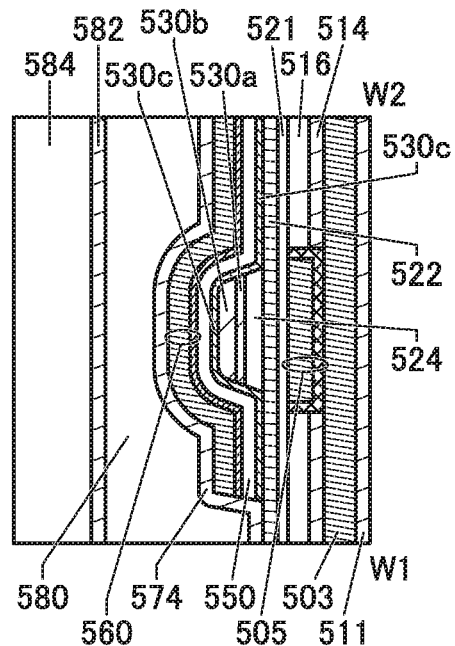
Figure 31B:
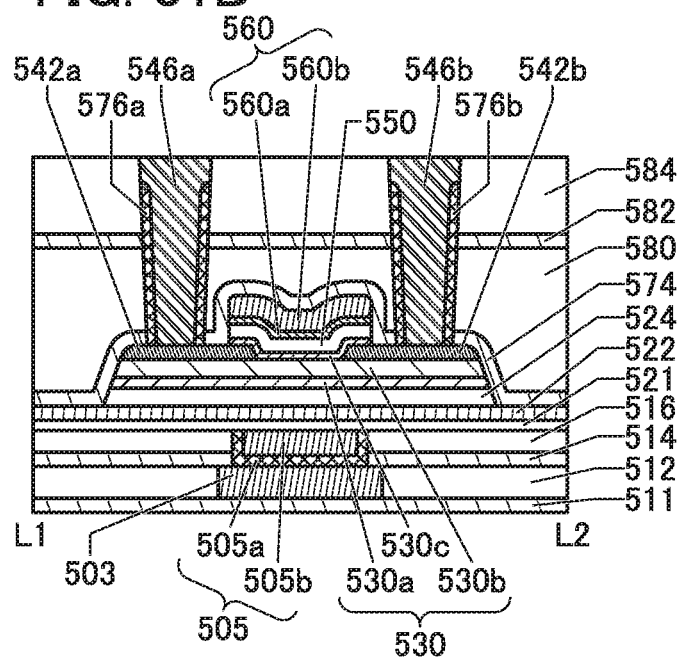

A structure example of a transistor 510B is described with reference to FIGS. 31(A), 31(B), and 31(C). FIG. 31(A) is a top view of the transistor 510B. FIG. 31(B) is a cross-sectional view of a portion indicated by a dashed-dotted line L1-L2 in FIG. 31(A). FIG. 31(C) is a cross-sectional view of a portion indicated by a dashed-dotted line W1-W2 in FIG. 31(A). For clarity of the drawing, some components are not illustrated in the top view of FIG. 31(A).

The transistor 510B is a variation example of the transistor 510A. Therefore, differences from the transistor 510A will be mainly described to avoid repeated description.

The transistor 510B includes a region where the conductive layer 542 (the conductive layer 542a and the conductive layer 542b), the oxide 530c, the insulating layer 550, and the conductive layer 560 overlap with each other. With this structure, a transistor having a high on-state current can be provided. Moreover, a transistor having high controllability can be provided.

The conductive layer 560 functioning as a first gate electrode includes the conductive layer 560a and the conductive layer 560b over the conductive layer 560a. Like the conductive layer 505a, for the conductive layer 560a, it is preferable to use a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductive layer 560a has a function of inhibiting oxygen diffusion, the range of choices for the material of the conductive layer 560b can be expanded. That is, the conductive layer 560a inhibits oxidation of the conductive layer 560b, thereby preventing the decrease in conductivity of the conductive layer 560b.

The insulating layer 574 is preferably provided to cover the top surface and the side surface of the conductive layer 560, the side surface of the insulating layer 550, and the side surface of the oxide 530c. For the insulating layer 574, an insulating material having a function of inhibiting diffusion of oxygen and impurities such as water and hydrogen is preferably used. For example, aluminum oxide or hafnium oxide is preferably used. Moreover, it is possible to use, for example, a metal oxide such as magnesium oxide, gallium oxide, germanium oxide, yttrium oxide, zirconium oxide, lanthanum oxide, neodymium oxide, or tantalum oxide or silicon nitride oxide, silicon nitride, or the like.

The insulating layer 574 can inhibit oxidation of the conductive layer 560. Moreover, the insulating layer 574 can inhibit diffusion of impurities such as water and hydrogen contained in the insulating layer 580 into the transistor 510B.

The insulating layer 576 (the insulating layer 576a and the insulating layer 576b) having a barrier property may be provided between the conductive layer 546 and the insulating layer 580. Providing the insulating layer 576 can prevent oxygen in the insulating layer 580 from reacting with the conductive layer 546 and oxidizing the conductive layer 546.

Furthermore, with the insulating layer 576 having a barrier property, the range of choices for the material of the conductor used as the plug or the wiring can be expanded. The use of a metal material having an oxygen absorbing property and high conductivity for the conductive layer 546, for example, can provide a semiconductor device with low power consumption.

<Transistor Structure Example 3>

A structure example of a transistor 510C is described with reference to FIGS. 32(A), 32(B), and 32(C). FIG. 32(A) is a top view of the transistor 510C. FIG. 32(B) is a cross-sectional view of a portion indicated by a dashed-dotted line L1-L2 in FIG. 32(A). FIG. 32(C) is a cross-sectional view of a portion indicated by a dashed-dotted line W1-W2 in FIG. 32(A). For clarity of the drawing, some components are not illustrated in the top view of FIG. 32(A).

The transistor 510C is a variation example of the transistor 510A. Therefore, differences from the transistor 510A will be mainly described to avoid repeated description.

The transistor 510C illustrated in FIG. 32 includes a conductive layer 547a between the conductive layer 542a and the oxide 530b, and a conductive layer 547b between the conductive layer 542b and the oxide 530b. Here, the conductive layer 542a (the conductive layer 542b) extends beyond the top surface and the side surface on the conductive layer 560 side of the conductive layer 547a (the conductive layer 547b), and includes a region in contact with the top surface of the oxide 530b. For the conductive layer 547, a conductor that can be used for the conductive layer 542 is used. It is preferred that the thickness of the conductive layer 547 be at least greater than that of the conductive layer 542.

In the transistor 510C in FIG. 32 having such a structure, the conductive layer 542 can be closer to the conductive layer 560 than that in the transistor 510A is. Furthermore, the end portions of the conductive layer 542a and the conductive layer 542b can overlap with the conductive layer 560. Accordingly, an effective channel length of the transistor 510C can be shortened; thus, the transistor 510C can have a high on-state current and improved frequency characteristics.

The conductive layer 547a (the conductive layer 547b) is preferably provided to overlap with the conductive layer 542a (the conductive layer 542b). With such a structure, the conductive layer 547a (the conductive layer 547b) functioning as a stopper can prevent over-etching of the oxide 530b by etching for forming the opening where the conductive layer 546a (the conductive layer 546b) is to be embedded.

In the transistor 510C illustrated in FIG. 32, the insulating layer 545 may be positioned on and in contact with the insulating layer 544. The insulating layer 544 preferably functions as a barrier insulating film that inhibits entry of impurities such as water and hydrogen and excess oxygen into the transistor 510C from the insulating layer 580 side. For the insulating layer 545, an insulator that can be used for the insulating layer 544 can be used. In addition, for the insulating layer 544, a nitride insulator such as aluminum nitride, aluminum titanium nitride, titanium nitride, silicon nitride, or silicon nitride oxide may be used, for example.

Unlike in the transistor 510A illustrated in FIG. 30, in the transistor 510C illustrated in FIG. 32, the conductive layer 505 may be provided to have a single-layer structure. In this case, an insulating film to be the insulating layer 516 is deposited over the patterned conductive layer 505, and an upper portion of the insulating film is removed by a CMP method or the like until the top surface of the conductive layer 505 is exposed. Preferably, the planarity of the top surface of the conductive layer 505 is made favorable. For example, the average surface roughness (Ra) of the top surface of the conductive layer 505 is less than or equal to 1 nm, preferably less than or equal to 0.5 nm, further preferably less than or equal to 0.3 nm. This allows the improvement in planarity of the insulating layer formed over the conductive layer 505 and the increase in crystallinity of the oxide 530b and the oxide 530c.

<Transistor Structure Example 4>

Figure 33A:
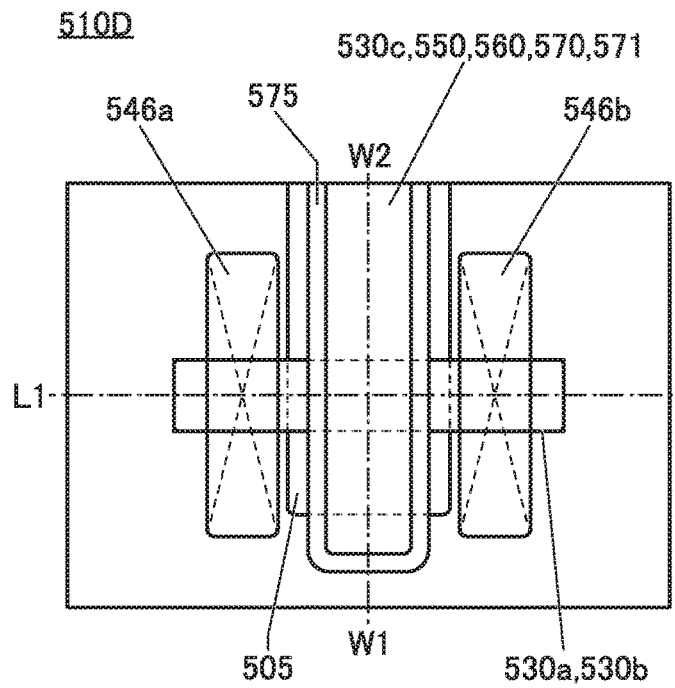
FIGS. 33A-33C Diagrams illustrating a structure example of a transistor.
Figure 33C:
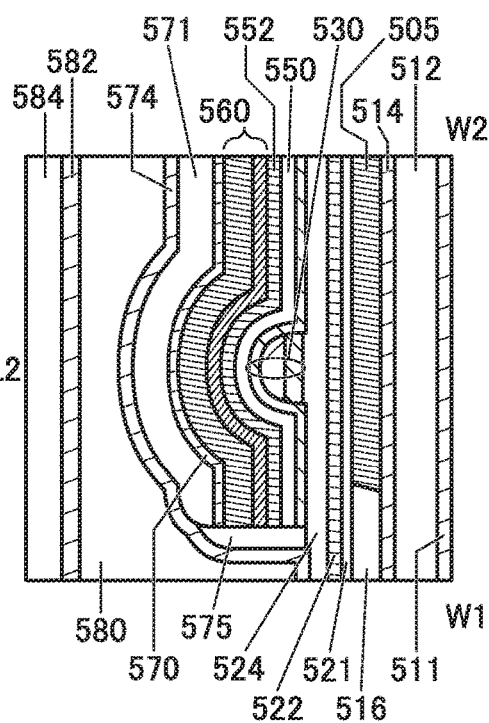
Figure 33B:
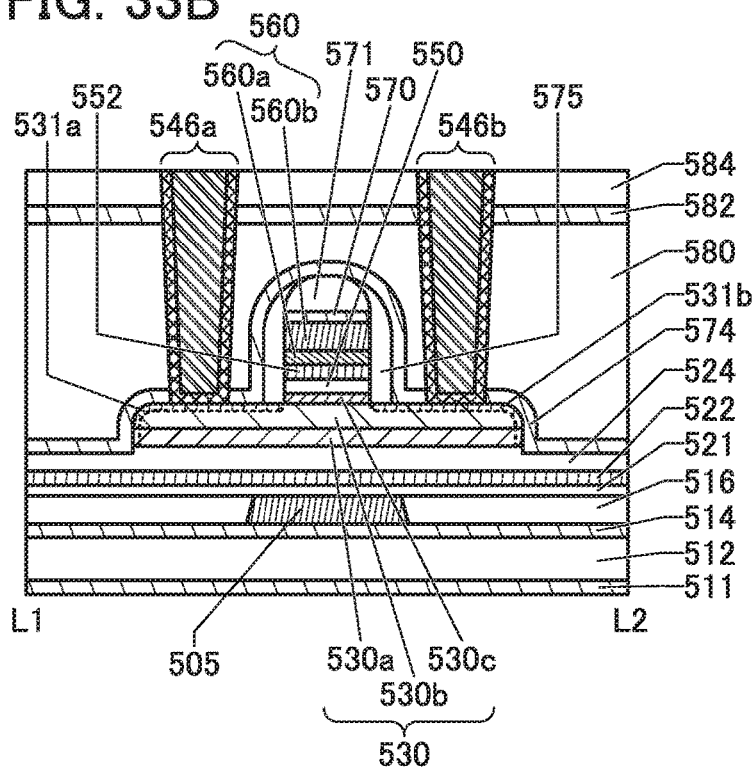

A structure example of a transistor 510D is described with reference to FIGS. 33(A), 33(B), and 33(C). FIG. 33(A) is a top view of the transistor 510D. FIG. 33(B) is a cross-sectional view of a portion indicated by a dashed-dotted line L1-L2 in FIG. 33(A). FIG. 33(C) is a cross-sectional view of a portion indicated by a dashed-dotted line W1-W2 in FIG. 33(A). For clarity of the drawing, some components are not illustrated in the top view of FIG. 33(A).

The transistor 510D is a variation example of the transistor 510A. Therefore, differences from the transistor 510A will be mainly described to avoid repeated description.

In FIGS. 33(A) to 33(C), the conductive layer 503 is not provided and the conductive layer 505 functioning as the second gate also functions as a wiring. The insulating layer 550 is provided over the oxide 530c, and a metal oxide 552 is provided over the insulating layer 550. The conductive layer 560 is provided over the metal oxide 552, and an insulating layer 570 is provided over the conductive layer 560. An insulating layer 571 is provided over the insulating layer 570.

Thus, the metal oxide 552 preferably has a function of inhibiting diffusion of oxygen. When the metal oxide 552 that inhibits diffusion of oxygen is provided between the insulating layer 550 and the conductive layer 560, diffusion of the oxygen to the conductive layer 560 is inhibited. That is, a reduction in the amount of oxygen supplied to the oxide 530 can be inhibited. Moreover, oxidization of the conductive layer 560 due to oxygen can be inhibited.

Note that the metal oxide 552 may function as part of the first gate. For the metal oxide 552, the oxide semiconductor that can be used as the oxide 530 can be used, for example. In that case, when the conductive layer 560 is deposited by a sputtering method, the electric resistance of the metal oxide 552 is lowered so that the metal oxide 552 can become a conductive layer. This can be referred to as an OC (Oxide Conductor) electrode.

Note that the metal oxide 552 has a function of part of the gate insulator in some cases. Thus, when silicon oxide, silicon oxynitride, or the like is used for the insulating layer 550, a metal oxide that is a high-k material with a high dielectric constant is preferably used for the metal oxide 552. With such a stacked-layer structure, the stacked-layer structure can be thermally stable and have a high dielectric constant. Thus, a gate potential that is applied during operation of the transistor can be reduced while the physical thickness of the gate insulator is maintained. In addition, the equivalent oxide thickness (EOT) of an insulating layer functioning as the gate insulator can be reduced.

Although the metal oxide 552 in the transistor 510D is shown as a single layer, the metal oxide 552 may have a stacked-layer structure of two or more layers. For example, a metal oxide functioning as part of a gate electrode and a metal oxide functioning as part of a gate insulator may be stacked.

With the metal oxide 552 functioning as a gate electrode, the on-state current of the transistor 510D can be increased without a reduction in the influence of the electric field generated from the conductive layer 560. With the metal oxide 552 functioning as a gate insulator, the distance between the conductive layer 560 and the oxide 530 is kept by the physical thicknesses of the insulating layer 550 and the metal oxide 552, so that leakage current between the conductive layer 560 and the oxide 530 can be reduced. Thus, with the stacked-layer structure of the insulating layer 550 and the metal oxide 552, the physical distance between the conductive layer 560 and the oxide 530 and the intensity of an electric field applied from the conductive layer 560 to the oxide 530 can be easily adjusted as appropriate.

Specifically, the oxide semiconductor that can be used for the oxide 530 can also be used for the metal oxide 552 when the resistance thereof is reduced. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, for example, aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is less likely to be crystallized by heat treatment in a later step. Note that the metal oxide 552 is not an essential structure. Design is appropriately set in consideration of required transistor characteristics.

For the insulating layer 570, an insulating material having a function of inhibiting the diffusion of oxygen and impurities such as water and hydrogen is preferably used. For example, aluminum oxide or hafnium oxide is preferably used. Thus, oxidization of the conductive layer 560 due to oxygen from above the insulating layer 570 can be inhibited. Moreover, entry of impurities such as water and hydrogen from above the insulating layer 570 into an oxide 230 through the conductive layer 560 and the insulating layer 550 can be inhibited.

The insulating layer 571 functions as a hard mask. By providing the insulating layer 571, the conductive layer 560 can be processed to have the side surface that is substantially vertical; specifically, an angle formed by the side surface of the conductive layer 560 and a surface of the substrate can be greater than or equal to 75° and less than or equal to 100°, preferably greater than or equal to 80° and less than or equal to 95°.

An insulating material having a function of inhibiting the passage of oxygen and impurities such as water and hydrogen may be used for the insulating layer 571 so that the insulating layer 571 also functions as a barrier film. In that case, the insulating layer 570 does not have to be provided.

Parts of the insulating layer 570, the conductive layer 560, the metal oxide 552, the insulating layer 550, and the oxide 530c are selectively removed using the insulating layer 571 as a hard mask, so that the side surfaces of them are substantially aligned with each other and part of the surface of the oxide 530b can be exposed.

In the transistor 510D, part of the exposed surface of the oxide 530b includes a region 531a and a region 531b. One of the region 531a and the region 531b functions as a source region, and the other functions as a drain region.

The region 531a and the region 531b can be formed by, for example, introducing an impurity element such as phosphorus or boron to the exposed surface of the oxide 530b by an ion implantation method, an ion doping method, a plasma immersion ion implantation method, plasma treatment, or the like. In this embodiment and the like, an impurity element refers to an element other than main component elements.

The region 531a and the region 531b can also be formed in the following manner: a metal film is deposited after part of the surface of the oxide 530b is exposed and then the element in the metal film is diffused into the oxide 530b by heat treatment.

The regions of the oxide 530b into which the impurity element is introduced have decreased electric resistivity. Accordingly, the region 531a and the region 531b are each referred to as an impurity region or a low-resistance region in some cases.

With the use of the insulating layer 571 and/or the conductive layer 560 as a mask, the region 531a and the region 531b can be formed in a self-aligned manner. In that case, the conductive layer 560 does not overlap with the region 531a and/or the region 531b; thus, parasitic capacitance can be reduced. Furthermore, an offset region is not formed between the channel formation region and the source or drain region (the region 531a or the region 531b). The formation of the region 531a and the region 531b in a self-aligned manner achieves an increase in the on-state current, a reduction in the threshold voltage, and an improvement in the operation frequency, for example.

In order to further reduce the off-state current, the offset region may be provided between the channel formation region and the source or drain region. The offset region is a region which has high electric resistivity and into which the impurity element is not introduced. The offset region can be formed by introducing the impurity element after the formation of the insulating layer 575. In that case, the insulating layer 575 serves as a mask, like the insulating layer 571 or the like. Thus, the impurity element is not introduced into a region of the oxide 530b that overlaps with the insulating layer 575, and the electric resistivity of the region can be kept high.

In the transistor 510D, the insulating layer 575 is provided on the side surfaces of the insulating layer 570, the conductive layer 560, the metal oxide 552, the insulating layer 550, and the oxide 530c. The insulating layer 575 is preferably an insulator having a low dielectric constant. For example, the insulating layer 575 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. For the insulating layer 575, it is particularly preferable to use silicon oxide, silicon oxynitride, silicon nitride oxide, or porous silicon oxide because an excess-oxygen region can be easily formed in the insulating layer 575 in a later step. In addition, silicon oxide and silicon oxynitride are preferable because of their thermal stability. The insulating layer 575 preferably has a function of diffusing oxygen.

The transistor 510D also includes the insulating layer 574 over the insulating layer 575 and the oxide 530. The insulating layer 574 is preferably deposited by a sputtering method. When a sputtering method is used, an insulator containing few impurities such as water and hydrogen can be deposited. For example, for the insulating layer 574, aluminum oxide is preferably used.

Note that, in some cases, an oxide film formed by a sputtering method extracts hydrogen from the structure body over which the oxide film is deposited. Thus, the hydrogen concentrations in the oxide 230 and the insulating layer 575 can be reduced when the insulating layer 574 absorbs hydrogen and water from the oxide 230 and the insulating layer 575.

<Transistor Structure Example 5>

Figure 34A:
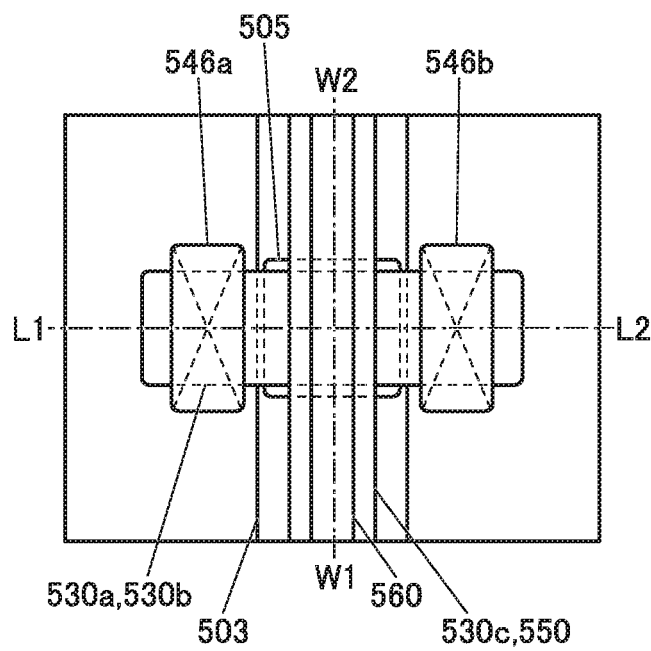
FIGS. 34A-34C Diagrams illustrating a structure example of a transistor.
Figure 34C:
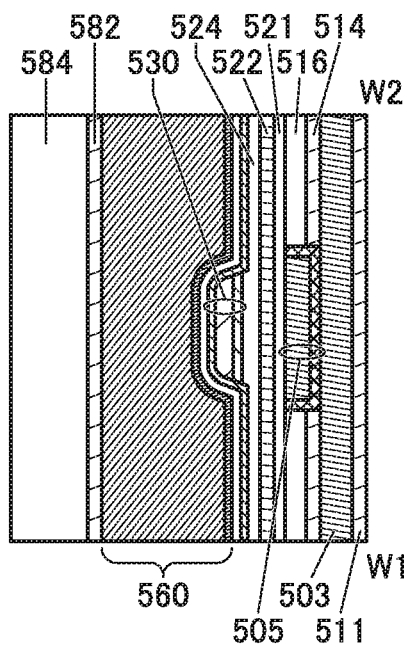
Figure 34B:
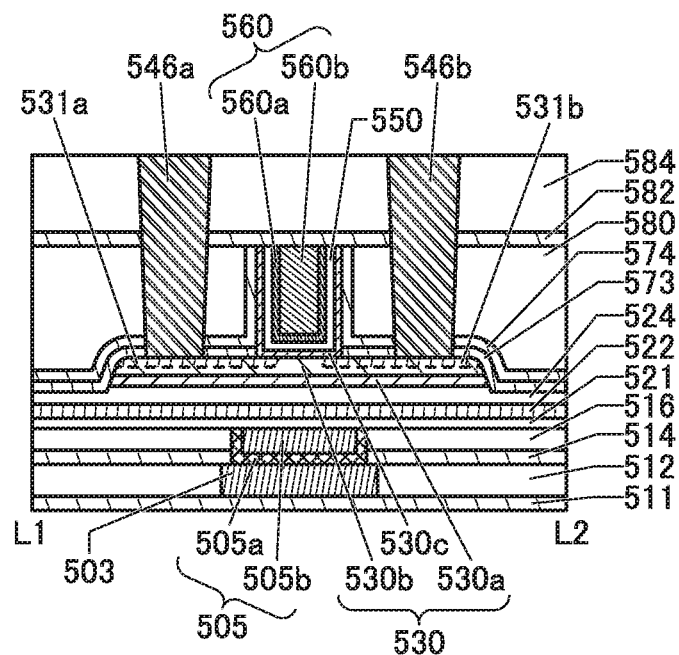

A structure example of a transistor 510E is described with reference to FIGS. 34(A), 34(B), and 34(C). FIG. 34(A) is a top view of the transistor 510E. FIG. 34(B) is a cross-sectional view of a portion indicated by a dashed-dotted line L1-L2 in FIG. 34(A). FIG. 34(C) is a cross-sectional view of a portion indicated by a dashed-dotted line W1-W2 in FIG. 34(A). For clarity of the drawing, some components are not illustrated in the top view of FIG. 34(A).

The transistor 510E is a variation example of the transistor 510A. Therefore, differences from the transistor 510A will be mainly described to avoid repeated description.

In FIGS. 34(A) to 34(C), the conductive layer 542 is not provided, and part of the exposed surface of the oxide 530b includes a region 531a and a region 531b. One of the region 531a and the region 531b functions as a source region, and the other functions as a drain region. Moreover, an insulating layer 573 is included between the oxide 530b and the insulating layer 574.

A region 531 (the region 531a and the region 531b) illustrated in FIG. 34 is a region where the above element is added to the oxide 530b. The region 531 can be formed with the use of a dummy gate, for example.

Specifically, a dummy gate is provided over the oxide 530b, and the above element that reduces the resistance of the oxide 530b is added using the dummy gate as a mask. That is, the element is added to regions of the oxide 530 that are not overlapped by the dummy gate, whereby the region 531 is formed. As a method of adding the element, an ion implantation method by which an ionized source gas is subjected to mass separation and then added, an ion doping method by which an ionized source gas is added without mass separation, a plasma immersion ion implantation method, or the like can be used.

Typical examples of the element that reduces the resistance of the oxide 530 are boron and phosphorus. Moreover, hydrogen, carbon, nitrogen, fluorine, sulfur, chlorine, titanium, a rare gas element, or the like may be used. Typical examples of the rare gas element include helium, neon, argon, krypton, and xenon. The concentration of the element is measured by secondary ion mass spectrometry (SIMS) or the like.

In particular, boron and phosphorus are preferable because an apparatus used in a manufacturing line for amorphous silicon or low-temperature polysilicon can be used. Since the existing facility can be used, capital investment can be reduced.

Next, an insulating film to be the insulating layer 573 and an insulating film to be the insulating layer 574 may be deposited over the oxide 530b and the dummy gate. Stacking the insulating film to be the insulating layer 573 and the insulating film to be the insulating layer 574 can provide a region where the region 531, the oxide 530c, and the insulating layer 550 overlap with each other.

Specifically, after an insulating film to be the insulating layer 580 is provided over the insulating film to be the insulating layer 574, the insulating film to be the insulating layer 580 is subjected to CMP (Chemical Mechanical Polishing) treatment, whereby part of the insulating film to be the insulating layer 580 is removed and the dummy gate is exposed. Then, when the dummy gate is removed, part of the insulating layer 573 in contact with the dummy gate is preferably also removed. Thus, the insulating layer 574 and the insulating layer 573 are exposed at the side surface of the opening provided in the insulating layer 580, and the region 531 provided in the oxide 530b is partly exposed at the bottom surface of the opening. Next, an oxide film to be the oxide 530c, an insulating film to be the insulating layer 550, and a conductive film to be the conductive layer 560 are deposited in this order in the opening, and then, the oxide film to be the oxide 530c, the insulating film to be the insulating layer 550, and the conductive film to be the conductive layer 560 are partly removed by CMP treatment or the like until the insulating layer 580 is exposed; thus, the transistor illustrated in FIG. 34 can be formed.

Note that the insulating layer 573 and the insulating layer 574 are not essential components. Design is appropriately set in consideration of required transistor characteristics.

The cost of the transistor illustrated in FIG. 34 can be reduced because an existing apparatus can be used and the conductive layer 542 is not provided.

This embodiment can be implemented in an appropriate combination with the structures described in the other embodiments and the like.

Embodiment 8

In this embodiment, examples of electronic components and electronic devices in which the memory device or the like described in the above embodiment is incorporated will be described.

<Electronic Components>

First, examples of electronic components in which the memory device 300 is incorporated will be described with reference to FIGS. 35(A) and 35(B).

Figure 35A:
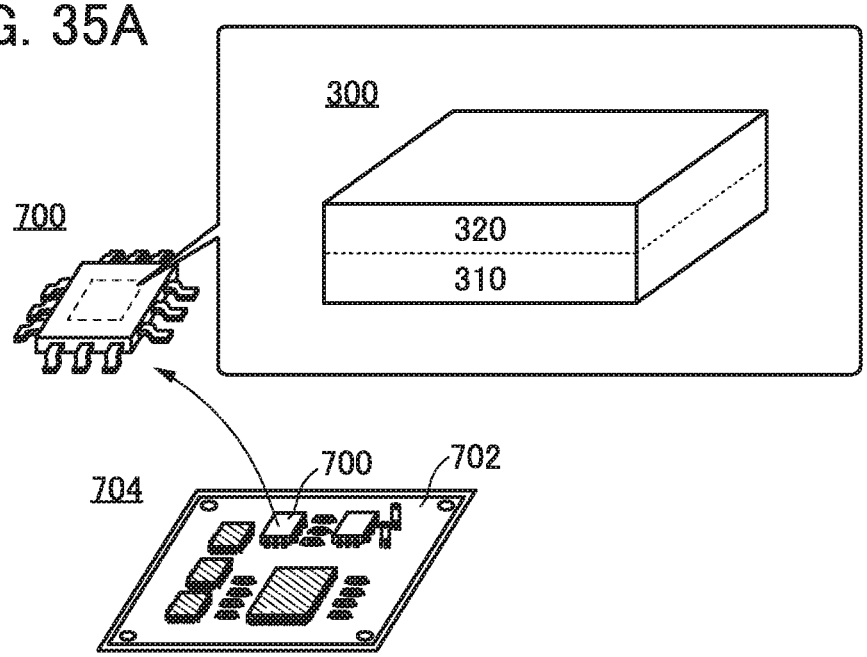
FIGS. 35A-35B Diagrams illustrating examples of electronic components.

FIG. 35(A) is a perspective view of an electronic component 700 and a substrate on which the electronic component 700 is mounted (a mounting board 704). The electronic component 700 illustrated in FIG. 35(A) is an IC chip and includes a lead and a circuit portion. The electronic component 700 is mounted on a printed circuit board 702, for example. A plurality of such IC chips are combined and electrically connected to each other on the printed circuit board 702, whereby the mounting board 704 is completed.

The memory device 300 described in the above embodiment is provided as the circuit portion of the electronic component 700. Although a QFP (Quad Flat Package) is used as a package of the electronic component 700 in FIG. 35(A), the embodiment of the package is not limited thereto.

Figure 35B:
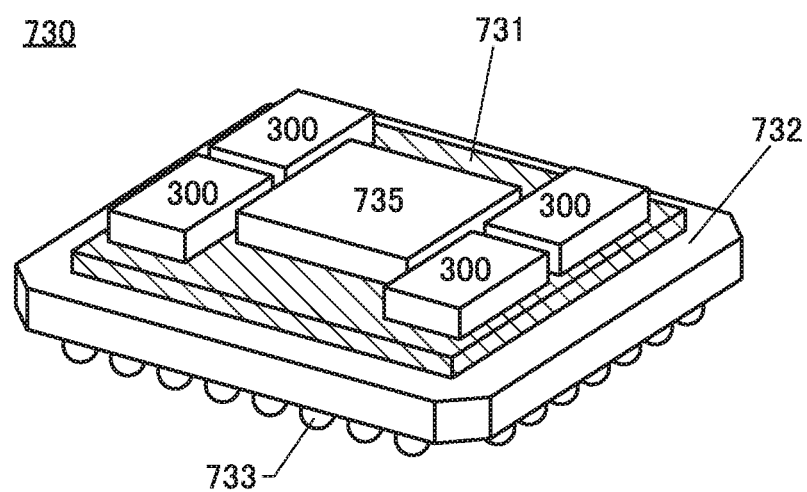

FIG. 35(B) is a perspective view of an electronic component 730. The electronic component 730 is an example of a SiP (System in package) or an MCM (Multi Chip Module). In the electronic component 730, an interposer 731 is provided on a package substrate 732 (a printed circuit board), and a semiconductor device 735 and a plurality of memory devices 300 are provided on the interposer 731.

The electronic component 730 using the memory devices 300 as high bandwidth memory (HBM) is shown as an example. An integrated circuit (a semiconductor device) such as a CPU, a GPU, or an FPGA can be used as the semiconductor device 735.

As the package substrate 732, a ceramic substrate, a plastic substrate, a glass epoxy substrate, or the like can be used. As the interposer 731, a silicon interposer, a resin interposer, or the like can be used.

The interposer 731 includes a plurality of wirings and has a function of electrically connecting a plurality of integrated circuits with different terminal pitches. The plurality of wirings are provided in a single layer or multiple layers. Moreover, the interposer 731 has a function of electrically connecting an integrated circuit provided on the interposer 731 to an electrode provided on the package substrate 732. Accordingly, the interposer is referred to as a "redistribution substrate" or an "intermediate substrate" in some cases. A through electrode may be provided in the interposer 731 and used for electrically connecting an integrated circuit and the package substrate 732. For a silicon interposer, a TSV (Through Silicon Via) can also be used as the through electrode.

A silicon interposer is preferably used as the interposer 731. A silicon interposer can be manufactured at lower cost than an integrated circuit because it is not necessary to provide an active element. Meanwhile, since wirings of a silicon interposer can be formed through a semiconductor process, formation of minute wirings, which is difficult for a resin interposer, is easy.

In order to achieve a wide memory bandwidth, many wirings need to be connected to HBM. Therefore, formation of minute and high-density wirings is required for an interposer on which HBM is mounted. For this reason, a silicon interposer is preferably used as the interposer on which HBM is mounted.

In a SiP, an MCM, or the like using a silicon interposer, the decrease in reliability due to a difference in expansion coefficient between an integrated circuit and the interposer does not easily occur. Furthermore, the surface of a silicon interposer has high planarity, so that a poor connection between the silicon interposer and an integrated circuit provided on the silicon interposer does not easily occur. It is particularly preferable to use a silicon interposer for a 2.5D package (2.5D mounting) in which a plurality of integrated circuits are arranged side by side on an interposer.

A heat sink (a radiator plate) may be provided to overlap with the electronic component 730. In the case of providing a heat sink, the heights of integrated circuits provided on the interposer 731 are preferably equal to each other. For example, in the electronic component 730 described in this embodiment, the heights of the memory devices 300 and the semiconductor device 735 are preferably equal to each other.

To mount the electronic component 730 on another substrate, an electrode 733 may be provided on the bottom portion of the package substrate 732. FIG. 35(B) illustrates an example in which the electrode 733 is formed of a solder ball. Solder balls are provided in a matrix on the bottom portion of the package substrate 732, whereby BGA (Ball Grid Array) mounting can be achieved. Alternatively, the electrode 733 may be formed of a conductive pin. When conductive pins are provided in a matrix on the bottom portion of the package substrate 732, PGA (Pin Grid Array) mounting can be achieved.

The electronic component 730 can be mounted on another substrate by various mounting methods not limited to BGA and PGA. For example, a mounting method such as SPGA (Staggered Pin Grid Array), LGA (Land Grid Array), QFP, QFJ (Quad Flat J-leaded package), or QFN (Quad Flat Non-leaded package) can be employed.

<Electronic Devices>

Figure 36:
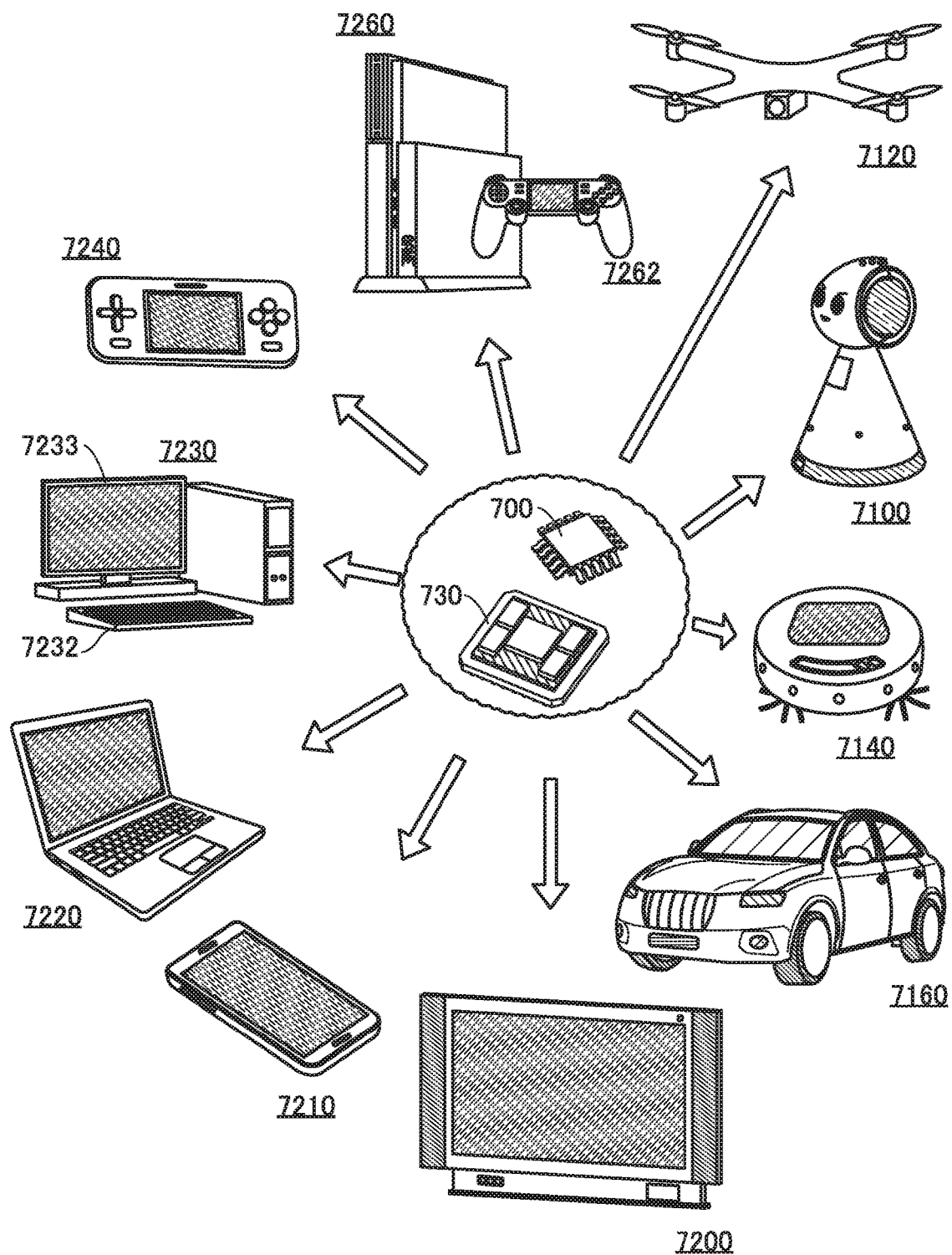
FIG. 36 Diagrams illustrating examples of electronic devices.

Next, examples of electronic devices including the above electronic component will be described with reference to FIG. 36.

A robot 7100 includes an illuminance sensor, a microphone, a camera, a speaker, a display, various kinds of sensors (e.g., an infrared ray sensor, an ultrasonic wave sensor, an acceleration sensor, a piezoelectric sensor, an optical sensor, and a gyro sensor), a moving mechanism, and the like. The electronic component 730 includes a processor or the like and has a function of controlling these peripheral devices. For example, the electronic component 700 has a function of storing data obtained by the sensors.

The microphone has a function of detecting acoustic signals of a speaking voice of a user, an environmental sound, and the like. The speaker has a function of outputting audio signals such as a voice and a warning beep. The robot 7100 can analyze an audio signal input via the microphone and can output a necessary audio signal from the speaker. The robot 7100 can communicate with the user with the use of the microphone and the speaker.

The camera has a function of taking images of the surroundings of the robot 7100. Furthermore, the robot 7100 has a function of moving with the use of the moving mechanism. The robot 7100 can take images of the surroundings with the use of the camera, and can analyze the images to sense whether there is an obstacle in the way of the movement.

A flying object 7120 includes propellers, a camera, a battery, and the like and has a function of flying autonomously. The electronic component 730 has a function of controlling these peripheral devices.

For example, image data taken by the camera is stored in the electronic component 700. The electronic component 730 can analyze the image data to sense whether there is an obstacle in the way of the movement. Moreover, the electronic component 730 can estimate the remaining battery level from a change in the power storage capacity of the battery.

A cleaning robot 7140 includes a display provided on the top surface, a plurality of cameras provided on the side surface, a brush, an operation button, various kinds of sensors, and the like. Although not illustrated, a cleaning robot 7300 is provided with a tire, an inlet, and the like. The cleaning robot 7300 can run autonomously, detect dust, and vacuum the dust through the inlet provided on the bottom surface.

For example, the electronic component 730 can judge whether there is an obstacle such as a wall, furniture, or a step by analyzing an image taken by the cameras. In the case where an object that is likely to be caught in the brush, such as a wire, is detected by image analysis, the rotation of the brush can be stopped.

An automobile 7160 includes an engine, tires, a brake, a steering gear, a camera, and the like. For example, the electronic component 730 performs control for optimizing the running state of the automobile 7160 on the basis of navigation information, the speed, the state of the engine, the gearshift state, the use frequency of the brake, and other data. For example, image data taken by the camera is stored in the electronic component 700.

The electronic component 700 and/or the electronic component 730 can be incorporated in a TV device 7200 (a television receiver), a smartphone 7210, a PC 7220 (a personal computer), a PC 7230, a game console 7240, a game console 7260, and the like.

For example, the electronic component 730 incorporated in the TV device 7200 can function as an image processing engine. The electronic component 730 performs, for example, image processing such as noise removal and resolution up-conversion.

The smartphone 7210 is an example of a portable information terminal. The smartphone 7210 includes a microphone, a camera, a speaker, various kinds of sensors, and a display portion. These peripheral devices are controlled by the electronic component 730.

The PC 7220 and the PC 7230 are examples of a notebook PC and a desktop PC. To the PC 7230, a keyboard 7232 and a monitor device 7233 can be connected with or without a wire. The game console 7240 is an example of a portable game console. The game console 7260 is an example of a stationary game console. To the game console 7260, a controller 7262 is connected with or without a wire. The electronic component 700 and/or the electronic component 730 can be incorporated in the controller 7262.

This embodiment can be implemented in an appropriate combination with the structures described in the other embodiments and the like.

Embodiment 9

In this embodiment, application examples of the memory device using the semiconductor device described in the above embodiment will be described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desktop computers, but also to large computers such as server systems. Alternatively, the semiconductor device described in the above embodiment is applied to a variety of removable memory devices such as memory cards (e.g., SD cards), USB memories, and SSDs (solid state drives). FIG. 37 schematically illustrates some structure examples of removable memory devices. The semiconductor device described in the above embodiment is processed into a packaged memory chip and used in a variety of storage devices and removable memories, for example.

Figure 37A:
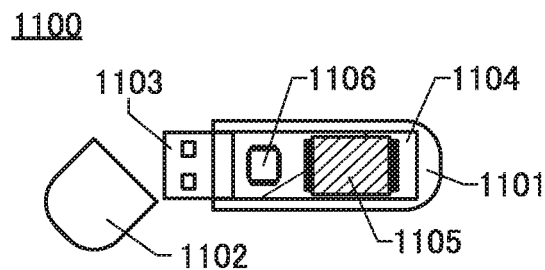
FIGS. 37A-37E Diagrams illustrating application examples of a memory device.

FIG. 37(A) is a schematic diagram of a USB memory. A USB memory 1100 includes a housing 1101, a cap 1102, a USB connector 1103, and a substrate 1104. The substrate 1104 is held in the housing 1101. The substrate 1104 is provided with a memory chip 1105 and a controller chip 1106, for example. The semiconductor device described in the above embodiment can be incorporated in the memory chip 1105 or the like on the substrate 1104.

Figure 37B:
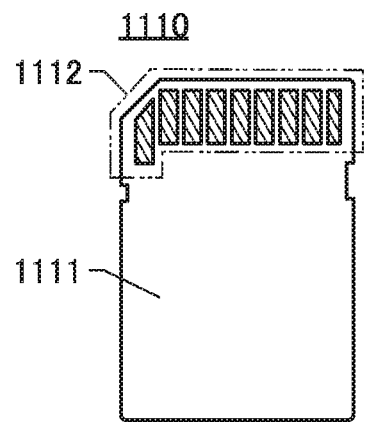
Figure 37C:
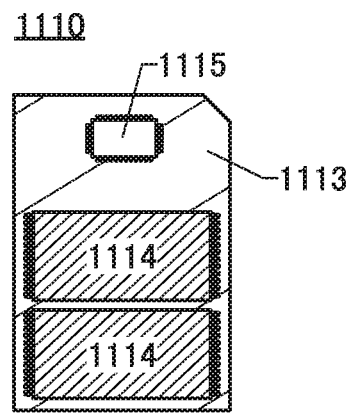

FIG. 37(B) is a schematic external diagram of an SD card, and FIG. 37(C) is a schematic diagram of the internal structure of the SD card. An SD card 1110 includes a housing 1111, a connector 1112, and a substrate 1113. The substrate 1113 is held in the housing 1111. The substrate 1113 is provided with a memory chip 1114 and a controller chip 1115, for example. When the memory chip 1114 is also provided on the back side of the substrate 1113, the capacity of the SD card 1110 can be increased. In addition, a wireless chip with a radio communication function may be provided on the substrate 1113, in which case data can be read from and written in the memory chip 1114 by radio communication between a host device and the SD card 1110. The semiconductor device described in the above embodiment can be incorporated in the memory chip 1114 or the like on the substrate 1113.

Figure 37D:
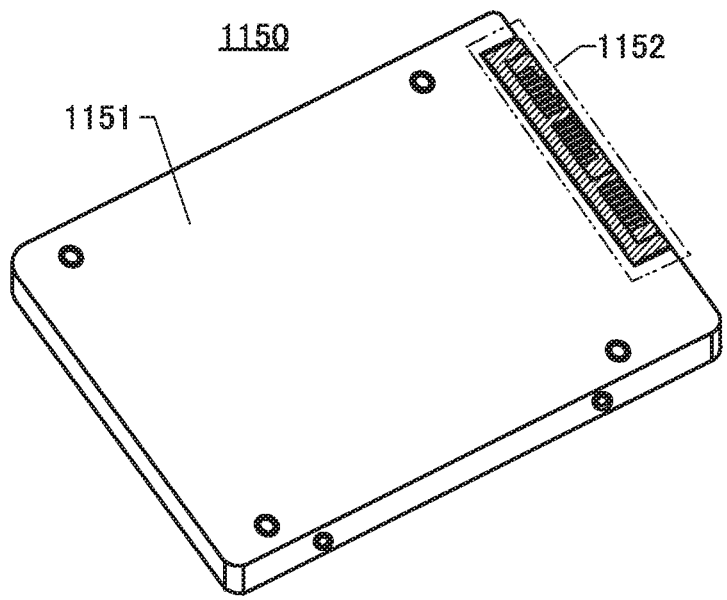
Figure 37E:
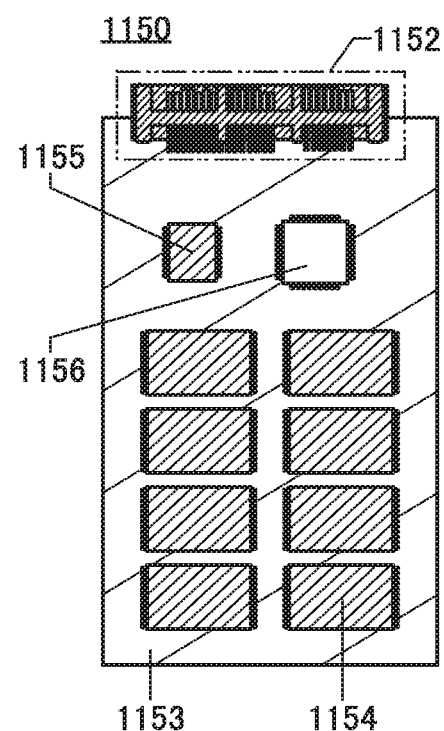

FIG. 37(D) is a schematic external diagram of an SSD, and FIG. 37(E) is a schematic diagram of the internal structure of the SSD. An SSD 1150 includes a housing 1151, a connector 1152, and a substrate 1153. The substrate 1153 is held in the housing 1151. The substrate 1153 is provided with a memory chip 1154, a memory chip 1155, and a controller chip 1156, for example. The memory chip 1155 is a work memory of the controller chip 1156, and a DOSRAM chip can be used, for example. When the memory chip 1154 is also provided on the back side of the substrate 1153, the capacity of the SSD 1150 can be increased. The semiconductor device described in the above embodiment can be incorporated in the memory chip 1154 or the like on the substrate 1153.

This embodiment can be implemented in an appropriate combination with the structures described in the other embodiments and the like.

REFERENCE NUMERALS

100: semiconductor device, 110: voltage generation circuit, 120: voltage retention circuit, 130: temperature detection circuit, 131: temperature sensor, 132: analog-digital converter circuit, 140: voltage control circuit, 145: logic circuit, 146: voltage generation circuit

The invention claimed is:
1. A memory device comprising:
a plurality of memory cells arranged in a matrix each comprising:
a transistor comprising a first gate and a second gate, wherein the first gate and the second gate overlap with each other with a semiconductor layer therebetween; and
a capacitor,
wherein the memory device is configured to write first data for first time to at least one of the plurality of memory cells after reading the first data retained in the at least one of the plurality of the memory cells,
wherein the memory device is configured to write first data for second time to the at least one of the plurality of the memory cells after reading the first data retained in the at least one of the plurality of the memory cells, to supply a first potential to the second gate of the at least one of the plurality of memory cells through a second transistor, and to stop power supply to the plurality of the memory cells after supplying the first potential,
wherein the semiconductor layer comprises a metal oxide,
wherein the semiconductor layer is positioned over the second gate,
wherein the first gate is positioned over the semiconductor layer,
wherein the first data is analog data, and
wherein the second time is longer than the first time.

2. The memory device according to claim 1,
wherein the semiconductor layer comprises one or both of In and Zn.

3. The memory device according to claim 1,
wherein the second time is 1.5 times or more the first time.

4. The memory device according to claim 1,
wherein the first potential is a potential at which the transistor is turned off.

5. The memory device according to claim 4,
wherein when a threshold voltage of the transistor is VthM,
the first potential is lower than or equal to −VthM.

6. An operating method of a memory device including a plurality of memory cells, wherein each of the plurality of the memory cells includes a transistor comprising a first gate and a second gate, wherein the first gate and the second gate overlap with each other with a semiconductor layer therebetween, and a capacitor;
the operating method comprising a first mode and a second mode,
wherein the first mode comprises:
reading first data retained in one of the plurality of the memory cells; and
writing the first data to the one of the plurality of the memory cells for first time,
wherein the second mode comprises:
reading first data retained in one of the plurality of the memory cells;
writing the first data to the one of the plurality of the memory cells for second time;
supplying a first potential to the second gate of the one of the plurality of the memory cells through a second transistor; and
stopping power supply to the plurality of the memory cells after supplying the first potential,
wherein the semiconductor layer comprises a metal oxide,
wherein the semiconductor layer is positioned over the second gate,
wherein the first gate is positioned over the semiconductor layer, and
wherein the second time is longer than the first time.

7. The operating method according to claim 6,
wherein the first data is multilevel data.

8. The operating method according to claim 6,
wherein the semiconductor layer comprises one or both of In and Zn.

9. The operating method according to claim 6,
wherein the second time is 1.5 times or more the first time.

10. The operating method according to claim 6,
wherein the first potential is a potential at which the transistor is turned off.

11. The operating method according to claim 6,
wherein when a threshold voltage of the transistor is VthM, the first potential is lower than or equal to −VthM.

* * * * *